(12) United States Patent		(10) Patent No.: US 8,896,001 B2
Inoue et al.		(45) Date of Patent: Nov. 25, 2014

(54) NITRIDE SEMICONDUCTOR LIGHT EMITTING DEVICE

(71) Applicant: Panasonic Corporation, Osaka (JP)

(72) Inventors: Akira Inoue, Osaka (JP); Masaki Fujikane, Osaka (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/060,146

(22) Filed: Oct. 22, 2013

(65) Prior Publication Data

US 2014/0048821 A1    Feb. 20, 2014

Related U.S. Application Data

(63) Continuation of application No. PCT/JP2013/000204, filed on Jan. 17, 2013.

(30) Foreign Application Priority Data

Jan. 23, 2012 (JP) ................................. 2012-010950
Jan. 24, 2012 (JP) ................................. 2012-012247
Feb. 15, 2012 (JP) ................................. 2012-030166

(51) Int. Cl.
H01L 29/20    (2006.01)
H01L 21/00    (2006.01)

(52) U.S. Cl.
USPC .............................................. 257/89; 438/32

(58) Field of Classification Search
USPC ................... 438/29–32, 64, 106; 257/86–98, 257/E33.025, E33.073
See application file for complete search history.

(56) References Cited

U.S. PATENT DOCUMENTS 8,455,905 B2 *   6/2013  Fujikane et al. ................ 257/98
2005/0141240 A1  6/2005  Hata et al.
2005/0224826 A1  10/2005 Keuper et al.
2006/0049422 A1  3/2006  Shoji (Continued)

FOREIGN PATENT DOCUMENTS

JP    2006-073547 A    3/2006
JP    2006-237500 A    9/2006

(Continued)

OTHER PUBLICATIONS

Decision of Rejection for Japanese Application No. Pp 2013-529493, mailed Dec. 24, 2013, with an English translation thereof.

(Continued)

*Primary Examiner* — Calvin Lee
(74) *Attorney, Agent, or Firm* — Renner, Otto, Boisselle & Sklar, LLP

(57) ABSTRACT

A nitride semiconductor light-emitting device includes a nitride semiconductor light-emitting chip including an active layer for outputting polarized light, the active layer having a non-polar plane or a semi-polar plane as a growth plane; and a light-transmissive cover for transmitting light from the active layer. The light-transmissive cover includes a first light-transmissive member located in an area, among areas to the side of the nitride semiconductor light-emitting chip, and in a direction perpendicular to a polarization direction of the polarized light, and a second light-transmissive member located in an area above the nitride semiconductor light-emitting chip. The first light-transmissive member has a higher diffuse transmittance than the second light-transmissive member.

11 Claims, 46 Drawing Sheets

(56) References Cited

U.S. PATENT DOCUMENTS

| | | |
|---|---|---|
| 2008/0218072 A1 | 9/2008 | Haruna et al. |
| 2008/0258156 A1* | 10/2008 | Hata ............................... 257/98 |
| 2009/0045422 A1 | 2/2009 | Kato et al. |
| 2011/0175117 A1 | 7/2011 | Jagt et al. |
| 2011/0227486 A1 | 9/2011 | Harada et al. |
| 2012/0091490 A1 | 4/2012 | Fujikane et al. |

FOREIGN PATENT DOCUMENTS

| | | |
|---|---|---|
| JP | 2007-194401 A | 8/2007 |
| JP | 2007-227791 A | 9/2007 |
| JP | 2007-270099 A | 10/2007 |
| JP | 2008-109098 A | 5/2008 |
| JP | 2008-305971 A | 12/2008 |
| JP | 2009-123803 A | 6/2009 |
| JP | 2010-157637 A | 7/2010 |
| JP | 2010-238846 A | 10/2010 |
| JP | 2010-283244 A | 12/2010 |
| JP | 2011-192598 A | 9/2011 |
| WO | WO 2007/034919 A | 3/2007 |

OTHER PUBLICATIONS

International Search Report for corresponding International Application No. PCT/JP2013/000204 mailed May 7, 2013.

Form PCT/ISA/237 for corresponding International Application No. PCT/JP2013/000204 dated May 7, 2013 and Partial English translation.

Notice of Reasons for Rejection for Japanese Patent Application No. 2013-529493 which is a national phase application of PCT/JP2013/000204 and a full English translation.

* cited by examiner

*FIG.2A*
PRIOR ART
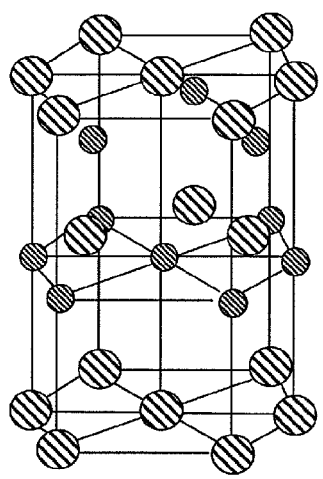
*FIG.2B*
PRIOR ART
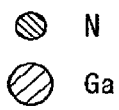
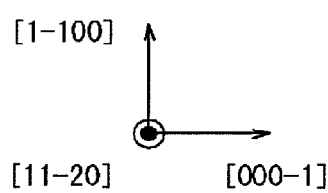
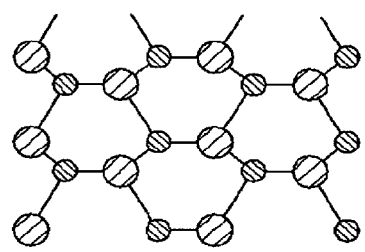
m-PLANE
*FIG.2C*
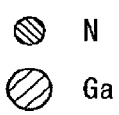
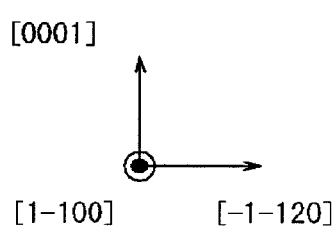
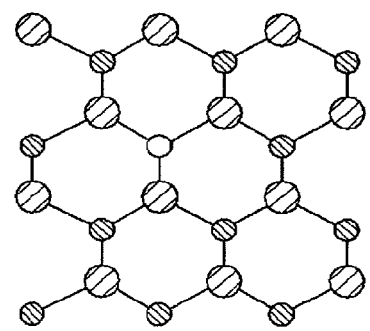
c-PLANE

Y-Y'

Y-Y'

Y-Y'

Y-Y'

Y-Y'

Y-Y'

Y-Y'

Y-Y'

Y-Y'

Y-Y'

ANGLE MADE BY STRIPE EXTENSION DIRECTION AND
a-AXIS DIRECTION OF LIGHT EMITTING LAYER [°]

TiO$_2$ PARTICLE CONCENTRATION:0.0wt%

TiO$_2$ PARTICLE CONCENTRATION:0.2wt%

TiO$_2$ PARTICLE CONCENTRATION:0.4wt%

TiO$_2$ PARTICLE CONCENTRATION:0.7wt%

TiO$_2$ PARTICLE CONCENTRATION:15.0wt%

TiO₂ PARTICLE CONCENTRATION:0.0wt%

TiO₂ PARTICLE CONCENTRATION:0.2wt%

TiO₂ PARTICLE CONCENTRATION:0.4wt%

TiO₂ PARTICLE CONCENTRATION:0.7wt%

TiO₂ PARTICLE CONCENTRATION:1.0wt%

TiO₂ PARTICLE CONCENTRATION:3.0wt%

TiO₂ PARTICLE CONCENTRATION: 0.0wt%

TiO₂ PARTICLE CONCENTRATION: 1.0wt%

SILICONE RESIN CONTAINING
1 wt% OF TiO₂ PARTICLES

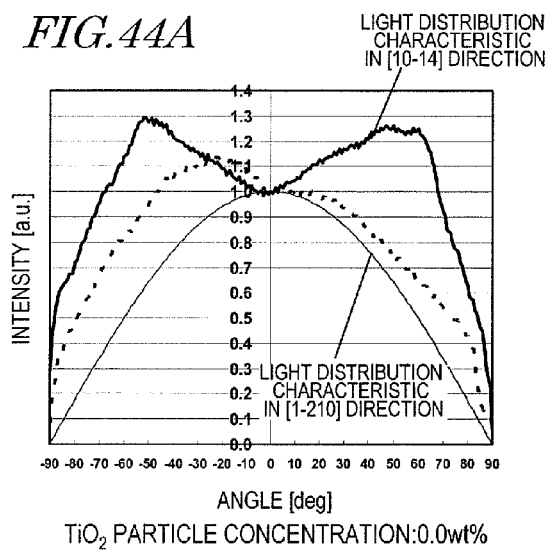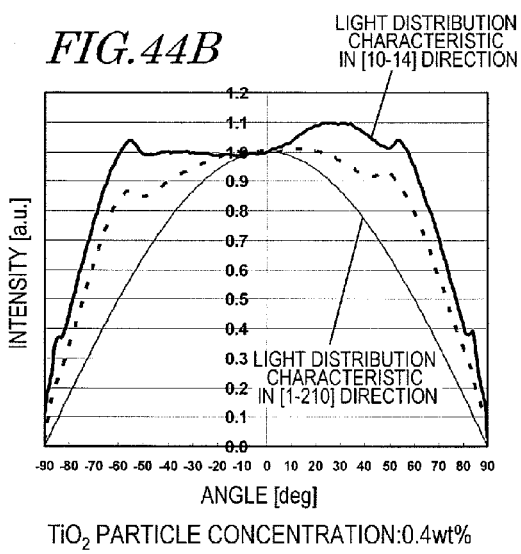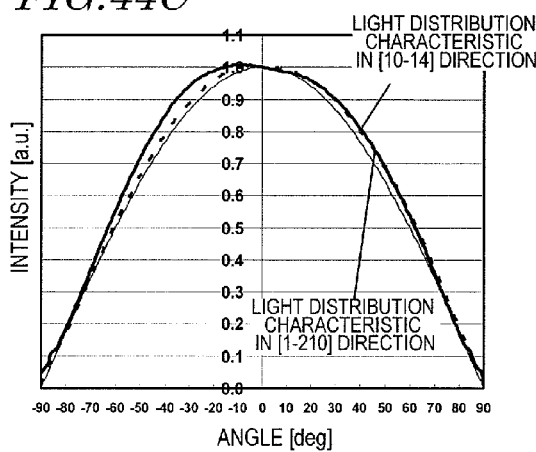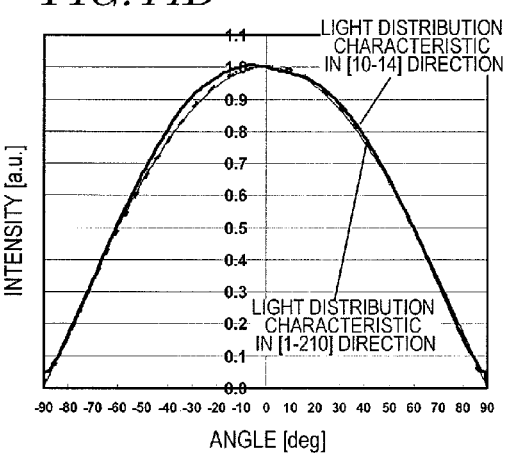

NITRIDE SEMICONDUCTOR LIGHT EMITTING DEVICE

This is a continuation of International Application No. PCT/JP2013/000204, with an international filing date of Jan. 17, 2013, which claims priority of Japanese Patent Applications No. 2012-010950, filed on Jan. 23, 2012, No. 2012-012247, filed on Jan. 24, 2012 and No. 2012-030166, filed on Feb. 15, 2012, the contents of which are hereby incorporated by reference.

BACKGROUND

1. Technical Field

The present disclosure relates to a nitride semiconductor light-emitting device including a semiconductor light-emitting chip which includes a nitride semiconductor active layer having a non-polar plane or a semi-polar plane as a growth plane.

2. Description of the Related Art

Nitride semiconductors containing nitrogen (N) in a group V element is considered promising as a material of a short wavelength light-emitting element because of a large bandgap thereof. Among the nitride semiconductors, gallium nitride-based compound semiconductors have been actively studied. Blue light emitting diode (LED) elements, green LED elements and blue semiconductor laser elements using a gallium nitride-based compound semiconductor have been put into practice.

A gallium nitride-based compound semiconductor contains a compound semiconductor having a part of gallium (Ga) substituted with at least one of aluminum (Al) and indium (In). Such a nitride semiconductor is represented by general formula $Al_xGa_yIn_zN$ (where $0 \leq x < 1$, $0 \leq z < 1$, $0 < y \leq 1$, $x+y+z=1$). Hereinafter, a gallium nitride-based compound semiconductor will be referred to as a GaN-based semiconductor.

In a GaN-based semiconductor, the bandgap can be greater than that of GaN by replacing Ga atoms with Al atoms. The bandgap can be smaller than that of GaN by replacing Ga atoms with In atoms. This allows, for example, blue or green short wavelength light and also, for example, orange or red long wavelength light to be emitted. Owing to such a feature, a nitride semiconductor light-emitting element is expected to be applied for an image display device and an illumination device.

A nitride semiconductor has a wurtzite crystalline structure. FIGS. 1A, 1B and 1C each show a plane orientation of a wurtzite crystalline structure with a 4-index notation (hexagonal index notation). According to the 4-index notation, crystalline surfaces and the plane orientations thereof are expressed by use of elementary vectors represented by $a_1$, $a_2$, $a_3$ and $c$. The elementary vector $c$ extends in a [0001] direction, and an axis in this direction is referred to as a "c-axis". A plane perpendicular to the c-axis is referred to as a "c-plane" or "[0001] plane". FIG. 1A shows the c-plane and also an a-plane, i.e., a (11-20) plane, and an m-plane, i.e., (1-100) plane. FIG. 1B shows an r-plane, i.e., a (1-102) plane. FIG. 1C shows a (11-22) plane. In this specification, symbol (−) provided to the left of the numeral in the parentheses that represents a Miller index indicates inversion of the index for the sake of convenience.

FIG. 2A shows a crystalline structure of a GaN-based semiconductor with a ball-and-stick model. FIG. 2B shows a ball-and-stick model of an atomic structure in the vicinity of the m-plane which is observed from the a-axis direction. The m-plane is perpendicular to the paper sheet of FIG. 2B. FIG. 2C shows a ball-and-stick model of an atomic structure on a surface of the +c-plane which is observed in the m-axis direction. The c-plane is perpendicular to the paper sheet of FIG. 2C. As can be seen from FIGS. 2A and 2B, N atoms and Ga atoms are located on a plane parallel to the m-plane. As can be seen from FIGS. 2A and 2C, on the c-plane, there are a layer in which only the Ga atoms are located and a layer in which only the N atoms are located.

Conventionally, for producing a semiconductor element by use of a GaN-based semiconductor, a substrate having the c-plane, namely, the (0001) plane as a main plane is used as a substrate on which a nitride semiconductor crystal is to be grown. In this case, the positions of the Ga atoms and the N atoms causes spontaneous electrical polarization to be formed in the c-axis direction in the nitride semiconductor. Therefore, the "c-plane" is also referred to as a "polar plane". As a result of the electrical polarization, a piezo electric field is generated along the c-axis direction in a quantum well formed of InGaN, which forms a light emitting layer of a nitride semiconductor light-emitting element. Due to the generated piezo electric field, there occurs a positional shift in the distribution of electrons and halls in the light emitting layer. This causes a problem that the internal quantum efficiency of the light emitting layer is decreased due to the quantum-confined Stark effect of the carriers. In order to suppress the decrease in the internal quantum efficiency of the light emitting layer, the light emitting layer formed on the (0001) plane is designed to have a thickness of 3 nm or less.

Recently, it has been studied to produce a light-emitting element by use of a substrate having an m-plane or an a-plane referred to as a non-polar plane or a −r-plane or a (11-22) plane referred to as a semi-polar plane as a main plane. As shown in FIG. 1, in the wurtzite crystalline structure, the m-planes are six equivalent planes which are parallel to the t-axis and perpendicular to the c-plane. For example, in FIG. 1, the (1-100) plane perpendicular to the [1-100] direction is the m-plane. The other m-planes equivalent to the (1-100) plane include a (−1010) plane, a (10-10) plane, a (−1100) plane, a (01-10) plane and a (0-110) plane.

As shown in FIGS. 2A and 2B, on the m-plane, the Ga atoms and the N atoms are present on the same atomic plane. Therefore, electrical polarization is not caused in a direction perpendicular to the m-plane. For this reason, when a light-emitting element is produced by use of a semiconductor stacking structure having the m-plane as a growth plane, the piezo electric field is not generated in the light emitting layer. Thus, the problem that the internal quantum efficiency is decreased due to the quantum-confined Stark effect of the carriers is solved. This is also applicable to the a-plane, which is a non-polar plane other than the m-plane, and a similar effect is provided with the −r-plane or the (11-22) plane, which are referred to as a semi-polar plane.

A nitride semiconductor light-emitting element including an active layer having the m-plane, the a-plane, the −r-plane or the (11-22) plane as a growth plane has a polarization characteristic derived from the structure of a valence band thereof.

For example, Japanese Laid-Open Patent Publication No. 2008-109098 discloses a light emitting diode device including a light emitting diode chip which includes a light emitting layer having a main surface and a package having a chip-located surface on which the light emitting diode chip is to be located. The light emitting diode chip is provided for the purpose of decreasing an intensity difference of light going out of the package that is caused by the difference in the in-plane azimuth angle of the chip-located surface. The light going out of the main surface of the light emitting layer has a plurality of different levels of intensity in accordance with the in-plane azimuth angle of the main plane of the light emitting layer. At least one of the light emitting diode chip and the package has a structure of decreasing the intensity difference of the light going out of the package that is caused by the difference in the in-plane azimuth angle of the chip-located surface.

Japanese Laid-Open Patent Publication No. 2010-238846 discloses a light-emitting device including a cover member containing a light reflecting material, a light-transmissive member facing a light emitting-side surface and a surface of the cover member, a light-emitting element provided as a light source section having a part thereof embedded in the cover member, and a wavelength converting member excitable by the light-emitting element. This light-emitting device is provided for increasing the light extracting efficiency.

Japanese Laid-Open Patent Publication No. 2009-123803 discloses an LED device including an LED chip and a package for accommodating the LED chip. In the LED chip, anisotropy of the light emitting intensity is caused in accordance with the azimuth angle in the main plane of the light emitting layer. In an area having a prescribed range of angles encompassing an azimuth angle at which the light emitting intensity from the LED chip is high, a high resin-mold concentration part is located. In an area having a prescribed range of angles encompassing an azimuth angle at which the light emitting intensity from the LED chip is low, a low resin-mold concentration part is located.

SUMMARY

With the above-described conventional art, it has been desired to control a light distribution characteristic of outgoing light more appropriately and to decrease color non-uniformity. A non-limiting embodiment of the present application provides a nitride semiconductor light-emitting device capable of realizing at least one of more appropriate control of the light distribution characteristic and the decrease of the color non-uniformity.

In one general aspect, a nitride semiconductor light-emitting device in an embodiment of the present application includes a nitride semiconductor light-emitting chip including an active layer for outputting polarized light, the active layer having a non-polar plane or a semi-polar plane as a growth plane; and a light-transmissive cover for transmitting light from the active layer. The light-transmissive cover includes a first light-transmissive member located in an area, among areas to the side of the nitride semiconductor light-emitting chip, and in a direction perpendicular to a polarization direction of the polarized light, and a second light-transmissive member located in an area on the nitride semiconductor light-emitting chip. The first light-transmissive member has a diffuse transmittance which is higher than that of the second light-transmissive member.

According to the above aspect, the light distribution characteristic can be controlled more appropriately, or the color non-uniformity can be decreased.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIGS. 2A through 2C each provide a ball-and-stick model showing a crystalline structure of a GaN-based semiconductor.

FIGS. 44A through 44D respectively show measurement results of the light distribution characteristics in the a-axis direction and the c-axis direction of semiconductor light-emitting elements in Example 4.

DETAILED DESCRIPTION

Figure 1A:
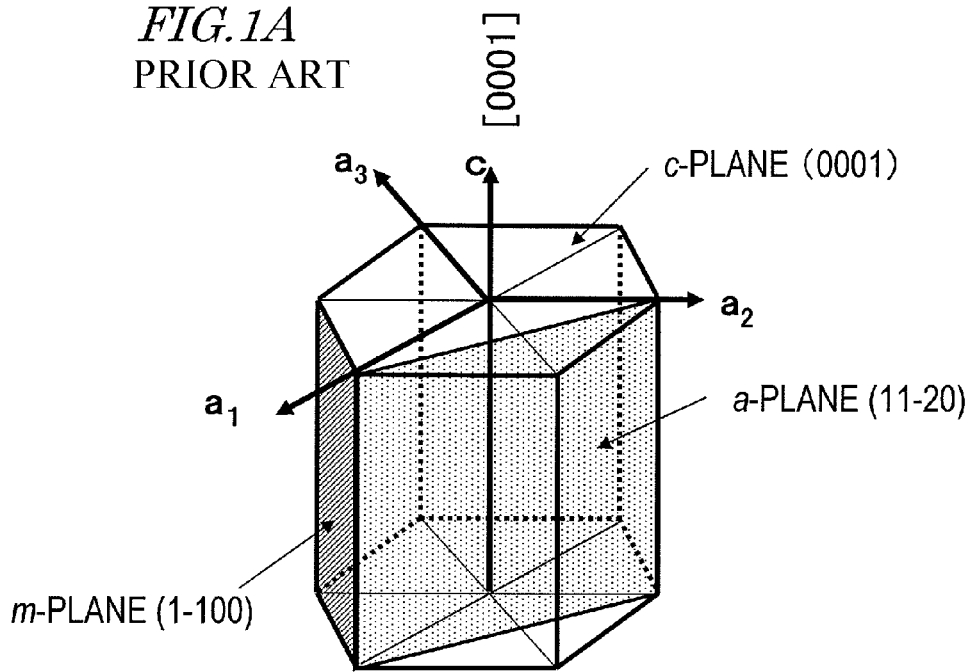
FIG. 1A is an isometric view showing elementary vectors $a_1$, $a_2$ and $a_3$ and c, and an a-plane, a c-plane and an m-plane of a wurtzite crystalline structure.
Figure 1B:
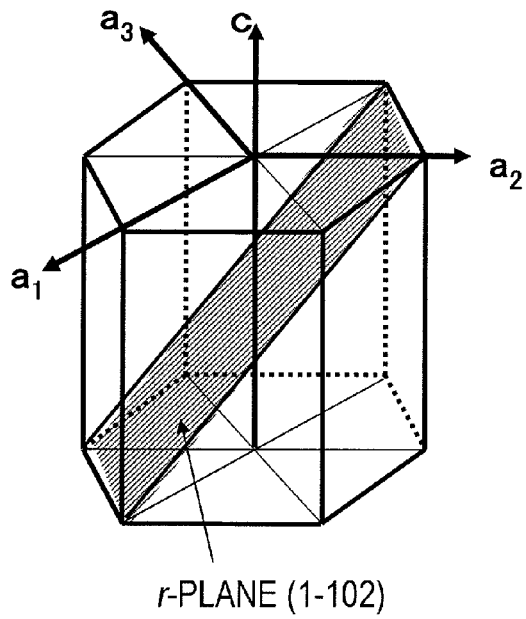
FIG. 1B is an isometric view showing an r-plane of the wurtzite crystalline structure.
Figure 1C:
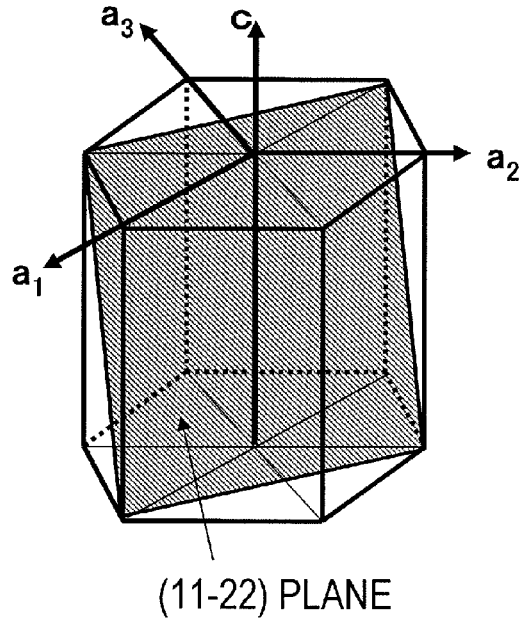
FIG. 1C is an isometric view showing a (11-22) plane of the wurtzite crystalline structure.

A nitride semiconductor active layer having the m-plane as a growth plane mainly outputs light having an electric field intensity polarized in the a-axis direction. In the case where the light-emitting element has a polarization characteristic, it is theoretically expected that a light distribution in which the light emitting intensity is increased in a direction perpendicular to the polarization direction is exhibited. In other word, a radiation pattern (light distribution) of the light-emitting element becomes non-uniform. In addition, regarding semi-polar planes such as the -r, (20-21), (20-2-1), (10-1-3) and (11-22) planes, and other non-polar planes such as the a-plane, it is theoretically expected that light having an electric field intensity polarized in a specific crystalline direction of a nitride semiconductor is output and that a light distribution in which the light emitting intensity is increased in a direction perpendicular to the polarization direction is exhibited.

It is known that the polarization direction of light from a nitride semiconductor active layer having the a-plane as a growth plane is the m-axis direction. Therefore, it is expected that a light distribution in which the light emitting intensity is increased in a direction perpendicular to the m-axis direction is exhibited.

It is known that the polarization direction of light from a nitride semiconductor active layer having the (20-2-1) plane or the (20-21) plane, which are each a semi-polar plane, as a growth plane is a [−12-10] direction. Therefore, it is expected that a light distribution in which the light emitting intensity is increased in a direction perpendicular to the [−12-10] direction is exhibited.

It is known that the polarization direction of light from a nitride semiconductor active layer having the (10-1-3) plane, which is a semi-polar plane, as a growth plane is a [−12-10] direction when the ratio of In in the composition of the nitride semiconductor active layer is high, and is a [11-23] direction when the ratio of In in the composition of the nitride semiconductor active layer is low. Therefore, it is expected that a light distribution is exhibited in which the light emitting intensity is increased in a direction perpendicular to the [−12-10] direction when the ratio of In in the composition of the active layer is high and the light emitting intensity is increased in a direction perpendicular to the [11-23] direction when the ratio of In in the composition of the active layer is low.

It is known that the polarization direction of light from a nitride semiconductor active layer having the (11-22) plane, which is a semi-polar plane, as a growth plane is the m-axis direction when the ratio of In in the composition of the nitride semiconductor active layer is high, and is a [−1-123] direction when the ratio of In in the composition of the nitride semiconductor active layer is low. Therefore, it is expected that a light distribution is exhibited in which the light emitting intensity is increased in a direction perpendicular to the m-axis direction when the ratio of In in the composition of the active layer is high and the light emitting intensity is increased in a direction perpendicular to the [−1-123] direction when the ratio of In in the composition of the active layer is low.

In this specification, light having the electric field intensity polarized in a specific direction is referred to as "polarized light". For example, light having the electric field intensity polarized in an X-axis direction is referred to as "X-axis direction polarized light". In this case, the X axis direction is referred to as a "polarization direction". The "X axis direction polarized light" does not only mean linearly polarized light polarized in the X axis direction, but may include linearly polarized light polarized in another axial direction. In more detail, the "X axis direction polarized light" means light in which the intensity of light (electric field intensity) transmitted through a "polarizer having a polarization transmission axis in the X axis direction" is higher than the electric field intensity of light transmitted through a "polarizer having a polarization transmission axis in another axial direction". Therefore, the "X axis direction polarized light" does not only mean the linearly polarized light and elliptically polarized light polarized in the X axis direction, but widely includes non-coherent light containing linearly polarized light and elliptically polarized light polarized in various directions in a mixed state.

The polarization degree is defined by the following expression (A).

Polarization degree=|$I$max−$I$min|/|$I$max+$I$min|   Expression (A)

where Imax and Imin respectively represent the highest and lowest intensity of the electric of light transmitted through the polarizer when the polarization transmission axis of a polarizer is rotated.

In the case of the "X axis direction polarized light", when the polarization transmission axis of the polarizer is parallel to the X axis, the electric field intensity of the light transmitted through the polarizer is Imax, whereas when the polarization transmission axis of the polarizer is parallel to the Y axis, the electric field intensity of the light transmitted through the polarizer is Imin. In the case of completely linearly polarized light, Imin=0. Thus, the polarization degree is equal to 1. By contrast, in a complete non-polarized light, Imax−Imin=0. Thus, the polarization degree is equal to 0.

As described above, a nitride semiconductor light-emitting element including an active layer having the m-plane as a growth plane mainly outputs polarized light in the a-axis direction. At this point, polarized light in the c-axis direction and polarized light in the m-axis direction are also output. However, the polarized light in the c-axis direction and the polarized light in the m-axis direction are weaker in the intensity than the polarized light in the a-axis direction.

In this specification, an active layer having the m-plane as a growth plane will be described as an example, and polarized light in the a-axis direction will be discussed. What will be concluded regarding such an active layer is also applicable to polarized light in a specific crystalline direction at a semi-polar plane such as, for example, the −r, (20-21), (20-2-1), (10-1-3) or (11-22) plane or another non-polar plane such as the a-plane. In other words, the growth plane of the active layer merely needs to be a semi-polar plane or a non-polar plane.

According to the present disclosure, the "m-plane" does not only mean a plane completely parallel to the m-plane, but includes a plane inclined with respect to the m-plane by about ±5°. A plane slightly inclined with respect to the m-plane is little influenced by the spontaneous electric polarization. Meanwhile, according to the crystal growth technology, in some cases, a semiconductor layer may be more easily epitaxially grown on a substrate having a crystal azimuth slightly inclined with respect to a substrate having a crystal azimuth precisely matching a desired azimuth. Therefore, it may be more useful in some cases to slightly incline the crystalline surface while the influence of the spontaneous electric polarization is sufficiently suppressed, in order to improve the quality of the crystal in the semiconductor layer which is epitaxially growing or in order to improve the crystal growth rate.

The same is applicable to the "a-plane", the "(20-21) plane", the "(20-2-1)" plane, the "(10-1-3) plane", the "−r-plane" and the "(11-22) plane". Therefore, in this specification, the "a-plane", the "(20-21) plane", the "(20-2-1)" plane, the "(10-1-3) plane", the "−r-plane" and the "(11-22) plane" do not respectively mean only planes parallel to the a-plane, the (20-21) plane, the (20-2-1) plane, the (10-1-3) plane, the −r-plane and the (11-22) plane, but include planes inclined by about ±5° with respect to the a-plane, the (20-21) plane, the (20-2-1) plane, the (10-1-3) plane, the −r-plane and the (11-22) plane.

A nitride semiconductor light-emitting device includes a nitride semiconductor light-emitting chip and a light-transmissive cover. The light-transmissive cover is occasionally referred to as a sealing member. The nitride semiconductor light-emitting device is located on a mounting substrate. The mounting substrate is occasionally referred to as a package. A surface of the mounting substrate on which the semiconductor light-emitting chip is held is referred to as a "mounting surface".

Conventionally, the relationship regarding the material or the positions between a semiconductor light-emitting chip having a polarization characteristic and a sealing member has not been clarified. Japanese Laid-Open Patent Publication No. 2008-109098 describes a method for arranging the semiconductor light-emitting chip and shapes of the mounting surface and a surface of a reflector for the purpose of alleviating the asymmetry of the light distribution characteristic, but does not describe the material or the positions of the sealing member in detail.

In Japanese Laid-Open Patent Publication No. 2010-238846, a side surface of the semiconductor light-emitting chip is covered with a cover member containing a light reflective material for the purpose of improving the light extraction characteristic. However, there is no consideration on the asymmetry of the light distribution characteristic of the light radiating from the package. The cover member containing a light reflective material is used for the purpose of reflecting light.

The mechanism by which a nitride semiconductor active layer having a non-polar plane or a semi-polar plane as a growth plane has polarization is caused by triple degeneracy of valence bands being resolved and thus the uppermost valence band (first band) emitting light with priority. This causes the nitride semiconductor active layer having a non-polar plane or a semi-polar plane as a growth plane to have light strongly polarized in a direction perpendicular to the c-axis. In an actual nitride semiconductor light-emitting device, it is considered that light emission caused by the first band (light emitting wavelength: $\lambda 1$), light emission caused by a second band (light emitting wavelength: $\lambda 2$) and light emission caused by a third band (light emitting wavelength: $\lambda 3$) occur at the same time. Here, the light emitting wavelengths of the bands have a relationship of $\lambda 1 > \lambda 2 > \lambda 3$. The polarization degree heavily depends on the bandgap between the first band and the second band.

The present inventors discovered a new problem that light beams having different wavelengths emitted from an active layer have different light emitting wavelengths in an outgoing direction depending on how the light beam is extracted outside from the nitride semiconductor light-emitting chip (anisotropy of light emitting wavelength in accordance with the outgoing direction).

A wavelength spectrum of a semiconductor light-emitting device for performing color conversion by use of a wavelength converting member is a synthesized spectrum of an excited wavelength spectrum caused by light emission of the active layer and a spectrum having the color thereof converted by the wavelength converting member. Therefore, in the case where the excited wavelength spectrum has anisotropy of the light emitting intensity in accordance with the outgoing direction and anisotropy of the light emitting wavelength in accordance with the outgoing direction, it is quite difficult to control the post-color conversion light emitting spectrum.

The conventional nitride semiconductor light-emitting element formed on the c-plane (polar plane) does not have the problems of the anisotropy of the light emitting intensity in accordance with the outgoing direction and the anisotropy of the light emitting wavelength in accordance with the outgoing direction.

However, it has been clarified that in the case where color conversion is performed on a nitride semiconductor light-emitting element including a light emitting layer formed on a non-polar plane or a semi-polar plane by use of a wavelength converting member, it is necessary to consider the two types of anisotropy, namely, the anisotropy of the light emitting intensity in accordance with the outgoing direction and the anisotropy of the light emitting wavelength in accordance with the outgoing direction.

A nitride semiconductor light-emitting device comprises a semiconductor light-emitting chip formed of a nitride semiconductor, a mounting substrate and a sealing member. The mounting substrate is occasionally referred to as a package. A surface of the mounting substrate on which the semiconductor light-emitting chip is held is referred to as a mounting surface. Conventionally, in a semiconductor light-emitting device using a semiconductor light-emitting chip having a polarization characteristic, the relationship among the material and the positions of the sealing member and the position of the wavelength converting member has not been clarified.

For example, Japanese Laid-Open Patent Publication No. 2009-123803 does not consider the anisotropy of the light emitting wavelength in accordance with the outgoing direction. Japanese Laid-Open Patent Publication No. 2010-238846 does not consider the anisotropy of the light emitting intensity in accordance with the outgoing direction or the anisotropy of the light emitting wavelength in accordance with the outgoing direction. The cover member containing a light reflective material is used for the purpose of reflecting light.

In light of such problems, the present inventors conceived a novel semiconductor light-emitting device capable of realizing at least of appropriate control of the light distribution characteristic of the outgoing light and the decrease in the anisotropy of the light emitting wavelength in accordance with the outgoing direction. An overview of an embodiment according to the present disclosure is as follows.

A nitride semiconductor light-emitting device in an embodiment of the present disclosure includes a nitride semiconductor light-emitting chip including an active layer for outputting polarized light, the active layer having a non-polar plane or a semi-polar plane as a growth plane; and a light-transmissive cover for transmitting light from the active layer. The light-transmissive cover includes a first light-transmissive member located in an area, among areas to the side of the nitride semiconductor light-emitting chip, and in a direction perpendicular to a polarization direction of the polarized light, and a second light-transmissive member located in an area above the nitride semiconductor light-emitting chip. The first light-transmissive member has a higher diffuse transmittance than the second light-transmissive member has.

The first light-transmissive member may include a light-transmissive substrate and a plurality of particles. Each of the particles is formed of a material having a refractive index different from that of the light-transmissive substrate.

The first light-transmissive member may include the plurality of particles at not less than 0.2% by weight and not more than 15% by weight.

A nitride semiconductor light-emitting device in another embodiment of the present disclosure includes a nitride semiconductor light-emitting chip including an active layer for outputting polarized light, the active layer having a non-polar plane or a semi-polar plane as a growth plane; and a first light-transmissive member located in an area, among areas to the side of the nitride semiconductor light-emitting chip, and in a direction perpendicular to a polarization direction of the polarized light, the first light-transmissive member transmitting light from the active layer. The first light-transmissive member includes a light-transmissive substrate and a plurality of particles. The particles have a refractive index different from that of the light-transmissive substrate. The first light-transmissive member includes the plurality of particles at not less than 0.2% by weight and not more than 15% by weight.

In the case where an elliptical shape which has a shorter axis in the polarization direction and a longer axis in a direction perpendicular to the polarization direction and has a centroid of the nitride semiconductor light-emitting chip as the center is defined as seen in a plan view parallel to the growth plane; and a longer radius of the longer axis is α represented by the following expression 1, a shorter radius of the shorter axis is β represented by the following expression 2, the first light-transmissive member has an absorption coefficient A[cm$^{-1}$], and one side of the nitride semiconductor light-emitting chip has a length of L; the plurality of particles may be present in at least a part of the first light-transmissive member that is located in the elliptical shape:

$$\alpha = 2.3/A + L/2 \quad \text{expression 1}$$

$$\beta = \alpha/2 = (2.3/A + L/2)/2 \quad \text{expression 2}$$

The plurality of particles may have a concentration by weight that is in the range of not less than 0.2% by weight and not more than 3.0% by weight.

The plurality of particles may have a concentration by weight that is in the range of not less than 0.7% by weight and not more than 3.0% by weight.

The plurality of particles may have an average particle diameter of not less than 10 nm and not more than 3000 nm.

The plurality of particles may be formed of at least one material selected from the group including $TiO_2$, $SiO_2$, $ZrO_2$, $Nb_2O_5$, $ZnO$, $Al_2O_3$ and $AlN$.

The nitride semiconductor light-emitting chip may include a first light extraction plane, which is a top surface thereof, and a second light extraction plane parallel to the polarization direction of the polarized light. The second light extraction plane may be in contact with the first light extraction plane or faces the first light extraction plane. Alternatively, the second light extraction plane may have another member or a space therebetween.

A ratio of an area size of the second light extraction plane to an area size of the first light extraction plane may be 40% or greater.

A plurality of projection and recess portions may be formed at the first light extraction plane.

The plurality of projection and recess portions may include semi-spherical recess or projection portions.

The plurality of projection and recess portions may include striped recess or projection portions as seen in a plan view parallel to the growth plane.

An angle formed between the extending direction of the striped projection and recess portions and the polarization direction of the active layer is not less than 0 degrees and less than 5 degrees.

An angle formed between the extending direction of the striped projection and recess portions and the polarization direction of the active layer is not less than 5 degrees and not more than 90 degrees.

At least 50% of light going out of the second light extraction plane may be incident on the first light-transmissive member.

A nitride semiconductor light-emitting device in still another embodiment of the present disclosure includes a nitride semiconductor light-emitting chip including an active layer for outputting polarized light, the active layer having a non-polar plane or a semi-polar plane as a growth plane, and also including a first light extraction plane which is not perpendicular to the growth plane of the active layer and from which the polarized light goes outside, and a second light extraction plane which is not perpendicular to a polarization direction of the polarized light and from which the polarized light goes outside; a wavelength converting member for covering the first light extraction plane and for converting a wavelength of the polarized light which has been gone outside; and a first light-transmissive member including a substrate and particles which have a refractive index different from that of the substrate and which are dispersed in the substrate, the first light-transmissive member covering at least a part of the second light extraction plane and diffuse-transmitting the polarized light which has gone outside.

The first light-transmissive member may not cover the first light extraction plane.

The nitride semiconductor light-emitting device may further include a second light-transmissive member for entirely covering a surface of the wavelength converting member. The surface is reverse of another surface which faces the semiconductor light-emitting chip.

The first light-transmissive member may contain the particles at a ratio of not less than 0.2% by weight and not more than 15.0% by weight.

The first light-transmissive member may contain the particles at a ratio of not less than 0.7% by weight and not more than 3.0% by weight.

The first light-transmissive member may contain the particles at a ratio of not less than 0.047% by volume and not more than 0.704% by volume.

The first light-transmissive member may contain the particles at a ratio of not less than 0.164% by volume and not more than 0.704% by volume.

The particles may have an average particle diameter of not less than 10 nm and not more than 3000 nm.

The particles may be formed of at least one material selected from the group consisting of $TiO_2$, $SiO_2$, $ZrO_2$, $Nb_2O_5$, $ZnO$, $Al_2O_3$ and $AlN$.

A nitride semiconductor light-emitting device in still another embodiment of the present disclosure includes a nitride semiconductor light-emitting chip including an active layer for emitting polarized light, the active layer having a non-polar plane or a semi-polar plane as a growth plane, and also including a first light extraction plane which is not perpendicular to the growth plane of the active layer and from which the polarized light goes outside, and a second light extraction plane which is not parallel to a polarization direction of the polarized light and from which the polarized light goes outside; a wavelength converting member located such that the polarized light going out of the first light extraction plane is incident thereon, the wavelength converting member converting a wavelength of the polarized light which has been gone outside; a first light-transmissive member located such that the polarized light going out of at least a part of the second light extraction plane is incident thereon, the first light-transmissive member transmitting the polarized light which has been gone outside; and a second light-transmissive member having a smaller diffuse transmittance than the first light-transmissive member and located such that light transmitted through the wavelength converting member is incident thereon, the second light-transmissive member diffuse-transmitting the polarized light which has been gone outside.

A plurality of projection and recess portions may be formed at the second light extraction plane.

At least 50% of light going out of the second light extraction plane may be optically coupled with the first light-transmissive member.

When the semiconductor light-emitting chip is seen in a direction perpendicular to the growth plane, the semiconductor light-emitting chip may have a length L in the polarization direction and a direction perpendicular to the polarization direction, and the first light-transmissive member may be located in the entirety of an elliptical area having a longer axis α and a shorter axis β respectively in the direction perpendicular to the polarization direction and in the polarization direction, and the longer axis α and the shorter axis β may be defined by;

$$\alpha = 2.3/A + L/2, \text{ and}$$

$$\beta = \alpha/2 = (2.3/A + L/2)/2$$

where $A[cm^{-1}]$ is an absorption coefficient the first light-transmissive member has.

The wavelength converting member may cover the entirety of the elliptical area.

A ratio of an area size of the second light extraction plane to an area size of the first light extraction plane may be 40% or greater.

Hereinafter, embodiments of a semiconductor light-emitting device according to the present disclosure will be described in detail.

Embodiment 1

Hereinafter, a semiconductor light-emitting device according to Embodiment 1 of the present disclosure will be described with reference to FIGS. 3A and 3B.

Figure 3A:
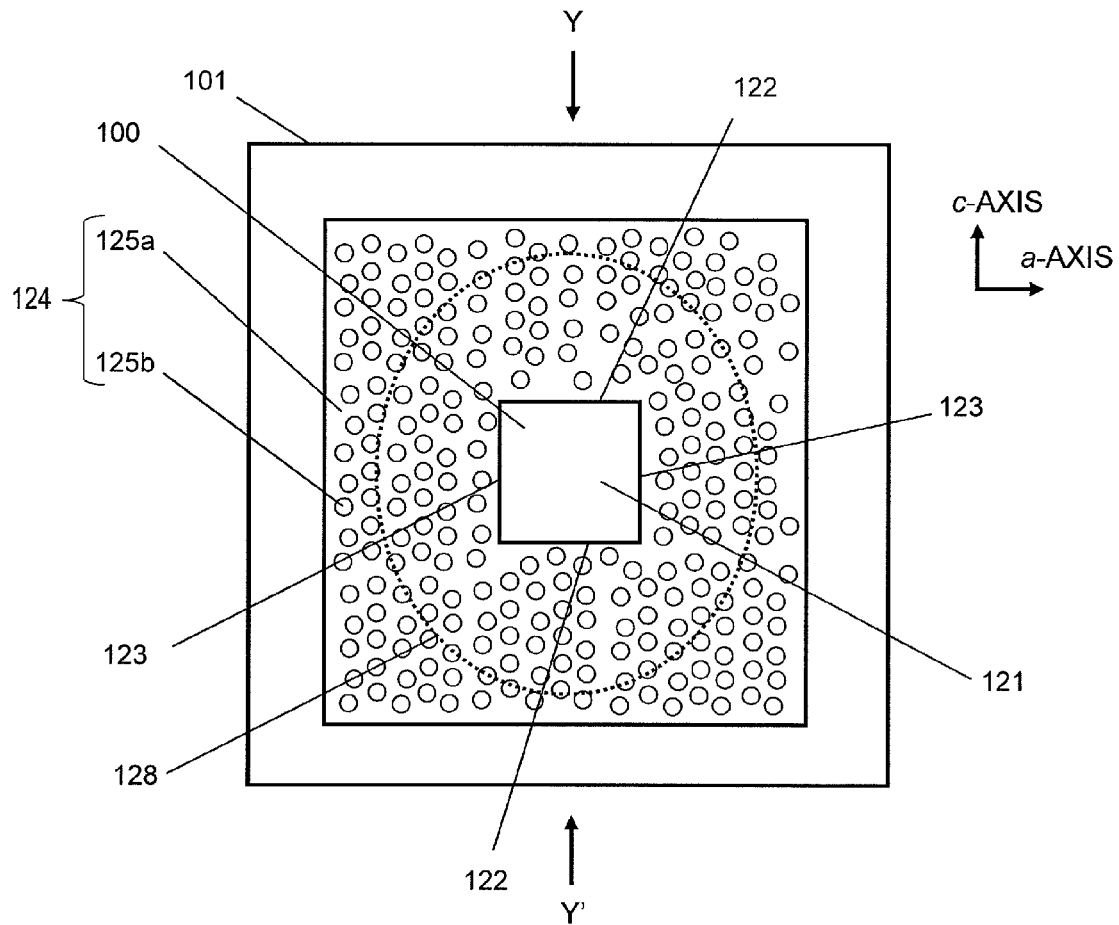
FIG. 3A is a schematic plan view showing a semiconductor light-emitting device in Embodiment 1 according to the present disclosure.
Figure 3B:
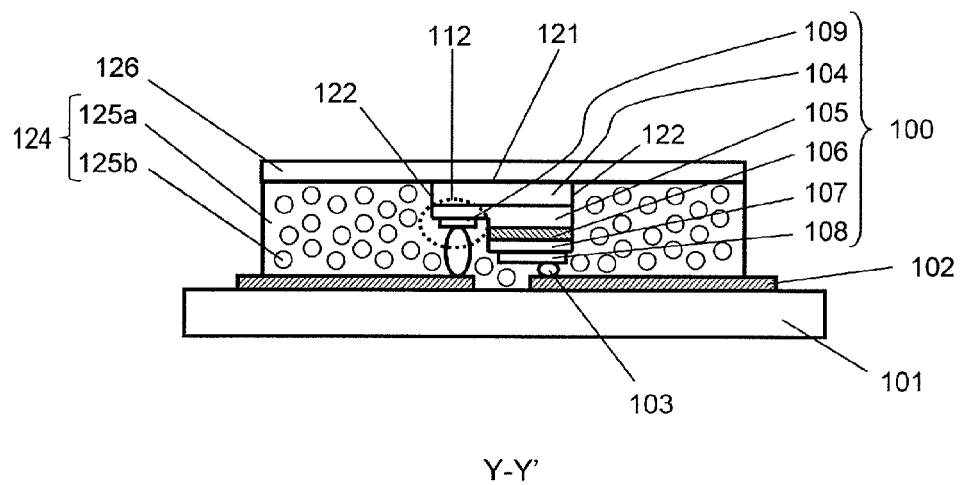
FIG. 3B is a cross-sectional view taken along line Y-Y' of FIG. 3A.

As shown in FIGS. 3A and 3B, a semiconductor light-emitting device in this embodiment includes a mounting substrate 101, a nitride semiconductor light-emitting chip 100 mounted on the mounting substrate 101, a first light-transmissive member 124 located to the side of the nitride semiconductor light-emitting chip 100, and a second light-transmissive member 126 located in an area above the nitride semiconductor light-emitting chip 100 ("above" refers to a direction opposite to the direction from the nitride semiconductor light-emitting chip 100 toward the mounting substrate 101).

As shown in FIG. 3B, the nitride semiconductor light-emitting chip 100 includes a substrate 104 including a GaN layer having the m-plane as a main plane (and also a growth plane) (hereinafter, referred to as an "m-plane GaN layer"), an n-type nitride semiconductor layer 105 formed on the main plane of the GaN layer of the substrate 104, an active layer 106 formed of a nitride semiconductor and provided on the n-type nitride semiconductor layer 105, a p-type nitride semiconductor layer 107 formed on the active layer 106, a p-side electrode 108 formed so as to be in contact with the p-type nitride semiconductor layer 107, and an n-side electrode 109 formed so as to be in contact with the n-type nitride semiconductor layer 105. The active layer 106 has a non-polar plane or a semi-polar plane as a growth plane and outputs polarized light.

The growth planes of the n-type nitride semiconductor layer 105, the active layer 106 and the p-type nitride semiconductor layer 107 are generally parallel to the m-plane. In other words, these layers are stacked in the m-axis direction. Another layer may be formed between the n-type nitride semiconductor layer 105 and the active layer 106. Another layer may be formed between the active layer 106 and the p-type nitride semiconductor layer 107. The following description will be given on a semiconductor formed of a gallium nitride-based compound (GaN-based semiconductor) as an example of the nitride semiconductor. The GaN-based semiconductor includes a semiconductor represented by general formula $Al_xIn_yGa_zN$ (where $0 \leq x < 1$, $0 \leq y < 1$, $0 < z \leq 1$, $x+y+z=1$).

As shown in FIGS. 3A and 3B, the semiconductor light-emitting chip 100 is mounted such that the p-side electrode 108 and the n-side electrode 109 face electrodes 102 located on a surface of the mounting substrate 101. In other words, the semiconductor light-emitting chip 100 is electrically connected to, and held by, the two wiring electrodes 102 on the mounting substrate 101 while bumps 103 is interposed therebetween. Such a structure is referred to as a flip chip structure. One of the electrodes 102 is connected to the p-side electrode 108, and the other electrode 102 is connected to the n-side electrode 109. A main material of the mounting substrate 101 may be an insulating material such as alumina (aluminum oxide), aluminum nitride (AlN), or glass epoxy; a metal material such as aluminum (Al), copper (Cu) or tungsten (W); a semiconductor material such as silicon (Si), or germanium (Ge); or a composite material thereof. A material of the wiring electrodes 102 may be a metal material such as aluminum (Al), silver (Ag), gold (Au) or copper (Cu).

The substrate 104 may be formed of only a GaN layer, or may include a layer other than the GaN layer. The layer other than the GaN layer may be an m-plane GaN substrate, an m-plane SiC substrate, an r-plane sapphire substrate, an m-plane sapphire substrate, or an a-plane sapphire substrate. The substrate 104 may be removed.

The n-type nitride semiconductor layer 105 is formed of, for example, n-type $Al_uGa_vIn_wN$ (where $0 \leq u$, $v$, $w \leq 1$, $u+v+w=1$). As an n-type dopant, silicon (Si), for example, is usable.

The active layer 106 includes a plurality of barrier layers formed of $In_YGa_{1-Y}N$ (where $0 \leq Y < 1$) and at least one well layer formed of $In_XGa_{1-X}N$ (where $0 < X \leq 1$) and interposed between the barrier layers along a top surface and a bottom surface thereof. The active layer 106 may include a single well layer. The active layer 106 may have a multiple quantum well (MQW) structure in which the well layers and the barrier layers are stacked alternately. The wavelength of the light emitting from the semiconductor light-emitting chip 100 is depending on the ratio x of In in the $In_XGa_{1-X}N$ semiconductor, which forms the well layers.

The p-type nitride semiconductor layer 107 is formed of, for example, a p-type $Al_sGa_tN$ (where $0 \leq s$, $t \leq 1$, $s+t=1$) semiconductor. As a p-type dopant, magnesium (Mg), for example, is usable. The p-type dopant may be, for example, zinc (An) or beryllium (Be) instead of Mg. In the p-type nitride semiconductor layer 107, the ratio s of Al may be uniform in a thickness direction or may vary in the thickness direction continuously or stepwisely. The p-type nitride semiconductor layer 107 has a thickness of, for example, about 0.05 μm to 2 μm. In a part of the p-type nitride semiconductor layer 107 in the vicinity of a top surface thereof, namely, in a part of the p-type nitride semiconductor layer 107 in the vicinity of the interface with the p-side electrode 108, the ratio s of Al may be 0. In other words, this part may be formed of GaN. In this case, GaN may contain p-type impurities at a high concentration and act as a contact layer for electrically connecting with the p-side electrode 108.

The p-side electrode 108 may cover substantially the entire surface of the p-type nitride semiconductor layer 107. The p-side electrode 108 has, for example, a stacking structure (Pd/Pt) including a palladium (Pd) layer and a platinum (Pt) layer in a stacked manner. In order to improve the reflectance of the radiating light, the p-side electrode 108 may have a stacking structure (Ag/Pt) including a silver (Ag) layer and a platinum (Pt) layer in a stacked manner, or a stacking structure (Pd/Ag/Pt) including a Pd layer, an Ag layer and a Pt in a stacked manner sequentially.

The n-side electrode 109 has, for example, a stacking structure (Ti/Pt) including a titanium (Ti) layer and a platinum (Pt) layer in a stacked manner. In order to improve the reflectance of the radiating light, the n-side electrode 109 may have a stacking structure (Ti/Al/Pt) including a Ti layer, an Al layer and a Pt in a stacked manner sequentially.

The semiconductor light-emitting chip 100 shown in FIG. 3 is one of a plurality of square or rectangular small pieces obtained by cutting a wafer including stacked semiconductor layers along the a-axis direction and the c-axis direction. In this case, the c-plane of the nitride semiconductor is easily cleavable, which provides an advantage that the step of dividing the wafer into small pieces can be simplified. The semiconductor light-emitting chip 100 may be a small piece cut in directions inclined by about 0° to 45° with respect to the a-axis direction and the c-axis direction. In this case, a plane which is poorly cleavable is exposed on a side surface of the semiconductor light-emitting chip 100. This causes recess portions and projection portions to be made easily at the side surface of the semiconductor light-emitting chip 100, which provides an advantage that the extraction of radiating light is improved owing to the recess portions and the projection portions.

As described above, the semiconductor light-emitting chip 100 including the active layer 106 having the m-plane as the main plane (also the growth plane) and formed of a nitride semiconductor has a polarization characteristic having the a-axis direction as the polarization direction. Light has a property of being propagated intensely in a direction perpendicular to the polarization direction. Therefore, a plane generally parallel to the polarization direction greatly contributes to the light extraction.

In the case of the semiconductor light-emitting chip 100 shown in FIG. 3 including the active layer 106 having the m-plane as the main plane (also the growth plane) and formed of a nitride semiconductor, a rear surface of the substrate 104 is generally parallel to the m-plane and also generally parallel to the a-axis direction. The rear surface (in a flip chip structure, the top surface of the semiconductor light-emitting chip 100) is referred to as a first light extraction plane 121. Side surfaces of the semiconductor light-emitting chip 100 that are located in a direction perpendicular to polarization direction of the light (the polarization direction is the a-axis direction, and the direction perpendicular thereto is the c-axis direction)

are each referred to as a second light extraction plane 122. In this embodiment, the second light extraction planes 122 are generally parallel to the a-axis direction (c-plane). Alternatively, the second light extraction planes 122 may be generally parallel to the a-axis direction (c-plane) or may incline with respect to the a-axis direction (c-plane) toward the m-axis direction or any other direction.

Side surfaces of the semiconductor light-emitting chip 100 that are other than the second light extraction planes 122 are each referred to as a third light extraction plane 123. The third light extraction planes 123 may be generally parallel to the a-plane or may incline with respect to the a-plane toward the m-axis direction. The amount of light going out of each third light extraction plane 123 is smaller than the amount of light going out of each of the first and second light extraction planes 121 and 122. The present inventors paid attention to a problem that in a semiconductor light-emitting chip 100 having a polarization characteristic, light is emitted intensely from a specific side surface, which decreases the symmetry of the light distribution.

In the case of the semiconductor light-emitting chip 100 including the active layer 106 having the m-plane as the main plane (also the growth plane) and formed of a nitride semiconductor, when a ratio of the area size of each second light extraction plane 122 to the area size of each first light extraction plane 121 exceeds 32%, the symmetry of the light distribution starts decreasing. When the ratio exceeds 46%, the symmetry of the light distribution is poor.

In this embodiment, in order to improve the symmetry of the light distribution, the first light-transmissive member 124 is located so as to face the second light extraction planes 122. The first light-transmissive member 124 includes a substrate member 125a and a plurality of particles 125b. The particles 125b are formed of a material having a refractive index different from that of the substrate member 125a, and play a serve to scatter light. The substrate member 125a and the particles 125b may be transparent with respect to light going out of the active layer 106. In FIGS. 3A and 3B, the first light-transmissive member 124 is located so as to cover (so as to face) the second and third light extraction planes 122 and 123. In this case, light going out of the second light extraction planes 122 and also light going out of the third light extraction planes 123 are diffused by the particles 125b. The first light-transmissive member 124 merely needs to be located on an area, among areas to the side of the nitride semiconductor light-emitting chip 100, and in a direction perpendicular to the polarization direction of the light from the nitride semiconductor light-emitting chip 100 (the polarization direction is the a-axis direction, and the direction perpendicular thereto is the c-axis direction). It is not absolutely necessary that the first light-transmissive member 124 be located in an area extending in any other direction (e.g., in the a-axis direction in which the third light extraction plane 123 is located). The first light-transmissive member 124 does not need to be in contact with the second light extraction planes 122. In such a case, the second light extraction planes 122 may face the first light-transmissive member 124 while another member or a space is provided therebetween.

The first light-transmissive member 124 including the particles 125b does not need to cover the entire surface of the mounting substrate 101. An elliptical shape (elliptical prism) 128 represents an area in which the light going out of the second and third light extraction planes 122 and 123 is diffused effectively. Therefore, it is sufficient if the first light-transmissive member 124 includes the particles 125b at least in an area in the elliptical shape 128. As described above, the first light-transmissive member 124 does not need to cover the entire side surfaces of the nitride semiconductor light-emitting chip 100. In the case where the first light-transmissive member 124 covers only the second light extraction planes 122, only a part of the elliptical shape 128 that covers the second light extraction planes 122 needs to be formed.

The particles 125b included in the first light-transmissive member 124 serves to scatter the light which is going out of the second light extraction planes 122 and which has been incident on the first light-transmissive member 124. The particles 125b may be formed of a material which does not easily absorb the light from the active layer 106. Use of a material which does not easily absorb the light improves the light extracting efficiency. Alternatively, the particles 125b may be formed of an inorganic material. Use of an inorganic material realizes a high reliability for being used for a long time. The particles 125b may be formed of, for example, one of $TiO_2$, $SiO_2$, $ZrO_2$, $Nb_2O_5$, $ZnO$, $Al_2O_3$ and AlN, or a combination (mixture) of two or more thereof.

The particles 125b may have an average particle diameter of not less than 10 nm and not more than 3000 μm. For example, the average particle diameter of the particles can be measured by a laser diffraction/scattering method. In this case, the particle diameter obtained when the ratio of the addition frequency in the particle diameter distribution of the powder is 50% (median value: D50) is defined as the average particle diameter. The average particle diameter of the particles contained in the light-transmissive member can be measured from, for example, a cross-sectional SEM image. The particles may have a concentration of not less than 0.4% by weight and not more than 15.0% by weight. A concentration of not less than 0.4% by weight and not more than 15.0% by weight can improve the asymmetry of the light distribution. The particle concentration may be not less than 0.7% by weight and not more than 3.0% by weight. A concentration of not less than 0.7% by weight and not more than 3.0% by weight can improve the asymmetry of the light distribution and also can suppress the decrease in the optical output to 10% or less.

The second light-transmissive member 126 is provided so as to face the first light extraction plane 121 of the nitride semiconductor light-emitting chip 100. The second light-transmissive member 126 may contact the first light extraction plane 121.

In this embodiment, included are the first light-transmissive member 124 located in an area which is to the side of the semiconductor light-emitting chip 100 and extends in a direction perpendicular to the polarization direction of the light from the active layer 106 and the second light-transmissive member 126 located in an area above the nitride semiconductor light-emitting chip 100. The first light-transmissive member 124 has a higher diffuse transmittance (or scattering ratio) than the second light-transmissive member 126. Therefore, the asymmetry of the light distribution can be improved. The "diffuse transmittance" is a ratio of diffuse-transmitted light (transmitted light going out while being diffused on a surface or in the inside of an object) to the light incident on the object.

The first light-transmissive member 124 may be formed of an epoxy resin or a silicone resin. The second light-transmissive member 126 may be formed of an epoxy resin, a silicone resin, glass or a plastic material. The second light-transmissive member 126 may be formed of any of various types of transparent members such as, for example, a light-transmissive single crystalline substrate. In the case where the second light-transmissive member 126 is formed in close contact with the first light extraction plane 121, use of an epoxy resin or a silicon resin as the material of the second light-transmissive member 126 can improve the adhesiveness. The second light-transmissive member 126 protects the first light extraction plane 121. The second light-transmissive member 126 can increase the amount of light going outside from the first light extraction plane 121. The second light-transmissive member 126 may have a flat surface or of a shape different from being flat.

Figure 4A:
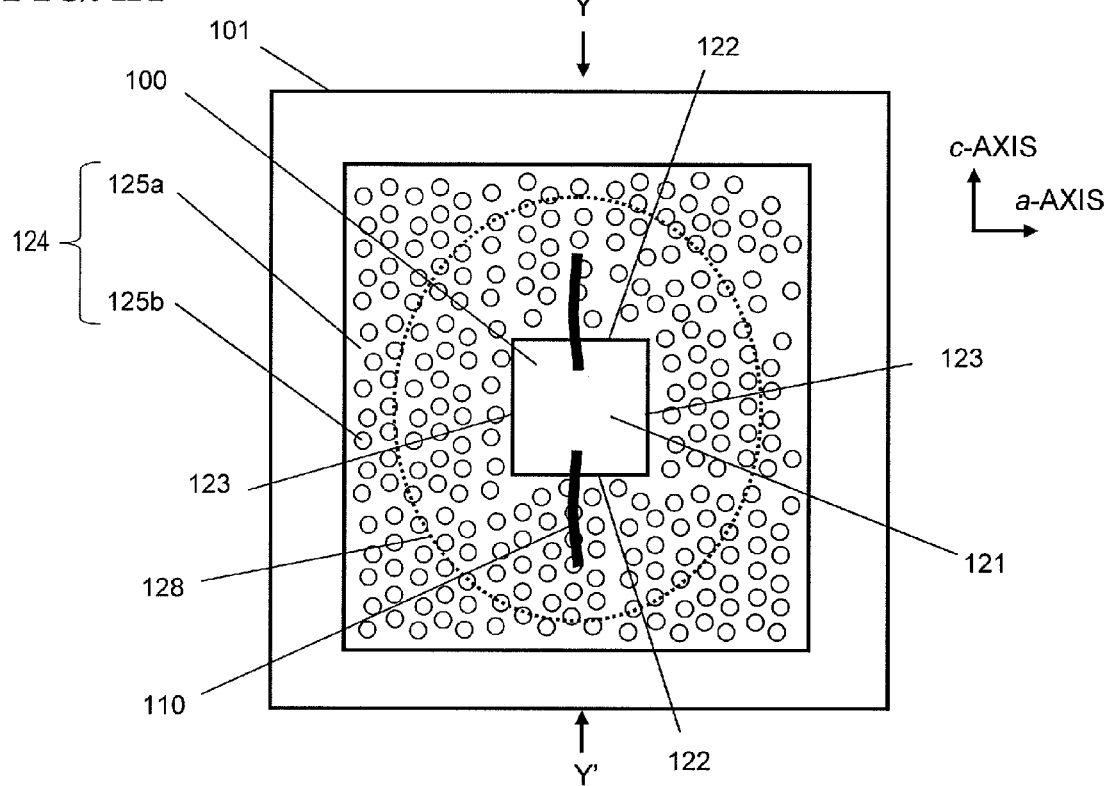
FIG. 4A is a schematic plan view showing a semiconductor light-emitting device in a first variation of Embodiment 1.
Figure 4B:
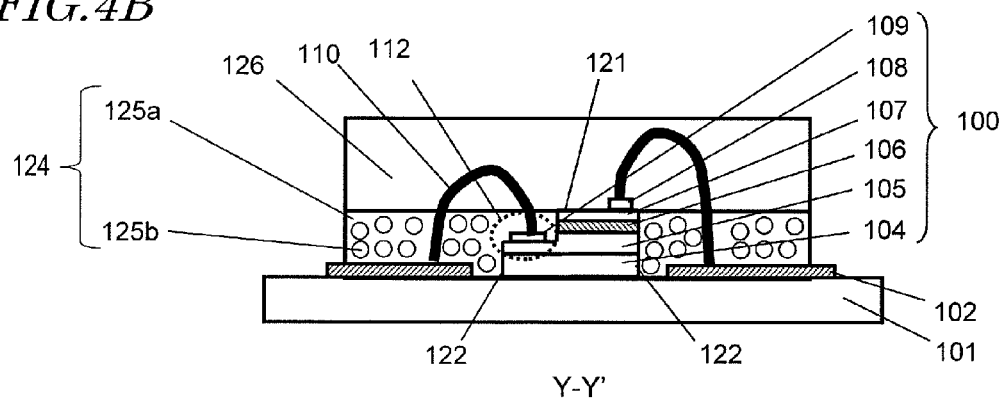
FIG. 4B is a cross-sectional view taken along line Y-Y' of FIG. 4A.
Figure 4C:
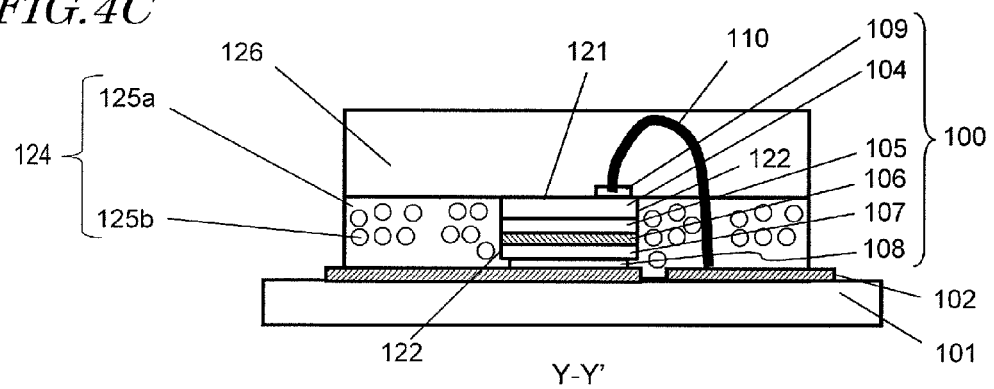
FIG. 4C is a cross-sectional view of a semiconductor light-emitting device in another variation of Embodiment 1.

As shown in FIGS. 4A through 4C, a wire bonding structure is usable instead of the flip chip structure. In a variation shown in FIGS. 4A and 4B, the semiconductor light-emitting chip 100 is held in a state where the substrate 104 faces the surface of the mounting substrate 101. The p-side electrode 108 and the n-side electrode 109 are electrically connected to the wiring electrodes 102 on the mounting substrate 101 respectively via wires 110 formed of gold (Au) or aluminum (Al). The first light extraction plane 121 is formed on the p-type nitride semiconductor layer 107. The substrate 104 may or may not be conductive. The substrate 104 may be an insulating substrate such as, for example, a sapphire substrate.

In a variation shown in FIG. 4C, the semiconductor light-emitting chip 100 is held in a state where the p-side electrode 108 faces the surface of the mounting substrate 101. The p-side electrode 108 is electrically connected to the electrode 102 on the mounting substrate 101 with a soldering material such as a gold-tin (AuSn) material. The n-side electrode 109 is electrically connected to the electrode 102 on the mounting substrate 101 via the wire 110 formed of gold (Au). The first light extraction plane 121 is formed on the substrate 104. In this case, the substrate 104 is conductive.

As can be seen, the flip chip structure and the wire bonding structure are different in the method of connecting the p-side electrode 108 and the n-side electrode 109 to the wiring electrode(s) 102 on the mounting substrate 101. However, the flip chip structure and the wire bonding structure are substantially the same in the rest of the structure and provide substantially the same function and effect when adopting an embodiment according to the present disclosure.

In the example shown in FIG. 3, the first light extraction plane 121 and a top surface of the first light-transmissive member 124 are located at the same level. The second light extraction plane 122 is entirely covered with the first light-transmissive member 124. Owing to this, the asymmetry of the light distribution can be sufficiently alleviated. The first light-transmissive member 124 may be located so as to be coupled with at least 50% of the amount of light going out the second light extraction planes 122 (such that at least 50% of the amount of light going out of the second light extraction planes 122 is incident on the first light-transmissive member 124). The first light-transmissive member 124 may cover the entirety of the second light extraction planes 122 or may be formed so as to cover at least 50% of the area size of the second light extraction planes 122. FIG. 5 through FIG. 12 are cross-sectional views provided for explaining shapes and positions of the first light-transmissive member 124.

Figure 5:
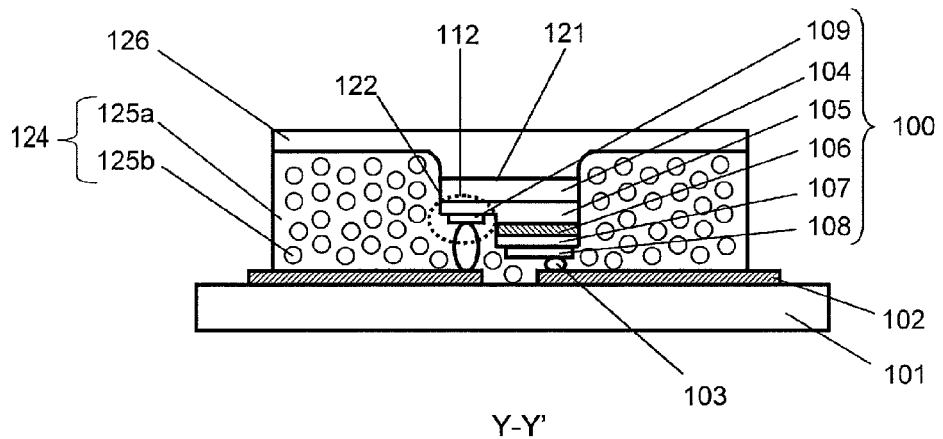
FIG. 5 is a cross-sectional view of a semiconductor light-emitting device in a second variation of Embodiment 1.

In an example of FIG. 5, the top surface of the first light-transmissive member 124 is at a higher level than the first light extraction plane 121. Even when the top surface of the first light-transmissive member 124 is located at a higher level than the first light extraction plane 121 due to a production variance, the entirety of the second light extraction planes 122 is covered with the first light-transmissive member 124. Therefore, the asymmetry of the light distribution can be sufficiently alleviated. In this structure, a component of the light going out of the first light extraction plane 121 is incident on the first light-transmissive member 124. Therefore, the polarization degree of the entire structure is decreased.

Figure 6:
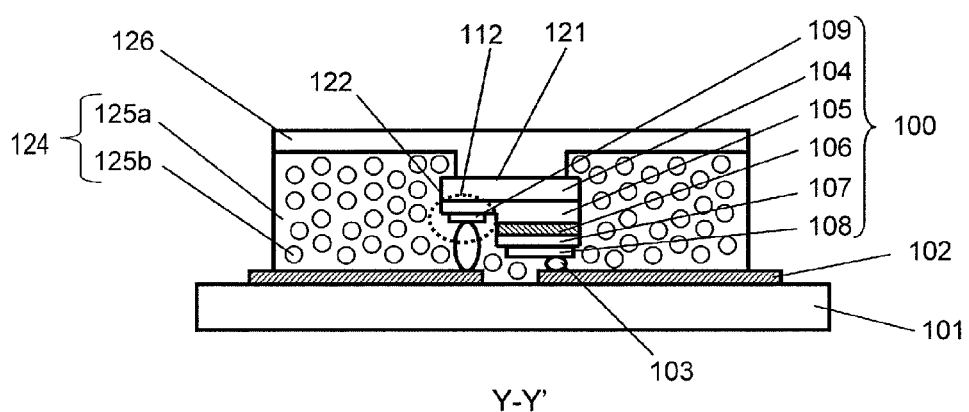
FIG. 6 is a cross-sectional view of a semiconductor light-emitting device in a third variation of Embodiment 1.

In an example of FIG. 6, the top surface of the first light-transmissive member 124 is at a higher level than the first light extraction plane 121, and a part of the first light-transmissive member 124 is in contact with a part of the first light extraction plane 121. Even in the case where a part of the first light-transmissive member 124 is in contact with a part of the first light extraction plane 121 due to a production variance, the entirety of the second light extraction planes 122 is covered with the first light-transmissive member 124. Therefore, the asymmetry of the light distribution can be sufficiently alleviated. In this structure, a component of the light going out of the first light extraction plane 121 is incident on the first light-transmissive member 124. Therefore, the polarization degree of the entire structure is decreased.

Figure 7:
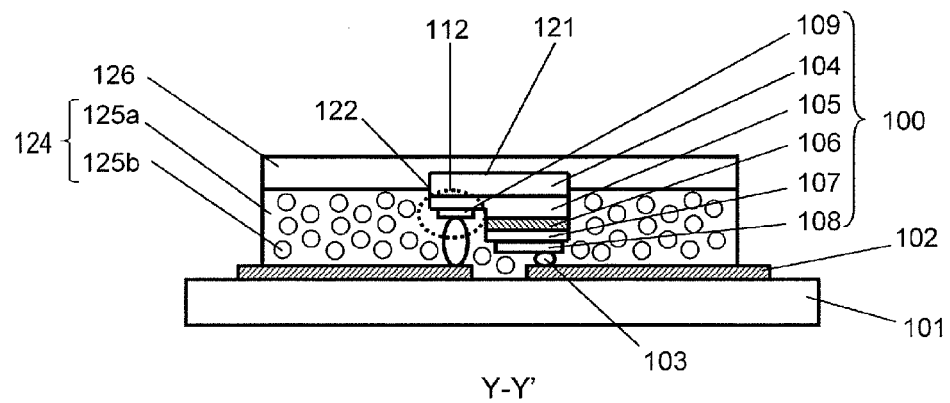
FIG. 7 is a cross-sectional view of a semiconductor light-emitting device in a fourth variation of Embodiment 1.

In an example of FIG. 7, the top surface of the first light-transmissive member 124 is at a lower level than the first light extraction plane 121. For example, at least 50% of the area size of the second light extraction planes 122 is covered with the first light-transmissive member 124. Even when the second light extraction planes 122 are not entirely covered due to a production variance, the asymmetry of the light distribution can be alleviated.

Figure 8:
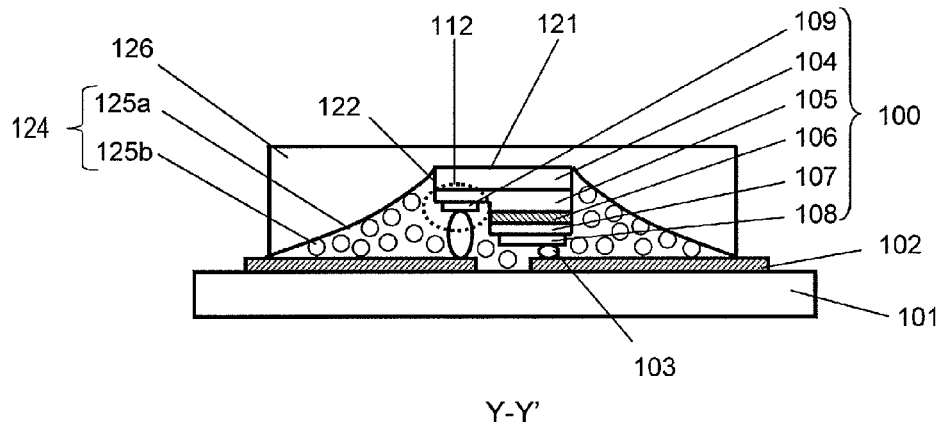
FIG. 8 is a cross-sectional view of a semiconductor light-emitting device in a fifth variation of Embodiment 1.

In an example of FIG. 8, the first light-transmissive member 124 has a thickness which gradually decreases as being away from the second light extraction planes 122. The light is not scattered uniformly in the entirety of the first light-transmissive member 124, but the effect of scattering of the light is larger in an area closer to the second light extraction planes 122. Therefore, the number of particles in an area where the effect of scattering is large is increased and the number of particles in an area where the effect of scattering is small is decreased, and thus the number of particles to be used can be decreased.

Figure 9:
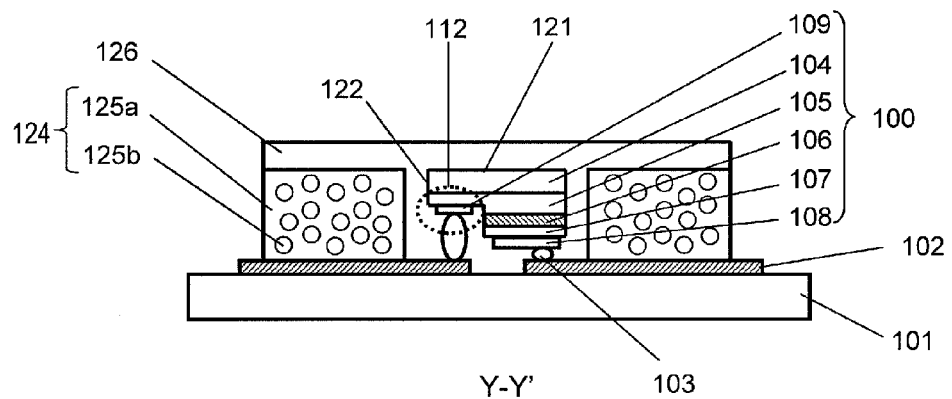
FIG. 9 is a cross-sectional view of a semiconductor light-emitting device in a sixth variation of Embodiment 1.

In an example of FIG. 9, the first light-transmissive member 124 is located away from the second light extraction planes 122. A space between the first light-transmissive member 124 and each second light extraction plane 122 is filled with a material which is the same as the material of the second light-transmissive member 126. The first light-transmissive member 124 is coupled with at least 50% of the amount of light going out the second light extraction planes 122. In this case also, the light going out of the second light extraction planes 122 is scattered by the first light-transmissive member 124. Therefore, the asymmetry of the light distribution can be sufficiently alleviated.

Figure 10:
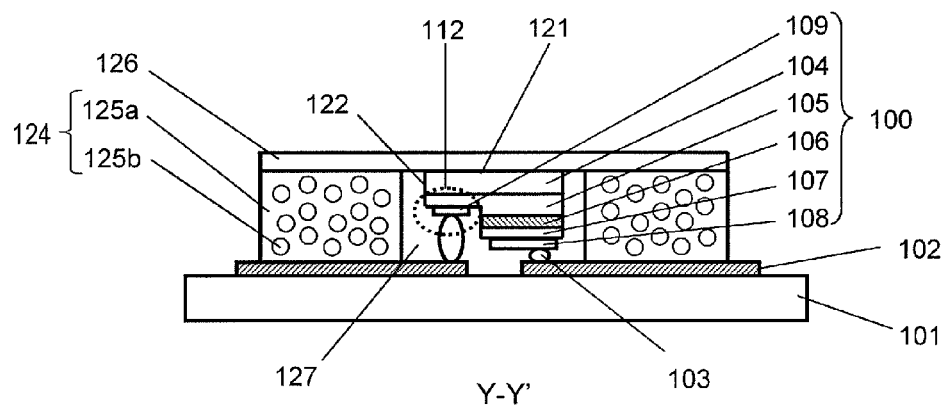
FIG. 10 is a cross-sectional view of a semiconductor light-emitting device in a seventh variation of Embodiment 1.

In an example of FIG. 10, the first light-transmissive member 124 is located away from the second light extraction planes 122. A third light-transmissive member 127 is located between the first light-transmissive member 124 and each second light extraction plane 122. The third light-transmissive member 127 may be formed of a material having a refractive index which is between the refractive index of GaN and the refractive index of the first light-transmissive member 124. Thus, the light extracting efficiency can be improved.

Figure 11:
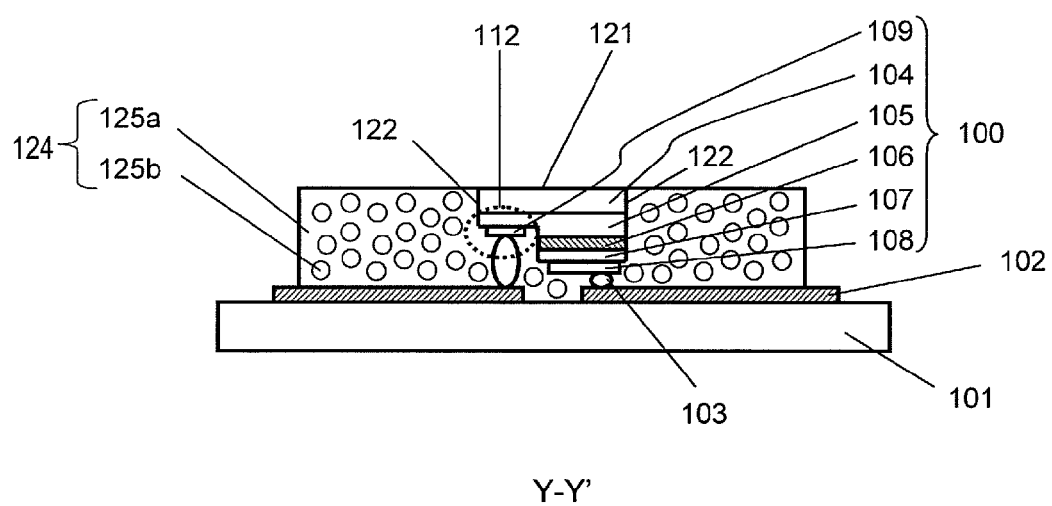
FIG. 11 is a cross-sectional view of a semiconductor light-emitting device in an eighth variation of Embodiment 1.

In an example of FIG. 11, the second light-transmissive member 126 formed of an acrylic resin or a silicone resin is not used. In the case where the second light-transmissive member 126 is formed of an acrylic resin or a silicone resin, the resin becomes yellowish or brownish as a result of absorbing light from the active layer while being used for a long time. This may decrease the optical output of the semiconductor light-emitting device. The part covered with such a resin is made small, and thus the semiconductor light-emitting device can have an improved reliability for being used for a long time.

Figure 12A:
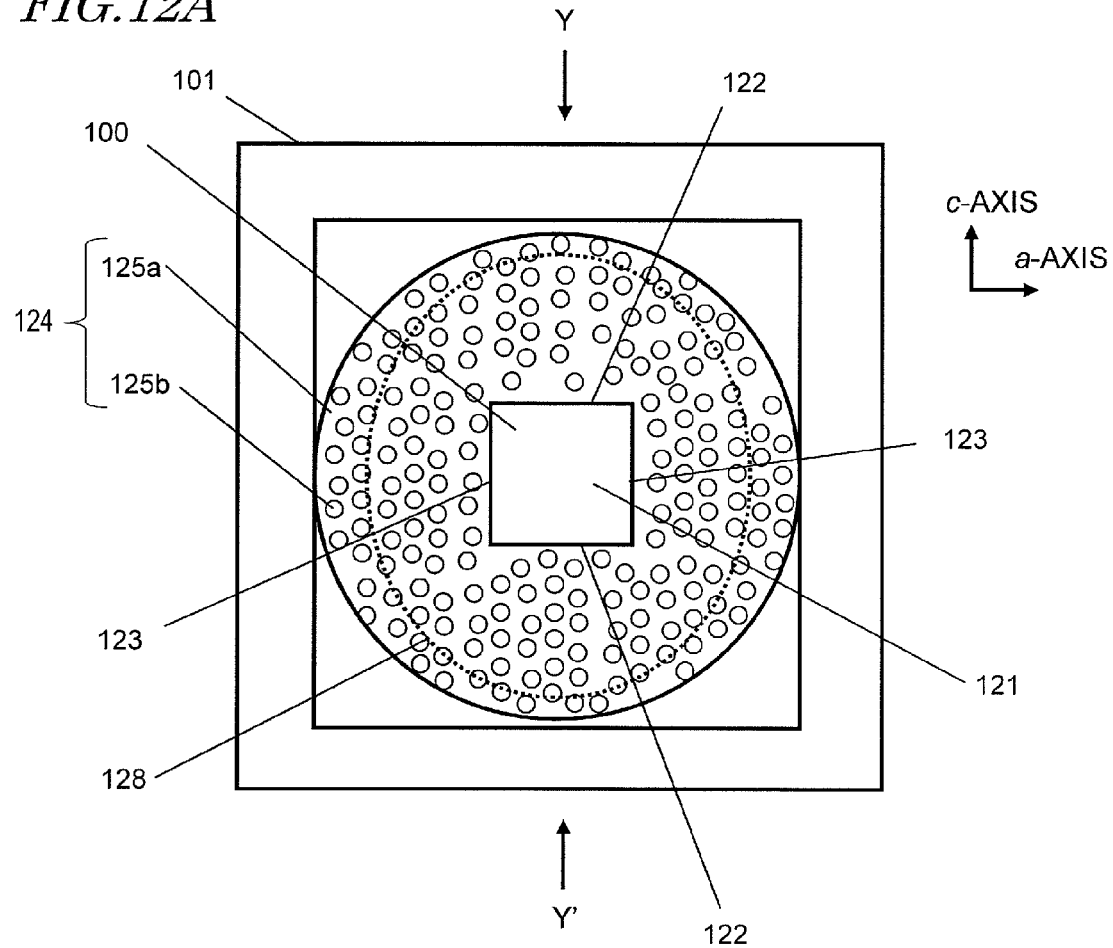
FIG. 12A is a schematic plan view showing a semiconductor light-emitting device in a ninth variation of Embodiment 1.
Figure 12B:
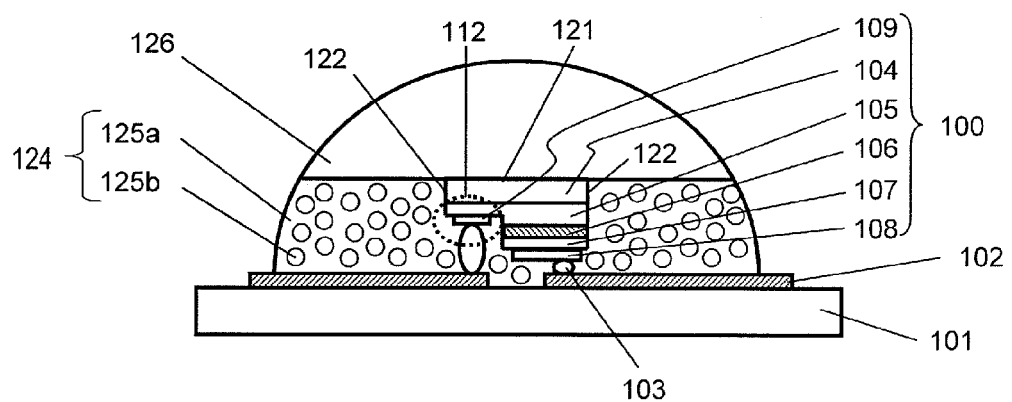
FIG. 12B is a cross-sectional view taken along line Y-Y' of FIG. 12A.

In an example of FIG. 12, the second light-transmissive member 126 is generally semi-spherical or lens-shaped.

Forming the second light-transmissive member 126 to be semi-spherical can suppress total reflection of the light directing from the inside to the outside of the second light-transmissive member 126. This improves the optical output of the semiconductor light-emitting device. The second light-transmissive member 126 may have a shape distorted from a semi-spherical shape. As the degree of symmetry of the shapes in the a-axis direction and the c-axis direction is higher at an outermost part of the second light-transmissive member 126, the light distribution characteristic is higher.

Figure 13A:
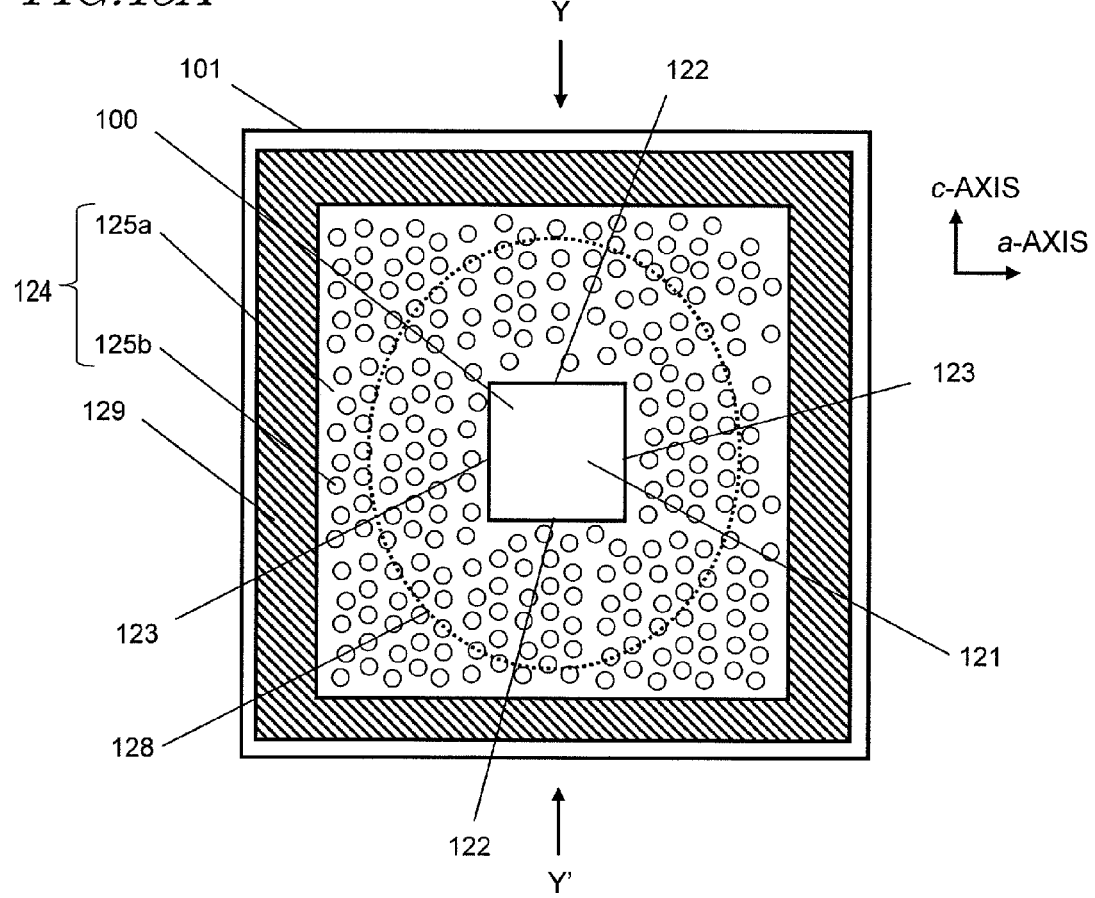
FIG. 13A is a schematic plan view showing a semiconductor light-emitting device in a tenth variation of Embodiment 1.
Figure 13B:
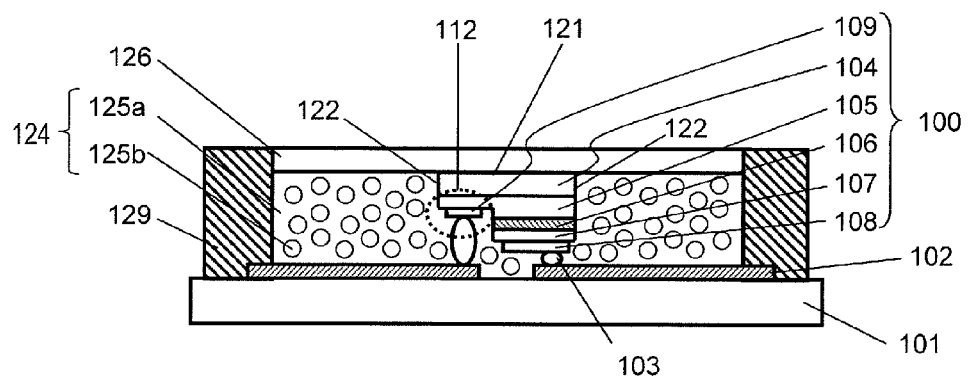
FIG. 13B is a cross-sectional view taken along line Y-YT of FIG. 13A.

FIG. 13 shows an example in which a reflective member 129 is formed outside the first light-transmissive member 124. The reflective member 129 forms a cavity surrounding the semiconductor light-emitting chip 100. The reflective member 129 is also referred to as a reflector. The reflective member 129 may be formed of a metal material such as Al or Ag, or a silicone resin containing at least 30% by weight of $TiO_2$ particles. The reflective member 129 plays a role of a cup for forming the first light-transmissive member 124. By putting a certain amount of pre-curing light-transmissive member containing the particles into the cup, the degree at which the second light extraction plane 122 is covered can be made controllable. This simplifies the production method.

Now, the elliptical shape 128, which is an effective area in which the light is diffused in the first light-transmissive member 124, will be described. As described above, the semiconductor light-emitting chip 100 including the active layer 106 formed of a nitride semiconductor having the m-plane as the main plane (and also the growth plane) exhibits a polarization characteristic. Therefore, when the emitting light is observed in the m-axis direction (as seen in a plan view parallel to the growth plane of the active layer), a contour having an equal light intensity shows a shape close to an elliptical shape which has a longer axis in the c-axis direction, which is perpendicular to the polarization direction, and has a shorter axis in the a-axis direction, which is the polarization direction. In a semiconductor light-emitting chip 100 not including any light-transmissive member, the radiating angle (range of angles in which the luminous intensity is 0.5 where the luminous intensity in the m-axis direction [1-100] of the light distribution characteristic is 1) in the c-axis direction, which is perpendicular to the polarization direction, is about 160°, and the radiating angle in the a-axis direction, which is the polarization direction, is about 140°. Therefore, the light radiating from the semiconductor light-emitting chip 100 not including any light-transmissive member has a shape close to an elliptical shape of longer axis:shorter axis=2:1. In other words, longer radius α is about twice shorter radius β (α=2β). This means that the light going out in the c-axis direction has twice as a light amount as the light going out in the a-axis direction. In addition, the center position of the elliptical shape is generally equal to the centroid of the semiconductor light-emitting chip 100. As can be seen, a contour, which has an equal light intensity, of the semiconductor light-emitting chip 100 having a polarization characteristic exhibits an elliptical shape. Therefore, the effective area, in the first light-transmissive member 124, in which the light going out of the side surfaces of the semiconductor light-emitting chip 100 is diffused can be considered as the elliptical shape 128.

Now, the size of the elliptical shape 128 will be described. Where the absorption coefficient of the first light-transmissive member 124 is $A[cm^{-1}]$, distance $z[cm]$ in which 90% of the light entering the first light-transmissive member 124 is diffused or absorbed satisfies the following expression.

$$z=-LN(0.1)/A=2.3/A[cm]$$

In the expression, LN means a natural logarithm. Thus, a range of distance z from the second light extraction planes 122 can be considered as an effective area in which the light is diffused. Therefore, the longer radius α and the shorter radius β of the elliptical shape 128 satisfies the following expressions 1 and 2.

$$\alpha=2.3/A+L/2 \quad \text{expression 1}$$

$$\beta=\alpha/2=(2.3/A+L/2)/2 \quad \text{expression 2}$$

where L is the length of one side of the nitride semiconductor light-emitting chip. By locating the first light-transmissive member 124 within the range of the longer radius α and the shorter radius β defined by the above expressions, about 90% of the light going out of the second and third light extraction planes 122 and 123 can be diffused by the particles 125b. Thus, the asymmetry of the polarization degree can be sufficiently suppressed.

The same is applicable to any non-polar plane other than the m-plane and to any semi-polar plane. As described above, an active layer formed of a nitride semiconductor having a non-polar plane such as the m-plane or the a-plane, or a semi-polar plane such as, for example, the (20-21), (20-2-1), (10-1-3), (11-22), -r or (11-22) plane as a growth plane also has a polarization characteristic. Therefore, when the radiating light is observed from the active layer, a contour having an equal light intensity exhibits a shape close to an elliptical shape having a longer axis of the longer radius α in a direction perpendicular to the polarization direction and a shorter axis of the shorter radius β in the polarization direction.

(Production Method)

Hereinafter, a method for producing a semiconductor light-emitting device according to Embodiment 1 will be described with reference to FIG. 3.

First, on a main plane of the substrate 104 formed of n-type GaN and having the m-plane as the main plane, the n-type nitride semiconductor layer 105 is epitaxially grown by metal organic chemical vapor deposition (MOCVD). Namely, silicon (Si), for example, is used as the n-type dopant. TMG $(Ga(CH_3)_3)$ as a gallium source and ammonia $(NH_3)$ as a nitrogen source are supplied. The n-type nitride semiconductor layer 105 formed of GaN and having a thickness of about 1 μm to 3 μm is formed at a growth temperature of about 900° C. or higher and about 1100° C. or lower. Herein, the substrate 104 is in a wafer state, and a plurality of light emitting structures, usable as semiconductor light-emitting devices, can be produced at the same time.

Next, the active layer 106 formed of a nitride semiconductor is grown on the n-type nitride semiconductor layer 105. The active layer 106 has an InGaN/GaN multiple quantum well (MQW) structure including, for example, well layers formed of $In_xGa_{1-x}N$ and each having a thickness of 15 nm and barrier layers formed of GaN and each having a thickness of 10 nm stacked alternately. For forming the well layers formed of $In_xGa_{1-x}N$, the growth temperature may be decreased to about 700° C. to 800° C. such that In is incorporated into the growing well layers with certainty. The light emitting wavelength is selected in accordance with the use of the semiconductor light-emitting device, and the ratio x of In suitable to the wavelength is determined. For example, when the wavelength is 450 nm (blue), the ratio x of In is determined to be 0.25 to 0.27. When the wavelength is 520 nm (green), the ratio x of In is determined to be 0.40 to 0.42. When the wavelength is 630 nm (red), the ratio x of In is determined to be 0.56 to 0.58.

Next, the p-type nitride semiconductor layer 107 is epitaxially grown on the active layer 106. Namely, $Cp_2Mg$ (biscyclopentadienyl magnesium), for example, is used as the p-type impurity. TMG and $NH_3$ are supplied as materials. The p-type nitride semiconductor layer 107 formed of p-type GaN and having a thickness of about 50 nm to 500 nm is formed on the active layer 106 at a growth temperature of about 900° C. or higher and about 1100° C. or lower. A p-type AlGaN layer having a thickness of about 15 nm to 30 nm may be contained in the p-type nitride semiconductor layer 107. Provision of the p-type AlGaN layer can suppress overflow of electrons as carriers. An undoped GaN layer may be provided between the active layer 106 and the p-type nitride semiconductor layer 107.

Next, in order to activate Mg used for doping the p-type nitride semiconductor layer 107, heat treatment is performed at a temperature of about 800° C. to 900° C. for about 20 minutes.

Next, the semiconductor stacking structure formed up to the p-type nitride semiconductor layer 107 is selectively etched by lithography and dry etching using chlorine ($Cl_2$)-based gas. This removes a part of each of the p-type nitride semiconductor layer 107, the active layer 106 and the n-type nitride semiconductor layer 105 to form a recessed part 112 and thus to expose a part of the n-type nitride semiconductor layer 105.

Next, the n-side electrode 109 is selectively formed so as to be in contact with the exposed part of the n-type nitride semiconductor layer 105. Herein, as the n-side electrode 109, a stacking film (Ti/Pt layer) of titanium (Ti) and platinum (Pt), for example, is formed.

Next, the p-side electrode 108 is selectively formed so as to be in contact with the p-type nitride semiconductor layer 107. As the p-side electrode 108, a stacking film (Pd/Pt layer) of palladium (Pd) and platinum (Pt) is formed. Then, heat treatment is performed to make an alloy between the Ti/Pt layer and the n-type nitride semiconductor layer 105, and between the Pd/Pt layer and the p-type nitride semiconductor layer 107. There is no specific limitation on the order of forming the n-type electrode 109 and the p-type electrode 108.

Next, a surface of the substrate 104 faced to the surface in contact with the n-type nitride semiconductor layer 105 (i.e., rear surface of the substrate 104) is polished to thin the substrate 104 by a prescribed amount.

The plurality of semiconductor light-emitting devices thus produced are divided into individual semiconductor light-emitting chips 100. The dividing step may be performed by any of several methods including laser dicing, cleaving. Each resultant individual semiconductor light-emitting chip 100 is mounted on a mounting surface of the mounting substrate 101. Herein, mounting of a flip chip structure will be described.

First, the mounting substrate 101 is prepared. As described above, the main material of the mounting substrate 101 may be an insulating material such as alumina (aluminum oxide), aluminum nitride (AlN) or glass epoxy; a metal material such as aluminum (Al), copper (Cu) or tungsten (W); a semiconductor material such as silicon (Si) or germanium (Ge); or a composite material thereof. The material of the wiring electrodes 102 may be a metal material such as aluminum (Al), silver (Ag), gold (Au) or copper (Cu).

A metal film for forming the wiring electrodes is formed on the surface of the mounting substrate 101 by a film formation method such as sputtering or plating. Next, a desired resist pattern is formed on the formed metal film by lithography. Then, the resist pattern is transferred to the metal film by dry etching or wet etching to form the wiring electrodes 102 of the desired electrode pattern.

Next, the plurality of bumps 103 are formed at prescribed positions on the wiring electrodes 102. For example, the bumps 103 can be formed of gold (Au). A bump bonder is usable to form the bumps 103 having a diameter of about 40 µm to 80 µm. The bumps 103 may be formed by plating instead of use of the bump bonder. To the wiring electrodes 102 having the plurality of bumps 103 formed thereon, the electrode-formed surface of the semiconductor light-emitting chip 100 is connected by, for example, an ultrasonic joining method.

Next, particles formed of, for example, titanium oxide are mixed in a silicone resin, and the first light-transmissive member 124 is formed on the side surfaces of the semiconductor light-emitting chip 100 by use of a dispenser. On the surface of the first light-transmissive member 124, a silicone resin layer is formed as the second light-transmissive member 126. By the above-described steps, the nitride semiconductor light-emitting device is obtained.

Thus, the nitride semiconductor light-emitting device according to Embodiment 1 is obtained.

Embodiment 2

Hereinafter, a semiconductor light-emitting device according to Embodiment 2 according to the present disclosure will be described with reference to FIGS. 14A through 14F. In FIG. 14, identical elements to those in FIG. 3 will bear identical reference signs thereto and descriptions thereof will be omitted. This will be also applied to the following embodiments. Herein, differences of Embodiment 2 from Embodiment 1 will be described.

Figure 14A:
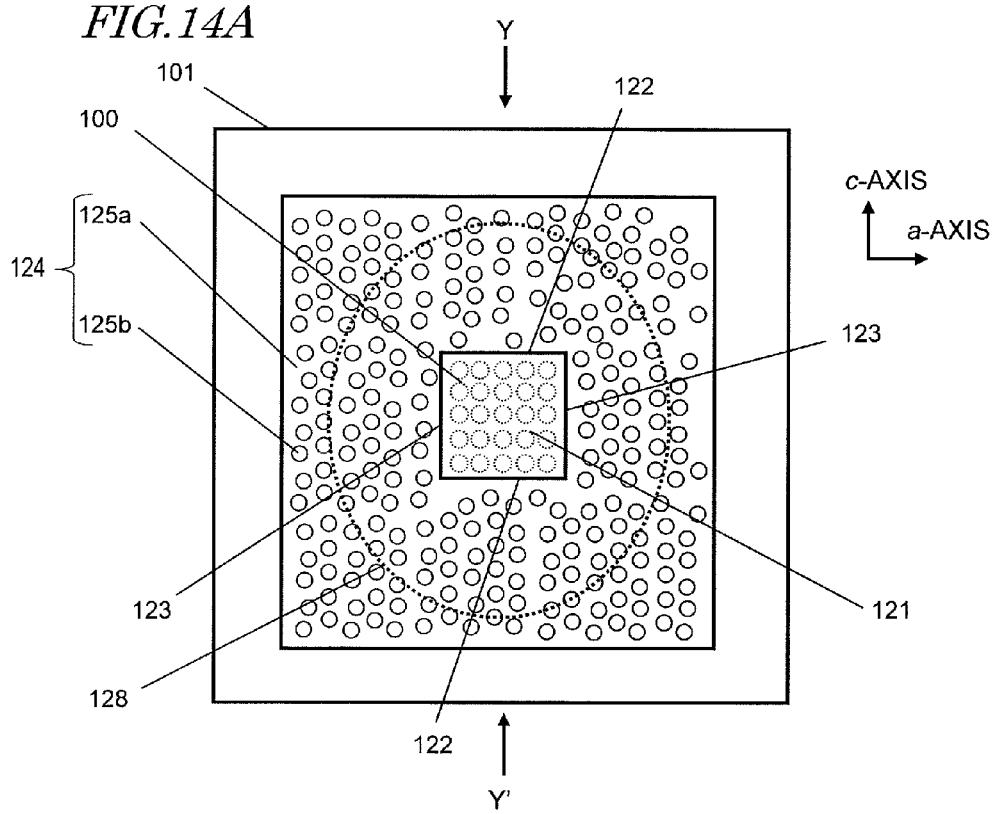
FIG. 14A is a schematic plan view showing a semiconductor light-emitting device in Embodiment 2.
Figure 14B:
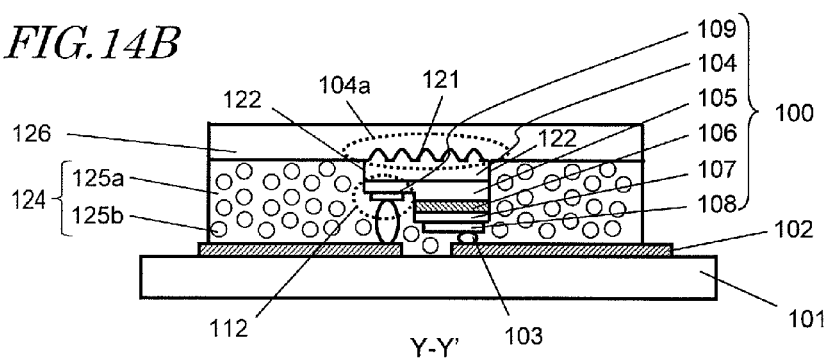
FIG. 14B is a cross-sectional view taken along line Y-Y' of FIG. 14A.

As shown in FIGS. 14A and 14B, in Embodiment 2, unlike in Embodiment 1, the first light extraction plane 121 has a plurality of projection and recess portions 104a having a plurality of projection and recess or texture. In the example of FIG. 14B, each projection portion of the projection and recess portions 104a has a generally semi-spherical cross-section in a direction perpendicular to the substrate surface. The projection and recess portions 104a at the rear surface of the substrate 104 can be produced by thinning the substrate 104, forming a resist pattern by lithography, and then processing the rear surface of the substrate 104 by dry etching using a chorine-based etchant.

In Embodiment 2, owing to the plurality of projection and recess portions 104a formed at the first light extraction plane 121, the light extracting efficiency from the first light extraction plane 121 is improved. Thus, the optical output of the semiconductor light-emitting device is improved.

FIGS. 14C through 14F each show a variation of the projection and recess portions 104a. The polarization degree of light radiating from the first light extraction plane 121 depends on the shape of the plurality of projection and recess portions 104a.

In the case where the projection and recess portions 104a include semi-spherical projection portions as shown in FIG. 14B, the projection and recess portions 104a diffuse the light and the polarization degree is decreased.

Figure 14C:
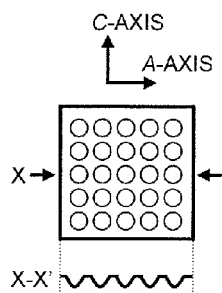
FIG. 14C is a cross-sectional view of a semiconductor light-emitting device in a first variation of Embodiment 2.

As shown in FIG. 14C, the recess portions may be semi-spherical instead of the projection portions. In this case, the projection and recess portions 104a diffuse the light and the polarization degree is decreased.

Figure 14D:
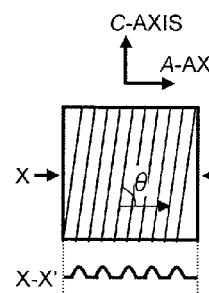
FIG. 14D is a cross-sectional view of a semiconductor light-emitting device in a second variation of Embodiment 2.
Figure 14E:
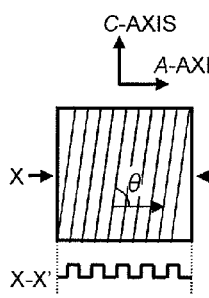
FIG. 14E is a cross-sectional view of a semiconductor light-emitting device in a third variation of Embodiment 2.
Figure 14F:
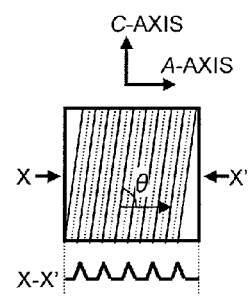
FIG. 14F is a cross-sectional view of a semiconductor light-emitting device in a fourth variation of Embodiment 2.

As shown in FIGS. 14D, 14E and 14F, the projection and recess portions 104a may include striped projection and recess portions as seen in a plan view (plan view parallel to the growth plane of the active layer). In FIG. 14D, the projection portions each have a generally semi-circular cross-section. In FIG. 14E, the projection portions each have a square cross-section. In FIG. 14F, the projection portions each have a triangular cross-section. The stripes extend in a direction inclining by angle θ with respect to the polarization direction of the active layer 106 formed of a nitride semiconductor. The polarization degree of the light radiating from the first light extraction plane 121 heavily depends on the angle θ. When the angle θ is 0° or higher and less than 5°, the polarization degree is maintained. When the angle θ is 5° or higher and 90° of less, the polarization degree is decreased.

In this embodiment, only the flip chip structure is described. The projection and recess portions 104a may be formed in the wire bonding structure as shown in FIG. 4. Namely, in the variation shown in FIG. 4B, the projection and recess portions may be formed at the first light extraction plane 121 of the p-type nitride semiconductor layer 107. In the variation shown in FIG. 4C, the projection and recess portions may be formed at the first light extraction plane 121 of the substrate 104. In the wire bonding structure also, the projection and recess portions 104a formed at the first light extraction plane 121 provide substantially the same effect.

The examples in Embodiments 1 and 2 may be combined with another one or plurality of examples appropriately.

Embodiment 3

Hereinafter, Embodiment 3 according to the present disclosure will be described with reference to FIGS. 15A and 15B.

Figure 15A:
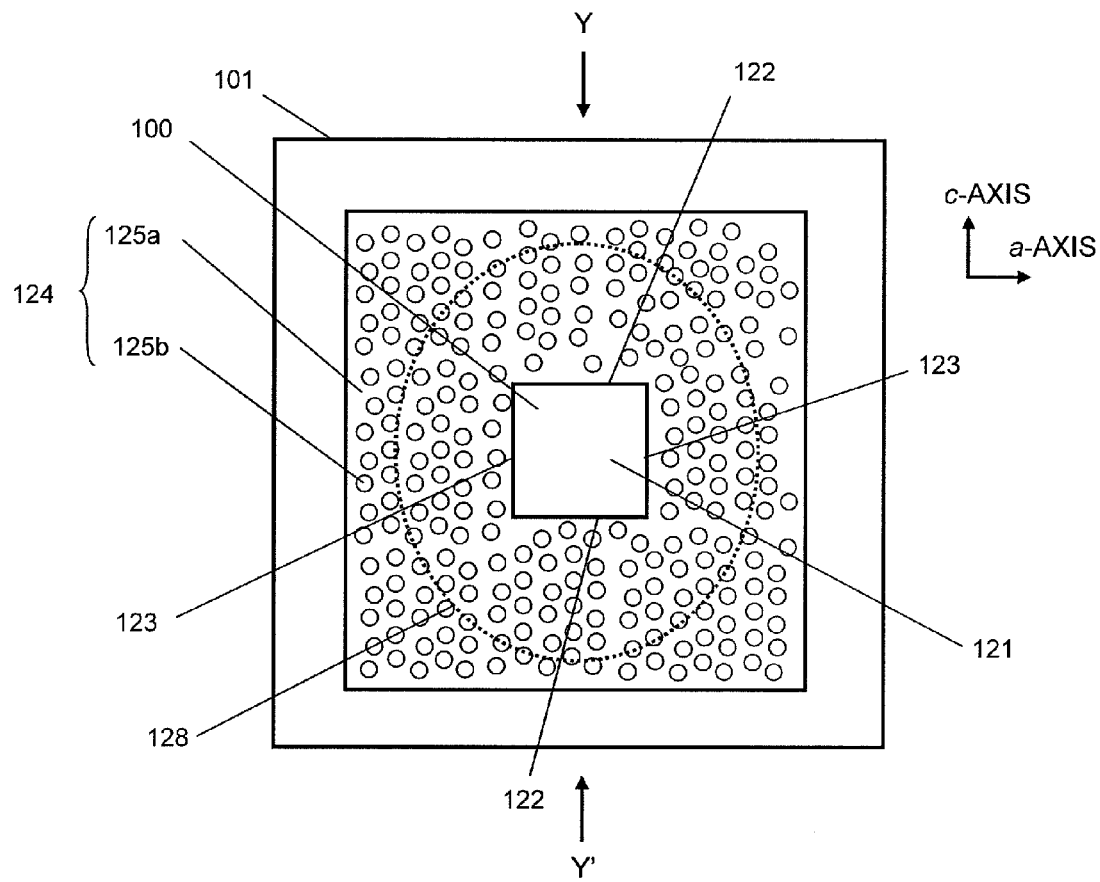
FIG. 15A is a schematic plan view showing a semiconductor light-emitting device in Embodiment 3 according to the present disclosure.
Figure 15B:
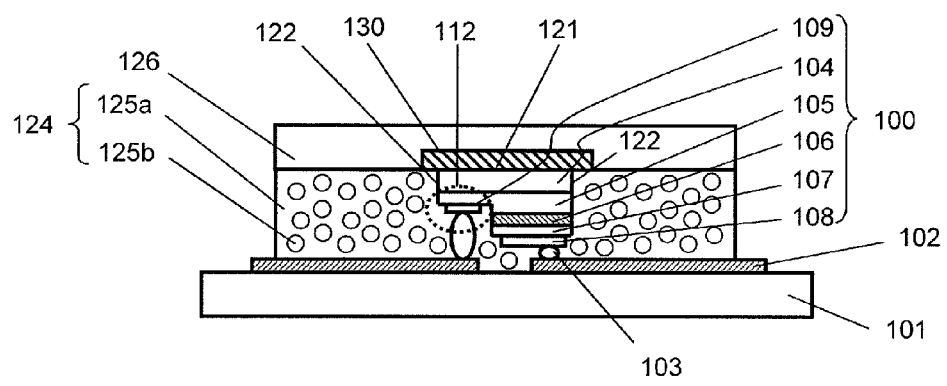
FIG. 15B is a cross-sectional view taken along line Y-Y' of FIG. 15A.

FIGS. 15A and 15B are respectively a plan view and a cross-sectional view of a semiconductor light-emitting device in this embodiment. The semiconductor light-emitting device in this embodiment includes a semiconductor light-emitting chip 100, a wavelength converting member 112, and a first light-transmissive member 124. The semiconductor light-emitting device may further include a second light-transmissive member 126. As shown in FIG. 15B, the semiconductor light-emitting chip 100 has a semiconductor stacking structure formed of nitride semiconductors. The semiconductor stacking structure includes a substrate 104 having a GaN layer having the m-plane as a main plane (and also a growth plane) (hereinafter, such a GaN layer will be referred to as an m-plane GaN layer) on at least a surface thereof, an n-type nitride semiconductor layer 105 formed on the main plane of the substrate 104, an active layer 106 formed of a nitride semiconductor and provided on the n-type nitride semiconductor layer 105, and a p-type nitride semiconductor layer 107 formed on the active layer 106. The semiconductor light-emitting chip 100 also includes a p-side electrode 108 formed so as to be in contact with the p-type nitride semiconductor layer 107, and an n-side electrode 109 formed so as to be in contact with the exposed n-type nitride semiconductor layer 105. The n-type nitride semiconductor layer 105, the active layer 106 and the p-type nitride semiconductor layer 107 each have a growth plane which is generally parallel to the m-plane. Namely, these layers are stacked in the m-axis direction. Another layer may be formed between the n-type nitride semiconductor layer 105 and the active layer 106. Another layer may be formed between the active layer 106 and the p-type nitride semiconductor layer 107. The following description will be given on a semiconductor formed of a gallium nitride-based compound (GaN-based semiconductor) as an example of the nitride semiconductor. The GaN-based semiconductor includes a semiconductor represented by general formula $Al_xIn_yGa_zN$ (where $0 \leq x < 1$, $0 \leq y < 1$, $0 < z \leq 1$, $x+y+z=1$).

As shown in FIGS. 15A and 15B, the semiconductor light-emitting chip 100 is mounted on the mounting substrate 101 such that the p-side electrode 108 and the n-side electrode 109 face wiring electrodes 102 located on a surface of the mounting substrate 101. Namely, the semiconductor light-emitting chip 100 is electrically connected to, and held by, the two wiring electrodes 102 on the mounting substrate 101 while bumps 103 is had therebetween. Such a structure is referred to as a flip chip structure. One of the wiring electrodes 102 is connected to the p-side electrode 108, and the other electrode 102 is connected to the n-side electrode 109. A main material of the mounting substrate 101 may be an insulating material such as alumina (aluminum oxide), aluminum nitride (AlN) or glass epoxy; a metal material such as aluminum (Al), copper (Cu) or tungsten (W); a semiconductor material such as silicon (Si) or germanium (Ge); or a composite material thereof. A material of the wiring electrodes 102 may be a metal material such as aluminum (Al), silver (Ag), gold (Au) or copper (Cu).

Figure 16A:
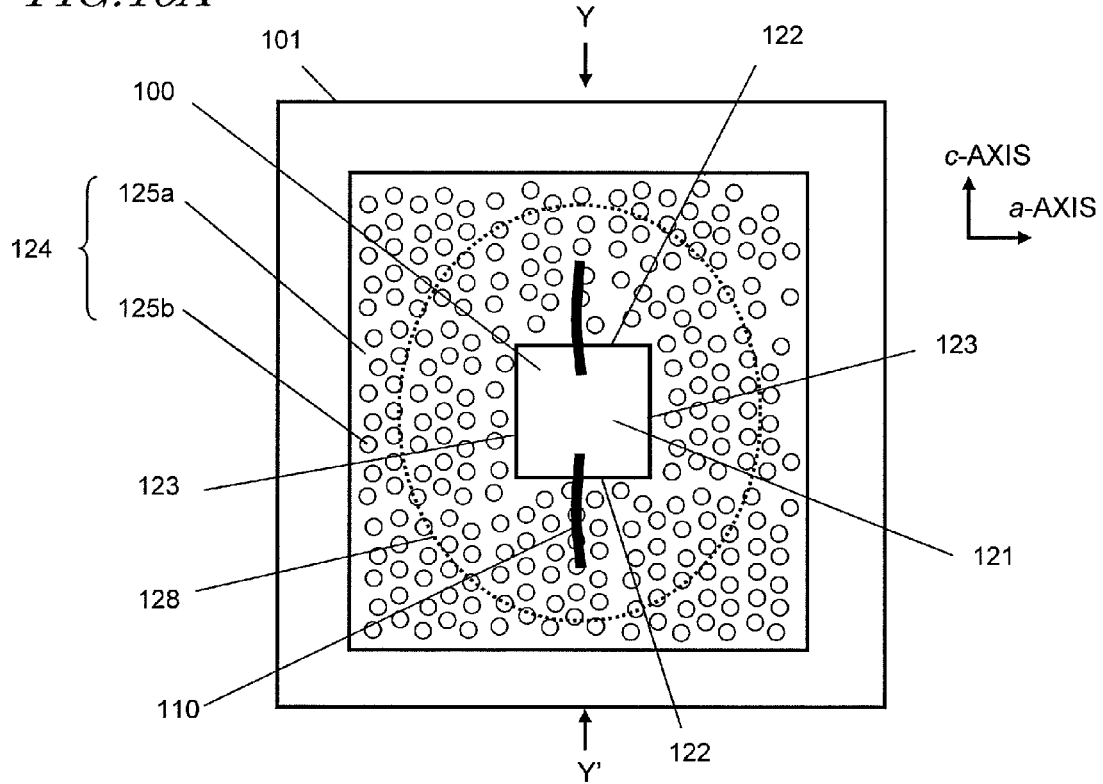
FIG. 16A is a schematic plan view showing a semiconductor light-emitting device in a first variation of Embodiment 3.
Figure 16B:
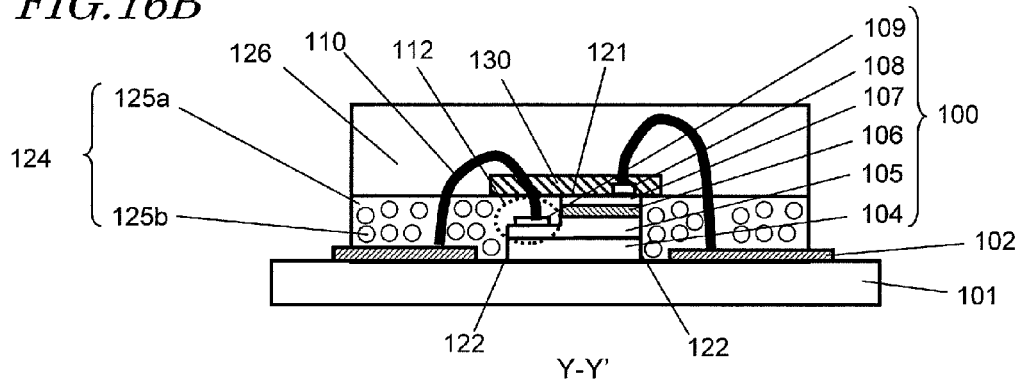
FIG. 16B is a cross-sectional view taken along line Y-Y' of FIG. 16A.
Figure 16C:
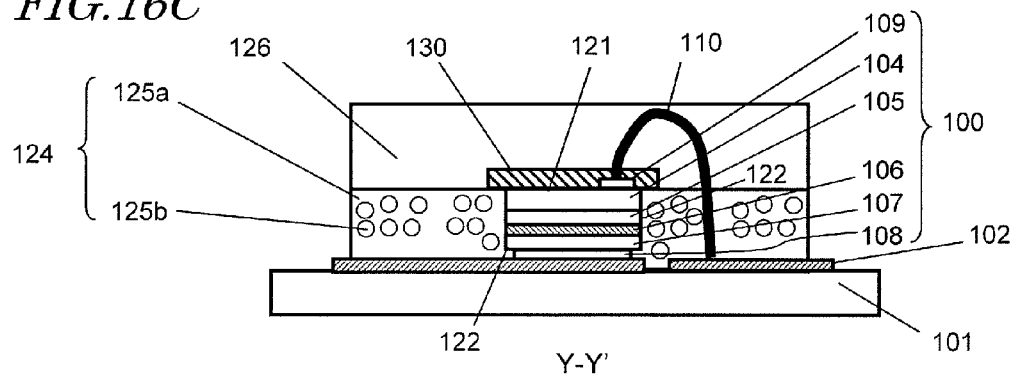
FIG. 16C is a cross-sectional view of a semiconductor light-emitting device in another variation of Embodiment 3.

As shown in FIGS. 16A through 16C, a wire bonding structure is usable instead of the flip chip structure. In a variation shown in FIGS. 16A and 16B, the semiconductor light-emitting chip 100 is held in a state where the substrate 104 faces the surface of the mounting substrate 101. The p-side electrode 108 and the n-side electrode 109 are electrically connected to the wiring electrodes 102 on the mounting substrate 101 respectively via wires 110 formed of gold (Au) or aluminum (Al). The first light extraction plane 121 is formed on the p-type nitride semiconductor layer 107. In this case, the substrate 104 may or may not be conductive. The substrate 104 may be an insulating substrate such as, for example, a sapphire substrate. A wavelength converting member 130 is formed on the semiconductor light-emitting chip 100 after, for example, the wires 110 are connected to the p-side electrode 108 and the n-side electrode 109. Thus, a part of the wires 110 and the p-side electrode 108 are surrounded by the wavelength converting member 130.

In a variation shown in FIG. 16C, the semiconductor light-emitting chip 100 is held in a state where the p-side electrode 108 faces the surface of the mounting substrate 101. The p-side electrode 108 is electrically connected to the electrode 102 on the mounting substrate 101 with a soldering material such as a gold-tin (AuSn) material. The n-side electrode 109 is electrically connected to the electrode 102 on the mounting substrate 101 via the wire 110 formed of gold (Au). The first light extraction plane 121 is formed on the substrate 104. In this case, the substrate 104 is conductive. The wavelength converting member 130 is formed on the semiconductor light-emitting chip 100 after, for example, the wire 110 is connected to the n-side electrode 109. Thus, a part of the wires 110 and the n-side electrode 108 are surrounded by the wavelength converting member 130.

As can be seen, the flip chip structure and the wire bonding structure are different in the method of connecting the p-side electrode 108 and the n-side electrode 109 to the wiring electrode(s) 102 on the mounting substrate 101. However, the flip chip structure and the wire bonding structure are substantially the same in the rest of the structure and provide substantially the same function and effect when adopting an embodiment according to the present disclosure. Thus, the flip chip structure will be described below.

The substrate 104 may be a hexagonal m-plane GaN substrate, or a hexagonal m-plane Sic substrate having an m-plane GaN layer formed on the surface thereof. Alternatively, the substrate 104 may be an r-plane sapphire substrate, an m-plane sapphire substrate, or an a-plane sapphire substrate each having an m-plane GaN layer formed on the surface thereof. Still alternatively the substrate 104 may not be included.

The n-type nitride semiconductor layer 105 is formed of, for example, n-type $Al_uGa_vIn_wN$ (where $0 \leq U$, v, $w \leq 1$, $u+v+w=1$). As an n-type dopant, silicon (Si), for example, is usable.

The active layer 106 includes a plurality of barrier layers formed of $In_YGa_{1-Y}N$ (where $0 \leq Y < 1$) and at least one well layer formed of $In_XGa_{1-X}N$ (where $0 < X \leq 1$) and interposed between the barrier layers along a top surface and a bottom surface thereof. The active layer 106 may include a single well layer. The active layer 106 may have a multiple quantum well (MQW) structure in which the well layers and the barrier layers are stacked alternately. The wavelength of the light radiating from the semiconductor light-emitting chip 100 is determined by the ratio x of In in the $In_XGa_{1-X}N$ semiconductor, which forms the well layers.

The p-type nitride semiconductor layer 107 is formed of, for example, a p-type $Al_sGa_tN$ (where $0 \leq s$, $t \leq 1$, $s+t=1$) semiconductor. As a p-type dopant, magnesium (Mg), for example, is usable. The p-type dopant may be, for example, zinc (An) or beryllium (Be) instead of Mg. In the p-type nitride semiconductor layer 107, the ratio s of Al may be uniform in a thickness direction or may change in the thickness direction continuously or step by step. Specifically, the p-type nitride semiconductor layer 107 has a thickness of, for example, about 0.05 μm to 2 μm. In a part of the p-type nitride semiconductor layer 107 in the vicinity of a top surface thereof, namely, in a part of the p-type nitride semiconductor layer 107 in the vicinity of the interface with the p-side electrode 108, the ratio s of Al may be 0. Namely, this part may be formed of GaN. In this case, GaN may contain p-type impurities at a high concentration and act as a contact layer with the p-side electrode 108.

The p-side electrode 108 may cover substantially the entire surface of the p-type nitride semiconductor layer 107. The p-side electrode 108 has, for example, a stacking structure (Pd/Pt) including a palladium (Pd) layer and a platinum (Pt) layer in a stacked manner. In order to improve the reflectance of the radiating light, the p-side electrode 108 may have a stacking structure (Ag/Pt) including a silver (Ag) layer and a platinum (Pt) layer in a stacked manner, or a stacking structure (Pd/Ag/Pt) including a Pd layer, an Ag layer and a Pt in a stacked manner sequentially.

The n-side electrode 109 has, for example, a stacking structure (Ti/Pt) including a titanium (Ti) layer and a platinum (Pt) layer in a stacked manner. In order to improve the reflectance of the radiating light, the n-side electrode 109 may have a stacking structure (Ti/Al/Pt) including a Ti layer, an Al layer and a Pt in a stacked manner sequentially.

A main material of the mounting substrate 101 may be an insulating material such as alumina (aluminum oxide), aluminum nitride (AlN) or glass epoxy; a metal material such as aluminum (Al), copper (Cu) or tungsten (W); a semiconductor material such as silicon (Si) or germanium (Ge); or a composite material thereof.

A material of the wiring electrodes 102 may be a metal material such as aluminum (Al), silver (Ag), gold (Au) or copper (Cu).

The semiconductor light-emitting chip 100 shown in FIGS. 15A and 15B is one of a plurality of square or rectangular small pieces obtained by cutting a wafer including stacked semiconductor layers along the a-axis direction and the c-axis direction. In this case, the c-plane of the nitride semiconductor is easily cleavable, which provides an advantage that the step of dividing the wafer into small pieces can be simplified. The semiconductor light-emitting chip 100 may be a small piece cut in directions inclined by about 0° to 45° with respect to the a-axis direction and the c-axis direction. In this case, a plane which is poorly cleavable is exposed on a side surface of the semiconductor light-emitting chip 100. This causes recess portions and projection portions to be made easily at the side surface of the semiconductor light-emitting chip 100, which provides an advantage that the extraction of radiating light is improved owing to the projection portions and the recess portions.

As described above, the semiconductor light-emitting chip 100 including the active layer 106 having the m-plane as the main plane (also the growth plane) and formed of a nitride semiconductor has a polarization characteristic having the a-axis direction as the polarization direction. Light has a property of being propagated in a direction perpendicular to the polarization direction. Therefore, a plane generally perpendicular to the propagated light greatly contributes to the light extraction. This plane can be defined as a plane including the polarization direction therein. In the case of the semiconductor light-emitting chip 100 shown in FIGS. 15A and 15B including the active layer 106 having the m-plane as the main plane (also the growth plane) and formed of a nitride semiconductor, a rear surface of the substrate 104 is a plane which is parallel to the m-plane and also includes the a-axis direction therein. The rear surface is referred to as a first light extraction plane 121. Side surfaces of the semiconductor light-emitting chip 100 that are parallel to the c-plane are planes including the a-axis direction therein. Such side surfaces are each referred to as a second light extraction plane 122. Side surfaces of the semiconductor light-emitting chip 100 that are parallel to the a-plane are planes not including the a-axis direction therein. Such side surfaces are each referred to as a third light extraction plane 123. The amount of light going out of each third light extraction plane 123 is smaller than the amount of light going out of each of the first and second light extraction planes. As can be seen, in the semiconductor light-emitting chip 100 having a polarization characteristic, there is a problem that light is released intensely from a specific side surface, which decreases the symmetry of the light distribution. From the second light extraction planes 122, light of a long wavelength caused by the first band mainly goes out. From the third light extraction planes 123, light of a short wavelength caused by the second band mainly goes out. From the first light extraction plane 121, mixed light of light of a long wavelength caused by the first band and light of a short wavelength caused by the second band goes out. The amount of light of a long wavelength component and the amount of light of a short wavelength component are different in accordance with the azimuth angle. Therefore, there is a problem that the wavelength of the outgoing light varies in accordance with the azimuth angle. In this embodiment, the first light extraction plane 121 is the m-plane, namely, parallel to the growth plane. The first light extraction plane 121 merely needs to be non-perpendicular to the growth plane. The second light extraction plane 122 merely needs to be non-perpendicular to the polarization direction.

In the case of the semiconductor light-emitting chip 100 including the active layer 106 having the m-plane as the main plane (also the growth plane) and formed of a nitride semiconductor, when a ratio of the area size of each second light extraction plane 122 to the first light extraction plane 121 exceeds 32%, the symmetry of the light distribution starts decreasing. When the ratio exceeds 46%, the symmetry of the light distribution is significantly poor.

The wavelength converting member 130 is located such that the polarized light going out of the first light extraction plane 121 is incident on the wavelength converting member 130. More specifically, the wavelength converting member 130 faces and covers the first light extraction plane 121.

Herein, the expression "the wavelength converting member 130 covers the first light extraction plane 121" means that the wavelength converting member 130 contacts the first light extraction plane 121, or that the wavelength converting member 130 and the first light extraction plane 121 are located such that the most of the polarized light going out of the first light extraction plane 121 is coupled with the wavelength converting member 130 although there is a space or another member between the wavelength converting member 130 and the first light extraction plane 121. Specifically in this embodiment, the wavelength converting member 130 is located at least above the first light extraction plane 121.

The wavelength converting member 130 converts the wavelength of the polarized light going out of the active layer 106. For example, the wavelength converting member 130 receives polarized light in a purple to blue wavelength range going out of the active layer 106 and outputs white light. For example, the wavelength converting member 130 receives polarized light in a purple wavelength range going out of the active layer 106 and outputs single color light of blue, green or red. For example, the wavelength converting member 130 receives blue polarized light going out of the active layer 106 and outputs single color light of green or red. The wavelength converting member 130 may be formed of a sintered or aggregated body of a fluorescent material formed of fluorescent particles, a single crystalline fluorescent material, an amorphous fluorescent material or a fluorescent ceramic material. Alternatively, the wavelength converting member 130 may be formed of a light-transmissive member containing any of the above-mentioned fluorescent materials. The fluorescent material may be a Ce:YAG-based fluorescent material ("Ce:YAG" means yttrium aluminum garnet activated by Ce (hereinafter, referred to as "Ce-activated")), a Ce-activated aluminate-based fluorescent material, an Eu-activated orthosilicate-based fluorescent material, a nitride fluorescent material or an oxynitride fluorescent material. The light-transmissive member may be formed of an epoxy resin, a silicone resin or glass. The wavelength converting member 130 may have a thickness of, for example, not less than 30 µm and not more than 1 mm.

The semiconductor light-emitting device in this embodiment includes the first light-transmissive member 124, and the first light-transmissive member 124 is located such that the polarized light going out of the second light extraction planes 122 is incident on the first light-transmissive member 124, in order to alleviate the color non-uniformity of the light emitting wavelength of the nitride semiconductor light-emitting element on the non-polar or semi-polar plane formed of the wavelength converting member. More specifically, the first light-transmissive member 124 faces and covers the second light extraction planes 122. Herein, the expression "the first light-transmissive member 124 covers the second light extraction planes 122" means that the first light-transmissive member 124 contacts the second light extraction planes 122 or that the first light-transmissive member 124 and the second light extraction planes 122 are located such that the most of the polarized light going out of the second light extraction planes 122 is coupled with the first light-transmissive member 124 although there is a space or another member between the first light-transmissive member 124 and the second light extraction planes 122. Specifically in this embodiment, the first light-transmissive member 124 is located to the side of at least a part of the second light extraction planes 122 and extends in a direction perpendicular to the second light extraction plane 122.

The first light-transmissive member 124 includes a substrate member 125a and particles 125b dispersed in the substrate member 125a. The substrate member 125a and the particles 125b may be transparent with respect to the light going out of the active layer 106. The substrate member 125a and the particles 125b have different refractive indexes. Either one of the substrate member 125a and the particles 125b may have a larger refractive index. Since the refractive indexes are different, the polarized light transmitted through the substrate member 125a can be effectively scattered at a surface of the particles 125b. Owing to the first light-transmissive member 124, the polarized light going out of the active layer of the semiconductor light-emitting chip 100 is scattered and goes out in various directions. Namely, the first light-transmissive member 124 transmits, while the polarized light going out of the active layer of the semiconductor light-emitting chip 100 is diffused. Therefore, the anisotropy of the light emitting wavelength and the anisotropy of the light emitting intensity, of the polarized light going out of the active layer of the semiconductor light-emitting chip 100, in accordance with the outgoing direction in the growth plane is suppressed, and thus the color non-uniformity is decreased.

The substrate member 125a may be formed of an epoxy resin or a silicone resin. The particles 125b may be formed of a material which does not easily absorb the polarized light from the active layer 106. Especially, use of an inorganic material realizes a high reliability for being used for a long time. Specifically, the particles 125b may be formed of $TiO_2$, $SiO_2$, $ZrO_2$, $Nb_2O_5$, $ZnO$, $Al_2O_3$ or AlN.

In order to effectively scatter the light transmitted through the first light-transmissive member 124, the particles 125b may have an average particle diameter of not less than 10 nm and not more than 3000 nm. As described later, the first light-transmissive member 124 may include the particles 125b at a ratio of not less than 0.2% by weight (0.047% by volume) and not more than 15.0% by weight (3.521% by volume) or at a ratio of not less than 0.7% by weight (0.164% by volume) and not more than 3.0% by weight (0.704% by volume). Owing to this, the decrease in the optical output can be suppressed to 10% or less while the anisotropy of the light emitting intensity is alleviated.

The first light-transmissive member 124 may face the third light extraction planes 123. In this case, the light going out of the third light extraction plane 123 can be diffused by the particles 125b.

The first light-transmissive member 124 does not need to cover the entire surface of the mounting substrate 101. An elliptical shape 128 represents an area in which the light going out of the second third light extraction planes 122 and the third light extraction planes 123 is diffused effectively. The elliptical shape 128 is in a direction perpendicular to the growth plane. When the semiconductor light-emitting chip is seen in a direction perpendicular to the first light extraction plane 121 (direction perpendicular to the paper sheet of FIG. 15A), the elliptical shape 128 has a longer axis α in a direction perpendicular to the polarization direction (c-axis direction) and a shorter axis β in the polarization direction (a-axis direction).

As described above, the semiconductor light-emitting chip 100 including the active layer 106 formed of a nitride semiconductor having the m-plane as the main plane (and also the growth plane) exhibits a polarization characteristic. Therefore, when the radiating light is observed in the m-axis direction, a contour having an equal light intensity exhibits a shape close to an elliptical shape which has a longer radius α in the c-axis direction, which is perpendicular to the polarization direction, and has a shorter radius β in the a-axis direction, which is the polarization direction. As described later, in the semiconductor light-emitting chip 100 not including any light-transmissive member, the radiating angle in the c-axis direction, which is perpendicular to the polarization direction, is about 160°, and the radiating angle in the a-axis direction, which is the polarization direction, is about 140°. Therefore, the light radiating from the semiconductor light-emitting chip 100 not including any light-transmissive member has a shape close to an elliptical shape of longer axis: shorter axis=2:1. Namely, the longer radius α is about twice the shorter radius β (α=2β). This means that the light going out in the c-axis direction has a light amount that is twice the light amount of the light going out in the a-axis direction. In addition, the center position of the elliptical shape is generally equal to the centroid of the semiconductor light-emitting chip 100. As can be seen, a contour having an equal light intensity of the semiconductor light-emitting chip 100 having a polarization characteristic exhibits an elliptical shape. Therefore, the effective area in the first light-transmissive member 124 in which the light going out of side surfaces of the semiconductor light-emitting chip 100 is diffused can be considered as the elliptical shape 128.

Now, it is assumed that the absorption coefficient of the first light-transmissive member 124 is $A[cm^{-1}]$, and that the semiconductor light-emitting chip, as seen in a direction perpendicular to the first light extraction plane 121, has length L in a direction perpendicular to the polarization direction (c-axis direction) and polarization direction (a-axis direction). In the case where the first light-transmissive member 124 is in contact with the second and third light extraction planes 122 and 123, distance z[cm] in which 90% of the light entering the first light-transmissive member 124 is diffused or absorbed fulfills the following expression.

$$z=-LN(0.1)/A=2.3/A[cm]$$

In the expression, LN is a natural logarithm. Thus, a range of the distance z from each second light extraction plane 122 can be considered as an effective area in which the light is diffused.

In order to diffuse about 90% of the polarized light going out of the second and third light extraction planes 122 and 123 by the first light extraction plane 121, the longer radius α and the shorter radius β may fulfill the following expressions.

$$\alpha=2.3/A+L/2$$

$$\beta=\alpha/2=(2.3/A+L/2)/2$$

When the semiconductor light-emitting chip is observed in a direction perpendicular to the first light extraction plane 121, the first light-transmissive member 124 is provided in the entire area of the elliptical shape 128 so as to fulfill these conditions. Owing to this, the polarized light going out of the second and third light extraction planes 122 and 123 is effectively scattered. Therefore, the anisotropy of the light emitting wavelength and the anisotropy of the light emitting intensity, of the polarized light going out of the active layer of the semiconductor light-emitting chip 100, in accordance with the outgoing direction in the growth plane is suppressed, and thus the color non-uniformity is decreased.

In order to effectively perform wavelength conversion also on the polarized light having the anisotropy suppressed, the wavelength converting member 130 may be provided in the entire area of the elliptical shape 128 when the semiconductor light-emitting chip is seen in a direction perpendicular to the first light extraction plane 121. This allows the wavelength conversion to be performed by use of the wavelength converting member 130.

As described later, the anisotropy of the light emitting intensity and the anisotropy of the light emitting wavelength, of the polarized light going out of the active layer, in accordance with the outgoing direction in the growth plane is conspicuous in the range of not less than 45° and not more than 75° from the normal to the first light extraction plane 121, and is small at the normal direction to the first light extraction plane 121 or in the range of less than 45° from the normal. Therefore, it is not necessary to scatter the polarized light going out of the first light extraction plane 121. Specifically when there is a problem that a part of the light incident on the first light-transmissive member 124 is absorbed while being transmitted therein and as a result, the intensity of the polarized light going out of the first light extraction plane 121 is decreased, the first light-transmissive member 124 does not need to cover the first light extraction plane 121.

In this case, for the purpose of realizing at least one of protection of the first light extraction plane 121 and the increase in the amount of light going outside from the first light extraction plane 121, the second light-transmissive member 126 may be provided for covering the first light extraction plane 121 while the wavelength converting member 130 is had therebetween. The second light-transmissive member 126 may be formed of any of various transparent materials such as, for example, an epoxy resin, a silicone resin, glass, a plastic material, or a light-transmissive single crystalline substrate. In the case where the second light-transmissive member 126 is formed in close contact with the wavelength converting member 130, an epoxy resin or a silicone resin is usable for the second light-transmissive member 126. For the above-described reason, the second light-transmissive member 126 may be formed of a material which transmits, instead of diffusing, a larger amount of incident light than the material of the first light-transmissive member 124. Specifically, the second light-transmissive member 126 may have a diffuse-transmittance lower than that of the first light-transmissive member 124. The diffuse-transmittance refers to a ratio of the diffuse-transmitted light to the incident light. The diffuse-transmitted light refers to light going out while being diffused at a surface or inside of an object.

The second light-transmissive member 126 may contain a color converting material which is excitable by the light from the active layer 106 to generate light having a longer wavelength than that of the light from the active layer 106. Although in FIG. 15, the surface of the second light-transmissive member 126 is shown as being flat, this is merely an example. The surface of the second light-transmissive member 126 may not be flat.

In the semiconductor light-emitting device in this embodiment, the shapes and positions of the first light-transmissive member 124 and the wavelength converting member 130 may be modified in various manners. FIG. 17 through FIG. 24 are cross-sectional views provided for explaining shapes and positions of the first light-transmissive member 124 and the wavelength converting member 130.

The first light-transmissive member 124 merely needs to be located so as to be coupled with at least 50% of the amount of light going out of the second light extraction plane 122. Therefore, the first light-transmissive member 124 does not need to cover the entirety of the second light extraction plane 122, and merely needs to be formed to cover at least 50% of the area size of the second light extraction plane 122.

In the semiconductor light-emitting device shown in FIGS. 15A and 15B, the first light extraction plane 121 and a top surface of the first light-transmissive member 124 are located at the same level. In this case, the second light extraction plane 122 is entirely covered with the first light-transmissive member 124.

Figure 17:
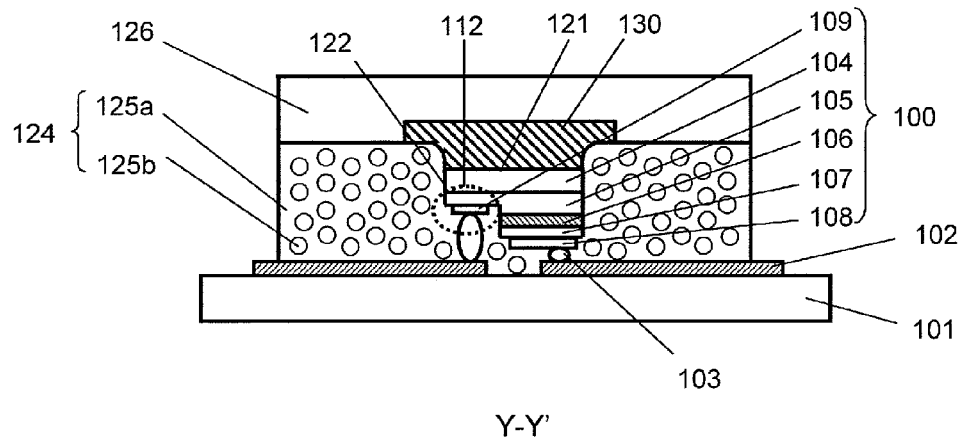
FIG. 17 is a cross-sectional view of a semiconductor light-emitting device in a second variation of Embodiment 3.

FIG. 17 shows an example in which the top surface of the first light-transmissive member 124 is at a higher level than the first light extraction plane 121. Even when the top surface of the first light-transmissive member 124 is located at a higher level than the first light extraction plane 121 due to a production variance, the entirety of the second light extraction plane 122 is covered with the first light-transmissive member 124. Therefore, the asymmetry of the light distribution can be sufficiently alleviated.

Figure 18:
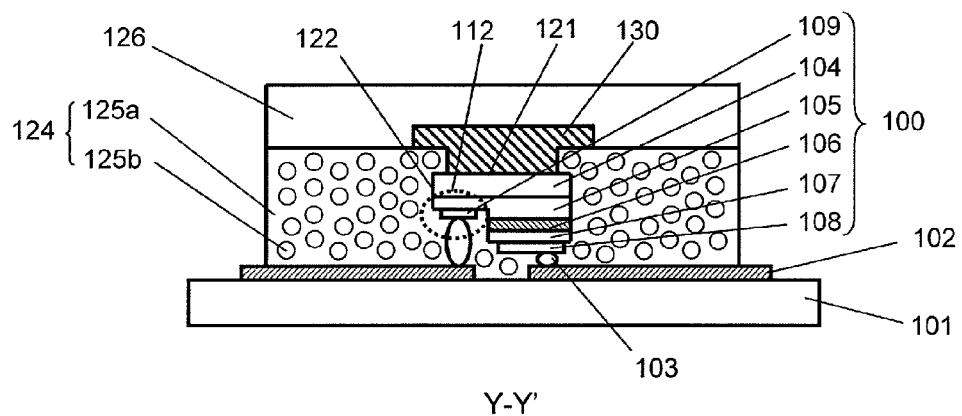
FIG. 18 is a cross-sectional view of a semiconductor light-emitting device in a third variation of Embodiment 3.

FIG. 18 shows an example in which the top surface of the first light-transmissive member 124 is at a higher level than the first light extraction plane 121, and a part of the first light-transmissive member 124 is in contact with a part of the first light extraction plane 121. Even in the case where a part of the first light-transmissive member 124 is in contact with a part of the first light extraction plane 121 due to a production variance, the entirety of the second light extraction plane 122 is covered with the first light-transmissive member 124. Therefore, the asymmetry of the light distribution can be sufficiently alleviated.

Figure 19:
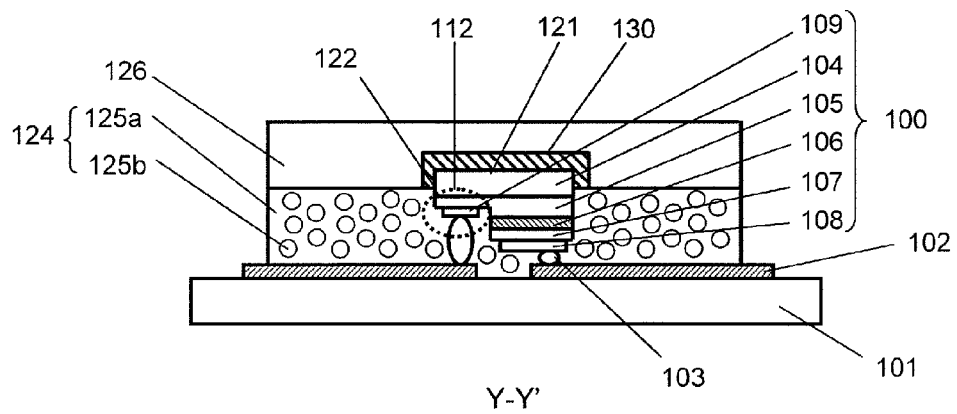
FIG. 19 is a cross-sectional view of a semiconductor light-emitting device in a fourth variation of Embodiment 3.

FIG. 19 shows an example in which the top surface of the first light-transmissive member 124 is at a lower level than the first light extraction plane 121. In this case, it is sufficient if at least 50% of the area size of the second light extraction plane 122 is covered with the first light-transmissive member 124. Even when the second light extraction plane 122 is not entirely covered due to a production variance, the asymmetry of the light emitting intensity and the asymmetry of the light emitting wavelength can be alleviated. The wavelength converting member 130 may be formed so as to cover a part of the second light extraction planes 122 and a part of the third light extraction planes 123 such that the second light extraction planes 122 and the third light extraction planes 123 are not in direct contact with the first light-transmissive member 124.

Figure 20:
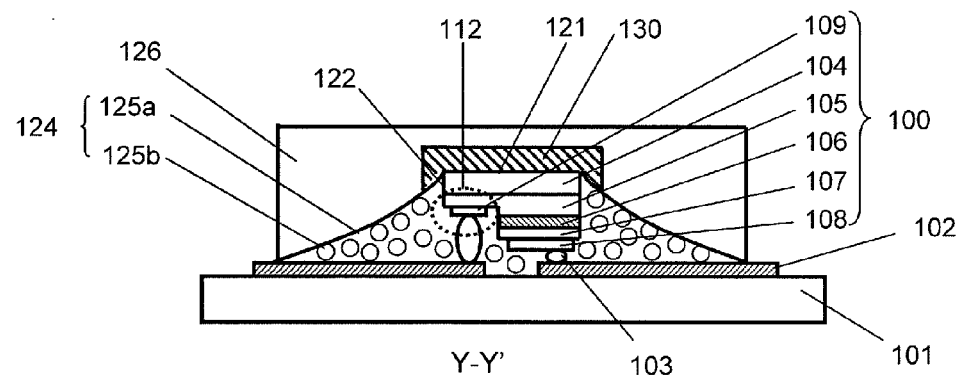
FIG. 20 is a cross-sectional view of a semiconductor light-emitting device in a fifth variation of Embodiment 3.

FIG. 20 shows an example in which the first light-transmissive member 124 has a thickness which gradually decreases as being away from the second light extraction plane 122. The thickness is in a direction perpendicular to the growth plane. The light is not scattered uniformly in the entirety of the first light-transmissive member 124, but the effect of scattering of the light is larger in an area closer to the second light extraction planes 122. Therefore, the number of particles in an area where the effect of scattering is large is increased and the number of particles in an area where the effect of scattering is small is decreased. Thus, the number of particles to be used can be decreased.

Figure 21:
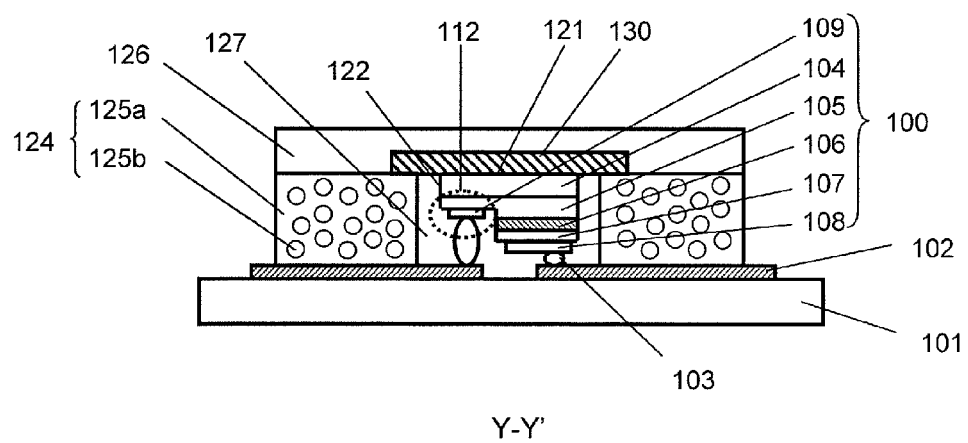
FIG. 21 is a cross-sectional view of a semiconductor light-emitting device in a sixth variation of Embodiment 3.

FIG. 21 shows an example in which the first light-transmissive member 124 is located away from the second light extraction planes 122. A third light-transmissive member 127 is located between the first light-transmissive member 124 and the second light extraction planes 122. The first light-transmissive member 124 covers the second light extraction planes 122 while the third light-transmissive member 127 is had therebetween. At least as seen in a direction perpendicular to the growth plane, the wavelength converting member 130 is formed so as to cover the first light extraction plane 121 and the third light-transmissive member 127. The first light-transmissive member 124 may be coupled with at least 50% of the amount of light going out of the second light extraction planes 122. The third light-transmissive member 127 may be formed of a material substantially the same as that of the second light-transmissive member 126. Alternatively, the third light-transmissive member 127 may be formed of a material having a refractive index which is between the refractive index of GaN and the refractive index of the first light-transmissive member 124.

Figure 22:
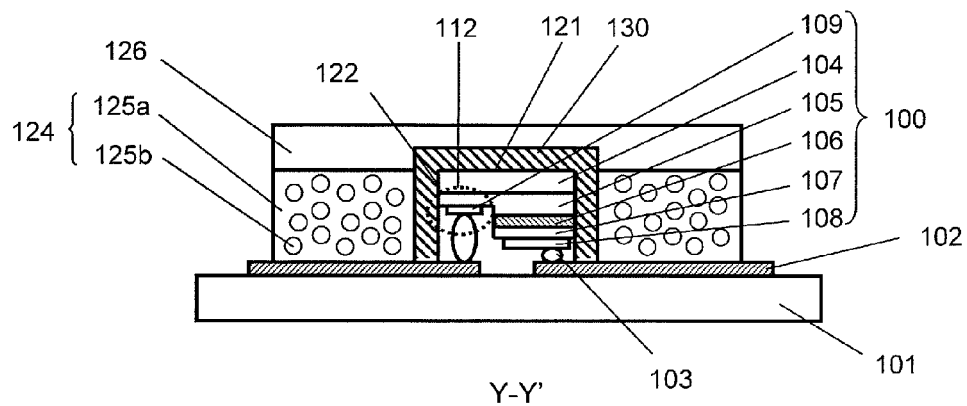
FIG. 22 is a cross-sectional view of a semiconductor light-emitting device in a seventh variation of Embodiment 3.

FIG. 22 shows an example in which the wavelength converting member 130 covers the first light extraction plane 121, the second light extraction planes 122 and the third light extraction planes 123. The first light-transmissive member 124 faces the second light extraction planed 122 while the wavelength converting member 130 is had therebetween, and covers the second light extraction planes 122. The wavelength spectrum formed by the wavelength converting member 130 is diffused by the particles 125b, and thus the anisotropy of the light emitting intensity and the anisotropy of the light emitting wavelength can be alleviated.

Figure 23:
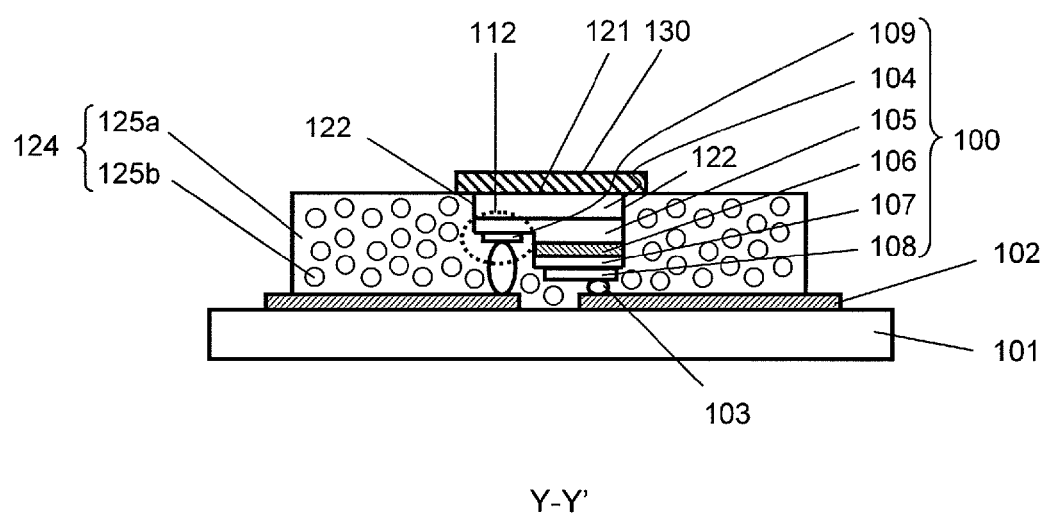
FIG. 23 is a cross-sectional view of a semiconductor light-emitting device in an eighth variation of Embodiment 3.

FIG. 23 shows an example in which the second light-transmissive member 126 is not used. In the case where the second light-transmissive member 126 is formed of an acrylic resin or a silicone resin, the resin becomes yellowish or brownish as a result of absorbing light from the active layer while being used for a long time. This may decrease the optical output of the semiconductor light-emitting device. The part covered with such a resin is made small, and thus the semiconductor light-emitting device can have an improved reliability for being used for a long time.

Figure 24A:
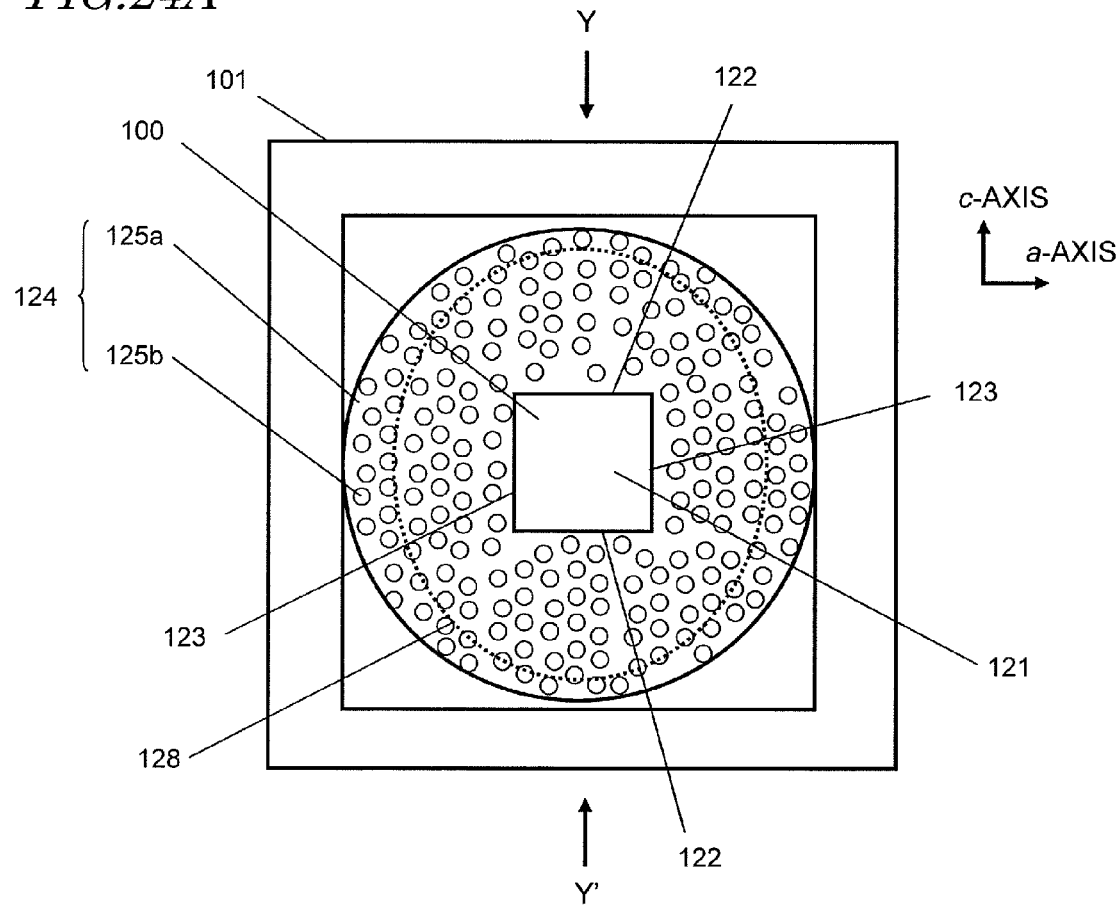
FIG. 24A is a schematic plan view showing a semiconductor light-emitting device in a ninth variation of Embodiment 3.
Figure 24B:
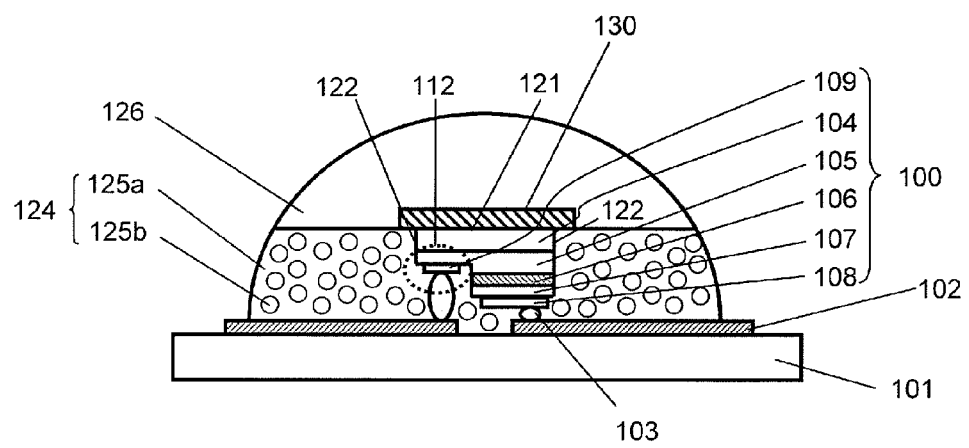
FIG. 24B is a cross-sectional view taken along line Y-Y' of FIG. 24A.

FIGS. 24A and 24B show an example in which the second light-transmissive member 126 is generally semi-spherical. Forming the second light-transmissive member 126 to be semi-spherical can suppress total reflection of the light directing outside from the second light-transmissive member 126. This improves the optical output of the semiconductor light-emitting device. The second light-transmissive member 126 may have a shape distorted from a semi-spherical shape.

Figure 25A:
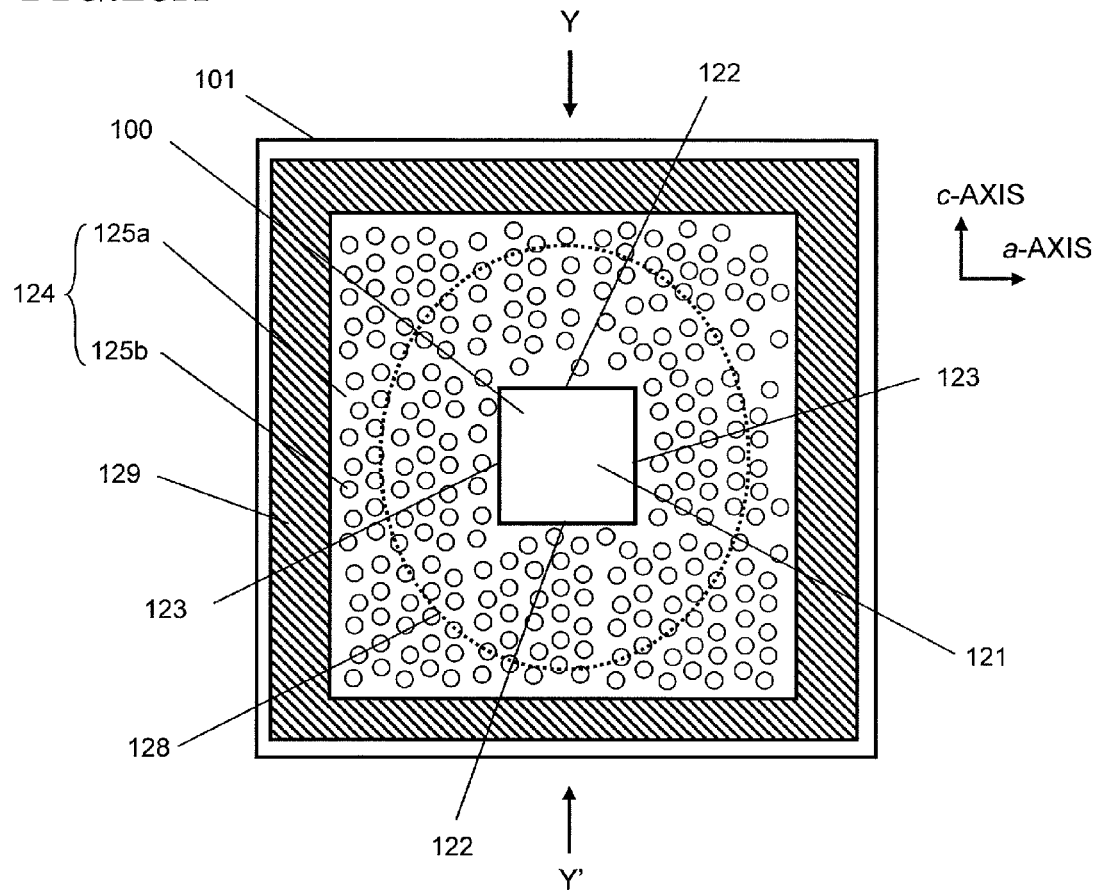
FIG. 25A is a schematic plan view showing a semiconductor light-emitting device in a tenth variation of Embodiment 3.
Figure 25B:
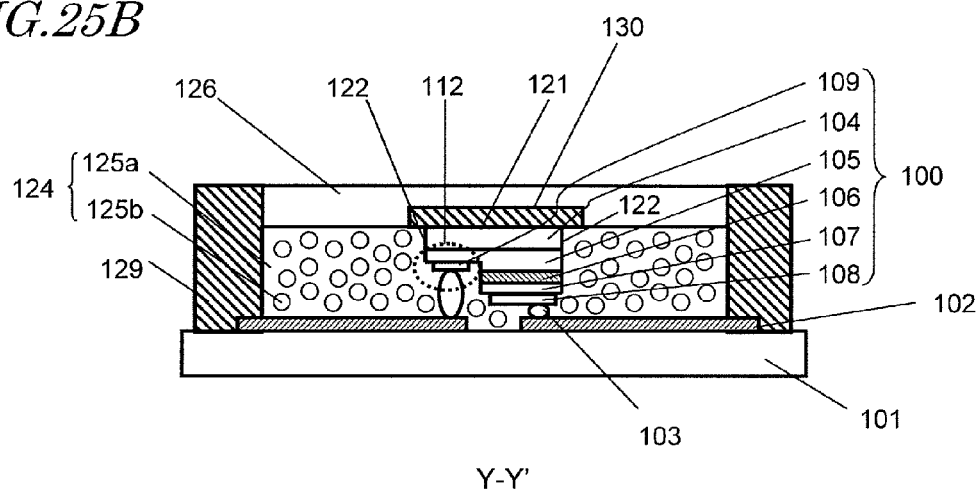
FIG. 25B is a cross-sectional view taken along line Y-Y' of FIG. 25A.

FIGS. 25A and 25B show an example in which a reflective member 129 is formed outside the first light-transmissive member 124. The reflective member 129 forms a cavity surrounding the semiconductor light-emitting chip 100. The reflective member 129 is also referred to as a reflector. The reflective member 129 may be formed of a metal material such as Al or Ag, a silicone resin containing at least 30% by weight of $TiO_2$ particles. The reflective member 129 plays a role of a cup for forming the first light-transmissive member 124. By putting a certain amount of pre-curing light-transmissive member containing the particles into the cup, the degree of covering the second light extraction planes 122 can be made controllable. This simplifies the production method.

So far, in this embodiment, the semiconductor light-emitting devices in which the growth plane of the active layer 106 is the m-plane have been described. Substantially the same structure is applicable to a semiconductor light-emitting device including an active layer having any other non-polar plane than the m-plane or any semi-polar plane as a growth plane. As described above, an active layer formed of a nitride semiconductor having a non-polar plane such as the m-plane or the a-plane, or a semi-polar plane such as, for example, the (20-21), (20-2-1), (10-1-3), (11-22), –r or (11-22) plane as a growth plane also has a polarization characteristic. Therefore, when the radiating light is observed from the active layer, a contour having an equal light intensity exhibits a shape close to an elliptical shape having the longer radius α in a direction perpendicular to the polarization direction and the shorter radius β in the polarization direction.

(Production Method)

Hereinafter, a method for producing a semiconductor light-emitting device according to this embodiment will be described with reference to FIGS. 15A and 15B.

First, on a main plane of the substrate 104 formed of n-type GaN and having the m-plane as the main plane, the n-type nitride semiconductor layer 105 is epitaxially grown by metal organic chemical vapor deposition (MOCVD). Specifically, silicon (Si), for example, is used as the n-type dopant. TMG (Ga(CH$_3$)$_3$) as a gallium source and ammonia (NH$_3$) as a nitrogen source are supplied. The n-type nitride semiconductor layer 105 formed of GaN and having a thickness of about 1 µm to 3 µm is formed at a growth temperature of about 900° C. or higher and about 1100° C. or lower. Herein, the substrate 104 is in a wafer state, and a plurality of light emitting structures, usable as semiconductor light-emitting devices, can be produced at the same time.

Next, the active layer 106 formed of a nitride semiconductor is grown on the n-type nitride semiconductor layer 105. The active layer 106 has an InGaN/GaN multiple quantum well (MQW) structure including, for example, well layers formed of In$_x$Ga$_{1-x}$N and each having a thickness of 15 nm and barrier layers formed of GaN and each having a thickness of 10 nm stacked alternately. For forming the well layers formed of In$_x$Ga$_{1-x}$N, the growth temperature may be decreased to about 700° C. to 800° C. such that In is incorporated into the growing well layers with certainty. The light emitting wavelength is selected in accordance with the use of the semiconductor light-emitting device, and the ratio x of In suitable to the wavelength is determined. For example, when the wavelength is 450 nm (blue), the ratio x of In is determined to be 0.25 to 0.27. When the wavelength is 520 nm (green), the ratio x of In is determined to be 0.40 to 0.42. When the wavelength is 630 nm (red), the ratio x of In is determined to be 0.56 to 0.58.

Next, the p-type nitride semiconductor layer 107 is epitaxially grown on the active layer 106. Specifically, Cp$_2$Mg (biscyclopentadienyl magnesium), for example, is used as the p-type impurity. TMG and NH$_3$ are supplied as materials. The p-type nitride semiconductor layer 107 formed of p-type GaN and having a thickness of about 50 nm to 500 nm is formed on the active layer 106 at a growth temperature of about 900° C. or higher and about 1100° C. or lower. A p-type AlGaN layer having a thickness of about 15 nm to 30 nm may be contained in the p-type nitride semiconductor layer 107. Provision of the p-type AlGaN layer can suppress overflow of electrons as carriers. An undoped GaN layer may be provided between the active layer 106 and the p-type nitride semiconductor layer 107.

Next, in order to activate Mg used for doping the p-type nitride semiconductor layer 107, heat treatment is performed at a temperature of about 800° C. to 900° C. for about 20 minutes.

Next, the semiconductor stacking structure formed up to the p-type nitride semiconductor layer 107 is selectively etched by lithography and dry etching using chlorine (Cl$_2$)-based gas. This removes a part of each of the p-type nitride semiconductor layer 107, the active layer 106 and the n-type nitride semiconductor layer 105 to form a recessed part 112 and thus to expose a part of the n-type nitride semiconductor layer 105.

Next, the n-side electrode 109 is selectively formed so as to be in contact with the exposed part of the n-type nitride semiconductor layer 105. Herein, as the n-side electrode 109, a stacking film (Ti/Pt layer) of titanium (Ti) and platinum (Pt), for example, is formed.

Next, the p-side electrode 108 is selectively formed so as to be in contact with the p-type nitride semiconductor layer 107. As the p-side electrode 108, a stacking film (Pd/Pt layer) of palladium (Pd) and platinum (Pt) is formed. Then, heat treatment is performed to make an alloy between the Ti/Pt layer and the n-type nitride semiconductor layer 105, and between the Pd/Pt layer and the p-type nitride semiconductor layer 107. There is no specific limitation on the order of forming the n-type electrode 109 and the p-type electrode 108.

Next, a surface of the substrate 104 faced to the surface in contact with the n-type nitride semiconductor layer 105 (i.e., rear surface of the substrate 104) is polished to thin the substrate 104 by a prescribed amount.

The plurality of semiconductor light-emitting devices thus produced are divided into individual semiconductor light-emitting chips 100. The dividing step may be performed by any of several methods including laser dicing, cleaving. Each resultant individual semiconductor light-emitting chip 100 is mounted on a mounting surface of the mounting substrate 101. Herein, mounting of a flip chip structure will be described.

First, the mounting substrate 101 is prepared. As described above, the main material of the mounting substrate 101 may be an insulating material such as alumina (aluminum oxide), aluminum nitride (AlN) or glass epoxy; a metal material such as aluminum (Al), copper (Cu) or tungsten (W); a semiconductor material such as silicon (Si) or germanium (Ge); or a composite material thereof. The material of the wiring electrodes 102 may be a metal material such as aluminum (Al), silver (Ag), gold (Au) or copper (Cu).

A metal film for forming the wiring electrodes is formed on the surface of the mounting substrate 101 by a film formation method such as sputtering or plating. Next, a desired resist pattern is formed on the formed metal film by lithography. Then, the resist pattern is transferred to the metal film by dry etching or wet etching to form the wiring electrodes 102 of the desired electrode pattern.

Next, the plurality of bumps 103 are formed at prescribed positions on the wiring electrodes 102. For example, the bumps 103 can be formed of gold (Au). A bump bonder is usable to form the bumps 103 having a diameter of about 40 µm to 80 µm. The bumps 103 may be formed by plating instead of use of the bump bonder. To the wiring electrodes 102 having the plurality of bumps 103 formed thereon, the electrode-formed surface of the semiconductor light-emitting chip 100 is connected by, for example, an ultrasonic joining method.

Next, the first light-transmissive member 124 is formed. The particles 125b are incorporated into a silicon resin by use of a stirrer to prepare a particle-containing light-transmissive member. The stirrer may have a vacuum defoaming function. Next, the first light-transmissive member 124 is formed around the semiconductor light-emitting chip 100 by use of a dispenser. In this step, the degree at which the second light extraction planes 122 and the third light extraction planes 123 are covered with the first light-transmissive member 124 can be controlled by the amount of dispensing. In the case of the package shown in FIGS. 25A and 15B including the cavity 129, the amount of the first light-transmissive member 124 to be put into the cavity may be controlled in accordance with the volume of the cavity 129. Therefore, the covering degree is made highly controllable.

Next, the wavelength member 130 is formed. In the case where the wavelength member 130 is a solid such as a sintered body, the wavelength member 130 may be bonded to the surface of the semiconductor light-emitting chip 100 by use of a chip bonder device. In the case where the wavelength member is a liquid member formed of a fluorescent member and a resin, the wavelength member 130 can be formed by a technique such as potting, printing or molding.

Next, the second light-transmissive member 126 is formed. The second light-transmissive member 126 may be formed by a technique such as potting, printing or molding.

In this manner, the semiconductor light-emitting device in this embodiment is obtained.

Embodiment 4

Hereinafter, with reference to FIGS. 26A through 26F, a semiconductor light-emitting device in Embodiment 4 according to the present disclosure will be described. In order to avoid repetition of the same explanation, in FIGS. 26A through 26F, identical elements to those in FIGS. 15A and 15B bear identical reference signs thereto and descriptions thereof will be omitted. Herein, differences of Embodiment 4 from Embodiment 3 will be described.

Figure 26A:
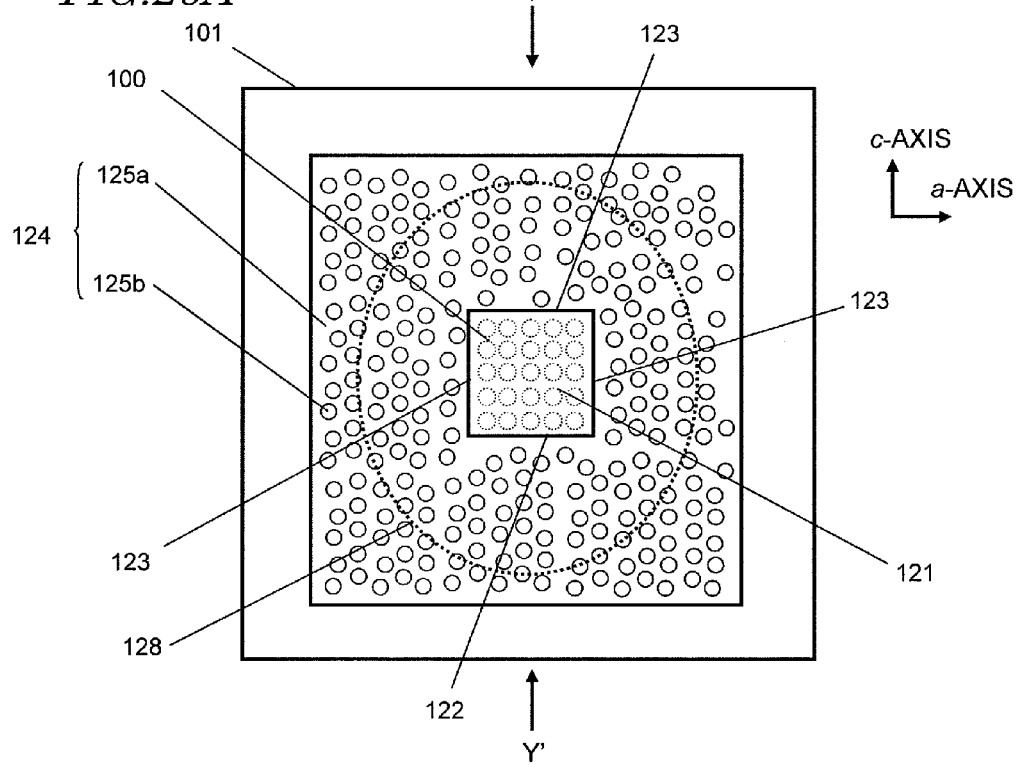
FIG. 26A is a schematic plan view showing a semiconductor light-emitting device in Embodiment 4.
Figure 26B:
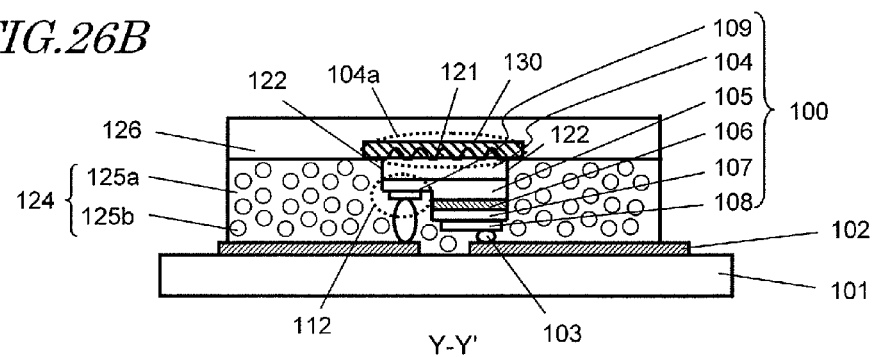
FIG. 26B is a cross-sectional view taken along line Y-Y' of FIG. 26A.

As shown in FIGS. 26A and 26B, in a semiconductor light-emitting device according to Embodiment 4, unlike in Embodiment 3, the first light extraction plane 121 has a plurality of projection and recess portions 104a. In the example of FIG. 26B, each of projection portions of the projection and recess portions 104a has a generally semi-spherical cross-section in a direction perpendicular to the substrate surface. The projection and recess portions 104a at the rear surface of the substrate 104 can be produced by thinning the substrate 104, forming a resist pattern including a plurality of spherical shapes by lithography, and then processing the rear surface of the substrate 104 by etchback using a chorine-based etchant.

In the semiconductor light-emitting device in this embodiment, owing to the plurality of projection and recess portions 104a formed at the first light extraction plane 121, the light extracting efficiency from the first light extraction plane 121 is improved. Thus, the optical output of the semiconductor light-emitting device is improved. In addition, since the light is diffused by the plurality of projection and recess portions 104a, the anisotropy of the light emitting intensity and the anisotropy of the light emitting wavelength are alleviated.

Figure 26C:
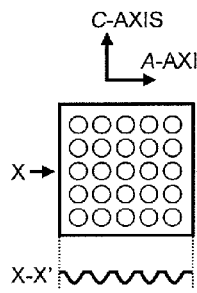
FIG. 26C is a cross-sectional view of a semiconductor light-emitting device in a first variation of Embodiment 4.

FIGS. 26C through 26F each show a variation of the projection and recess portions 104a. As shown in FIG. 26C, the recess portions may have a generally semi-spherical cross-section instead of the projection portions. In this case, the projection and recess portions 104a diffuse the light, and the anisotropy of the light emitting intensity and the anisotropy of the light emitting wavelength are also alleviated.

Figure 26D:
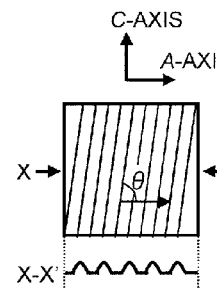
FIG. 26D is a cross-sectional view of a semiconductor light-emitting device in a second variation of Embodiment 4.
Figure 26E:
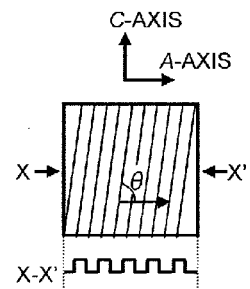
FIG. 26E is a cross-sectional view of a semiconductor light-emitting device in a third variation of Embodiment 4.
Figure 26F:
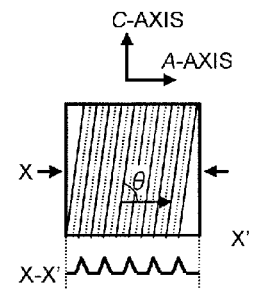
FIG. 26F is a cross-sectional view of a semiconductor light-emitting device in a fourth variation of Embodiment 4.

As shown in FIGS. 26D, 26E and 26F, the projection and recess portions 104a may be striped as seen in a direction perpendicular to the first light extraction plane 121. In FIG. 26D, the projection portions each have a generally semi-circular cross-section. In FIG. 26E, the projection portions each have a square cross-section. In FIG. 26F, the projection portions each have a triangular cross-section. The stripes extend in a direction inclining by angle θ with respect to the polarization direction of the active layer 106 formed of a nitride semiconductor.

The light emitting intensity of the light radiating from the first light extraction plane 121 heavily depends on the angle θ. When the angle θ is not less than 0° and not more than 45°, the anisotropy of the light emitting intensity is alleviated.

In this embodiment, only the flip chip structure is described. Substantially the same effects are provided with the wire bonding structure. Embodiments 2 and 3, and variations thereof may be optionally combined with other embodiments and variations thereof.

Embodiments 1 and 2 and the variations thereof may be optionally combined with Embodiments 3 and 4 and the variations thereof.

Examples

Prior to the examples, the following evaluations described in each of the embodiments will be explained quantitatively:

(1) evaluation on the light distribution characteristic of emitting light, (2) evaluation on the influence exerted on the light distribution characteristic by the area size of the second light extraction planes, and (3) evaluation on the influence exerted on the optical characteristic by the projection and recess portions at the light extraction plane.

(1) Evaluation on the Light Distribution Characteristic of Emitting Light in an m-Plane Nitride Semiconductor Light-Emitting Chip First, on a wafer-state n-type GaN substrate having the m-plane as a main plane, an n-type nitride semiconductor layer formed of n-type GaN and having a thickness of 2 μm, an active layer having a three-cycle quantum well structure having quantum well layers formed of InGaN and barrier layers formed of GaN, and a p-type nitride semiconductor layer formed of p-type GaN and having a thickness of 0.5 μm were formed. In order to produce semiconductor light-emitting chips for emitting light of different wavelengths, the amount of In and the crystal growth temperature were appropriately varied. Thus, a plurality of chips different in the ratio of In in the quantum well layers formed of InGaN were produced.

As an n-side electrode, a Ti/Pt layer was formed. As a p-side electrode, a Pd/Pt layer was formed. A rear surface of the n-type GaN substrate having the m-plane as the main plane was polished until the thickness of the n-type GaN substrate became 150 μm. A groove having a depth of several micrometers from the surface of the wafer was formed in the c-axis direction [0001] and the a-axis direction [11-20] of the wafer with a diamond pen. Then, the wafer was divided into small pieces each having a side of 350 μm by breaking.

The semiconductor light-emitting chip 100 thus produced was flip-chip-mounted on the mounting substrate 101 formed of alumina and having lines on a top surface thereof. Thus, the semiconductor light-emitting device shown in FIG. 3 was produced. No sealing section was formed on the surface of the semiconductor light-emitting device such that the light distribution characteristic of the radiating light from the semiconductor light-emitting device would be paid attention to.

The light distribution characteristic of the semiconductor light-emitting device thus produced was measured with OL700-30 LED GONIOMETER of Optoronic Laboratories. The light distribution characteristic in the a-axis direction and the light distribution characteristic in the c-axis direction were measured by condition A (in which the distance from the tip of the LED to a measuring device 118 is 316 mm) specified in CIE127 published by Commission Internationale de l'Eclairage (CIE).

Figure 27A:
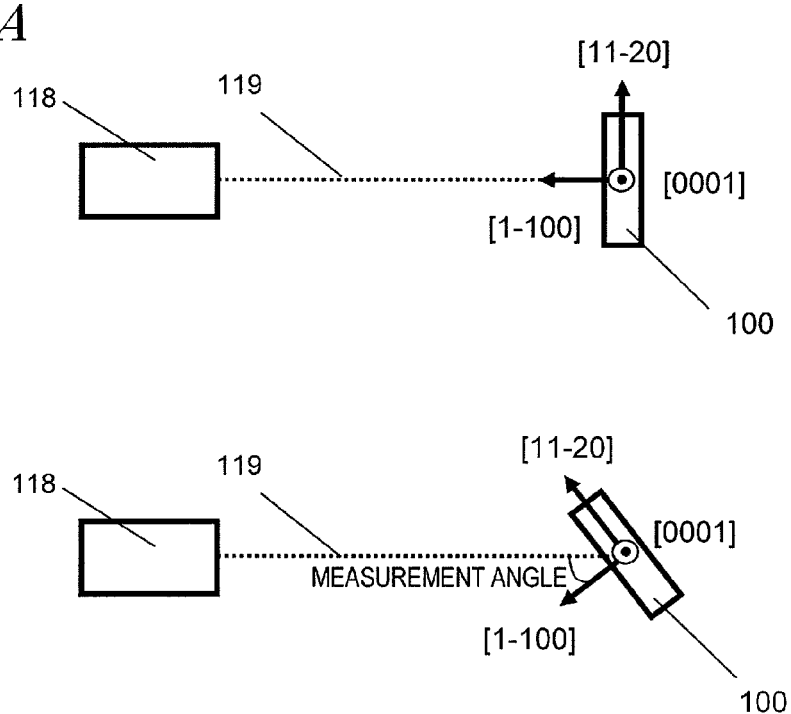
FIG. 27A is a schematic view showing a measuring system of a light distribution characteristic in an the axis direction.
Figure 27B:
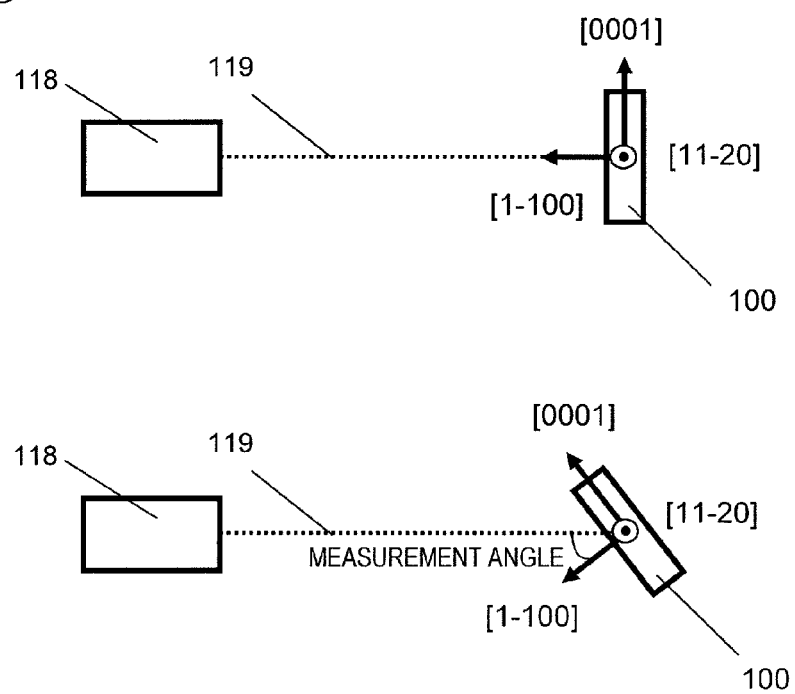
FIG. 27B is a schematic view showing a measuring system of a light distribution characteristic in the c-axis direction.

FIGS. 27A and 27B each schematically show a measuring system for measuring the light distribution characteristic.

In the light distribution characteristic in the a-axis direction shown in FIG. 27A, the angle formed between the m-axis direction [1-100], which is the normal direction to the m-plane of the active layer of the semiconductor light-emitting chip 100, and a measuring line 119 connecting the measuring device 118 with the semiconductor light-emitting chip 100 was set as the measurement angle. The luminous intensity was measured while the semiconductor light-emitting chip 100 was rotated around the t-axis of the semiconductor light-emitting chip 100 as the center axis. In other words, the luminous intensity was measured using a direction perpendicular to the polarization direction of the active layer as the center axis.

In the light distribution characteristic in the a-axis direction shown in FIG. 27B, the angle formed between the m-axis direction [1-100], which is the normal direction to the m-plane of the active layer of the semiconductor light-emitting chip 100, and the measuring line 119 connecting the measuring device 118 and the semiconductor light-emitting chip 100 was set as the measurement angle. The luminous intensity was measured while the semiconductor light-emitting chip 100 was rotated around the a-axis of the semiconductor light-emitting chip 100 as the center axis. Namely, the luminous intensity was measured using the polarization direction of the active layer as the center axis. Herein, a range of angles in which luminous intensity is 0.5 is referred to as a radiation angle where the luminous intensity in the m-axis direction [1-100] of the light distribution characteristic is 1. In order to numerize the asymmetry between the light distribution characteristic in the a-axis direction and the light distribution characteristic in the c-axis direction, the asymmetry degree, the maximum asymmetry degree and the average asymmetry degree are defined. The asymmetry degree is a value obtained by normalizing a difference between the luminous intensity in the a-axis direction and the luminous intensity in the c-axis direction at the same angle from the normal direction by use of the luminous intensity in the normal direction [1-100] with respect to the m-plane, namely, by use of the luminous intensity at 0°. The asymmetry degree is defined at each angle from −90° to +90°. The maximum asymmetry degree is the maximum value of the asymmetry degree in the range of −90° to +90°. The average asymmetry degree is a value obtained by averaging the asymmetry degrees in the range of −90° to +90°.

Figure 28:
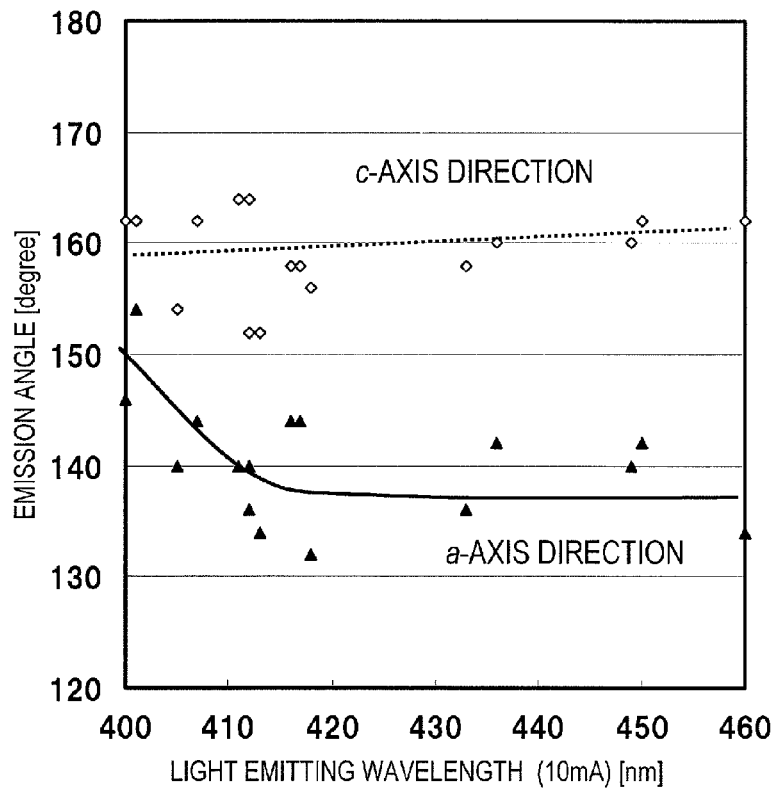
FIG. 28 is a graph showing the relationship between the radiation angle and the light emitting wavelength in each of the a-axis direction and the c-axis direction of a semiconductor light-emitting chip 100.

FIG. 28 shows the relationship between the radiation angle in each of the a-axis direction and the c-axis direction and the light emitting wavelength of the semiconductor light-emitting chip 100. The electric current injected to the semiconductor light-emitting chip 100 is 10 mA. As can be seen from FIG. 28, the radiation angle in the c-axis direction is generally constant at about 160°. The radiation angle in the a-axis direction is generally constant at a light emitting wavelength of 420 nm or longer at about 140°. Namely, the semiconductor light-emitting chip 100 having the active layer which is the m-plane has a light distribution characteristic expanding in the c-axis direction. A contour having a luminous intensity of 0.5 has a shape similar to an elliptical shape having a longer axis in the c-axis direction and a shorter axis in the a-axis direction. Where the radiation angle in the c-axis direction is 160° and the radiation angle in the a-axis direction is 140°, the longer axis (c-axis direction):shorter axis (a-axis direction) =2:1.

(2) Evaluation on the Influence Exerted on the Light Distribution Characteristic by the Second Light Extraction Planes First, on a wafer-state n-type GaN substrate having the m-plane as a main plane, an n-type nitride semiconductor layer formed of n-type GaN and having a thickness of 2 µm, an active layer having a three-cycle quantum well structure having quantum well layers formed of InGaN and barrier layers formed of GaN, and a p-type nitride semiconductor layer formed of p-type GaN and having a thickness of 0.5 µm were formed. In order to produce semiconductor light-emitting chips for emitting light of different wavelengths, the amount of In and the crystal growth temperature were appropriately varied. Thus, a plurality of chips different in the ratio of In in the quantum well layers formed of InGaN were produced.

As an n-side electrode, a Ti/Pt layer was formed. As a p-side electrode, a Pd/Pt layer was formed. A rear surface of the n-type GaN substrate having the m-plane as the main plane was polished until a prescribed thickness was obtained. A groove having a depth of several micrometers from the surface of the wafer was formed in the c-axis direction [0001] and the a-axis direction [11-20] of the wafer by use of a diamond pen. Then, the wafer was divided into small pieces having a side of 350 µm by breaking.

The semiconductor light-emitting chip 100 thus produced was flip-chip-mounted on the mounting substrate 101 formed of alumina and having lines on a top surface thereof. Thus, the semiconductor light-emitting device shown in FIG. 3 was produced. No sealing section was formed on the surface of the semiconductor light-emitting device such that the light distribution characteristic of the radiating light from the semiconductor light-emitting device would be paid attention to.

Table 1 is a list of the substrate thickness of the semiconductor light-emitting chip 100 and the size of one side of the semiconductor light-emitting chip 100. Five types of samples which are different in the ratio of the area size of the second light extraction plane with respect to the area size of the first light extraction plane were prepared. A light emitting peak wavelength of these semiconductor light-emitting chips was 405 nm to 410 nm at a current value of 10 mA.

TABLE 1

| Sample No. | Size of one side [µm] | Substrate thickness [µm] | Area size of 1st light extraction plane 121 [mm$^2$] | Area size of 2nd light extraction plane 122 [mm$^2$] | Ratio of area size of 2nd light extraction plane 122/area size of 1st light extraction plane 122 [%] |
|---|---|---|---|---|---|
| 1 | 350 | 100 | 0.1225 | 0.0728 | 59.43 |
| 2 | 450 | 50  | 0.2025 | 0.0486 | 23.56 |
| 3 | 450 | 100 | 0.2025 | 0.0936 | 46.22 |
| 4 | 450 | 150 | 0.2025 | 0.1386 | 68.44 |
| 5 | 950 | 150 | 0.9025 | 0.2926 | 32.42 |

Figure 29:
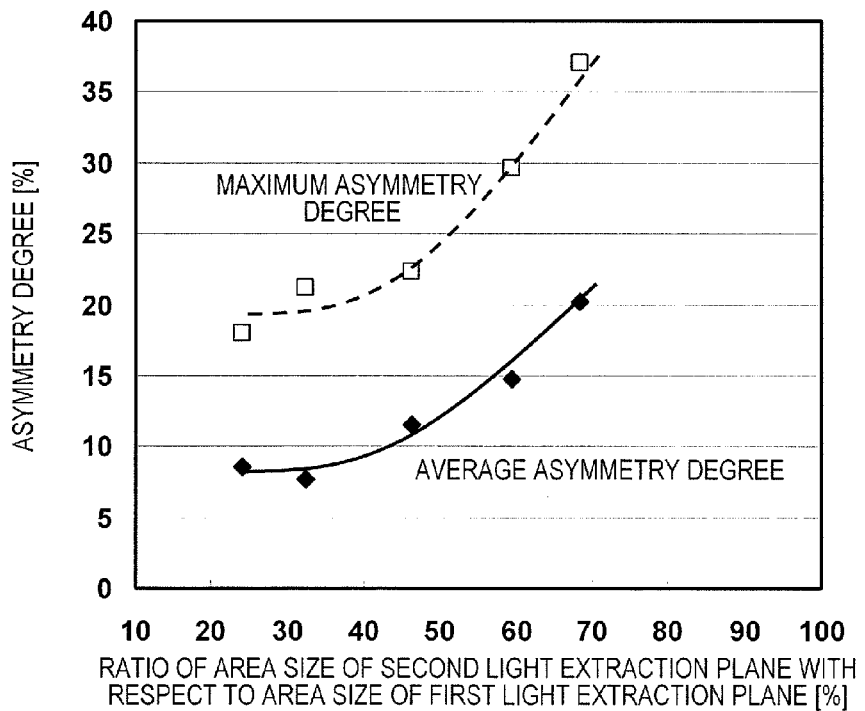
FIG. 29 is a graph showing the relationship between the ratio of the area size of a second light extraction plane 122 with respect to the area size of a first light extraction plane 121 and each of the maximum asymmetry degree and the average asymmetry degree regarding the five types of samples.

FIG. 29 shows the relationship between the ratio of the area size of the second light extraction plane with respect to the area size of the first light extraction plane, the maximum asymmetry degree and the average asymmetry degree regarding the five types of samples. As the ratio of the area size of the second light extraction plane with respect to the area size of the first light extraction plane is higher, both of the maximum asymmetry degree and the average asymmetry degree are larger. Especially when the ratio of the area size of the second light extraction plane with respect to the area size of the first light extraction plane is 40% or higher, the asymmetry degree is deteriorated. Therefore, the asymmetry degree can be improved by providing the first light-transmissive member 124. Table 2 shows values of the ratio of the area size of the second light extraction plane with respect to the area size of the first light extraction plane, the maximum asymmetry degree and the average asymmetry degree of the five types of samples.

TABLE 2

| Area size ratio [%] | Maximum asymmetry degree [%] | Average asymmetry degree [%] |
|---|---|---|
| 59.43 | 29.6 | 14.7 |
| 23.56 | 17.9 | 8.6 |
| 46.22 | 22.2 | 11.5 |
| 68.44 | 37.1 | 20.2 |
| 32.42 | 21.2 | 7.6 |

(3) Evaluation on the Influence Exerted on the Polarization by the Projection and Recess Portions Formed at the Light Extraction Plane As shown in FIG. 26A, the projection and recess portions may be occasionally formed at the light extraction plane of the chip in order to improve the light extracting efficiency from the nitride-based semiconductor light-emitting chip. Herein, regarding a semiconductor light-emitting device having striped projection and recess portions provided at the light extraction plane, the influence exerted on the polarization degree by an angle made by the direction in which the stripes extend and the a-axis direction of the light emitting layer was examined. Semiconductor light-emitting chips each including a light emitting layer formed of a nitride semiconductor having the m-plane as a growth plane were produced by a method substantially the same as that described later in Example 1.

Figure 30:
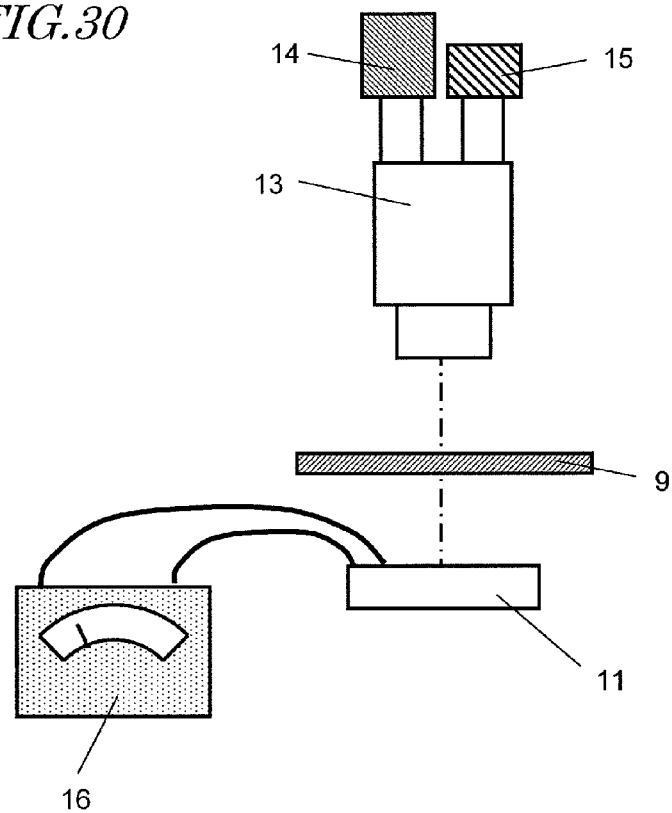
FIG. 30 is a schematic view showing a measuring system for measuring the polarization degree.
Figure 31:
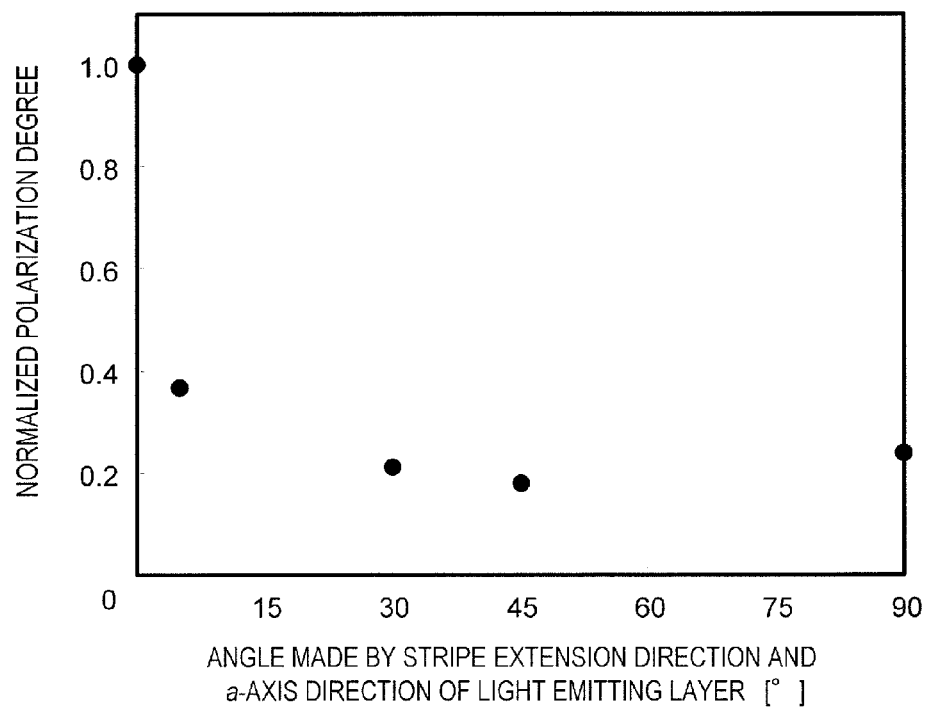
FIG. 31 shows the normalized polarization degree of semiconductor light-emitting devices.
Figure 32A:
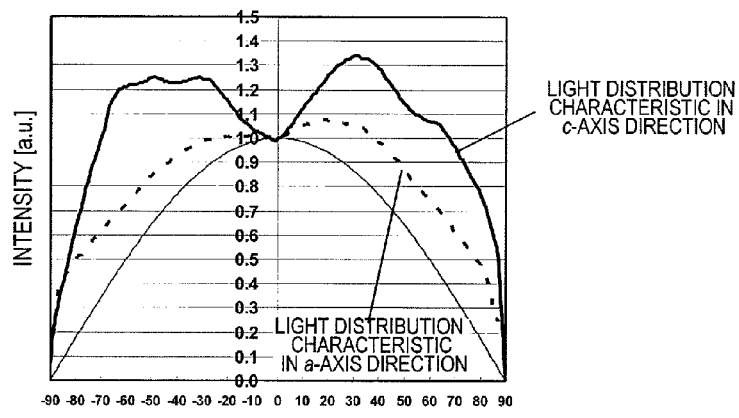
FIGS. 32A through 32E respectively show measurement results of the light distribution characteristics in the a-axis direction and the c-axis direction of semiconductor light-emitting elements which have titanium oxide ($TiO_2$) particle concentrations of 0.0% by weight, 0.2% by weight, 0.4% by weight, 0.7% by weight and 15.0% by weight.
Figure 32B:
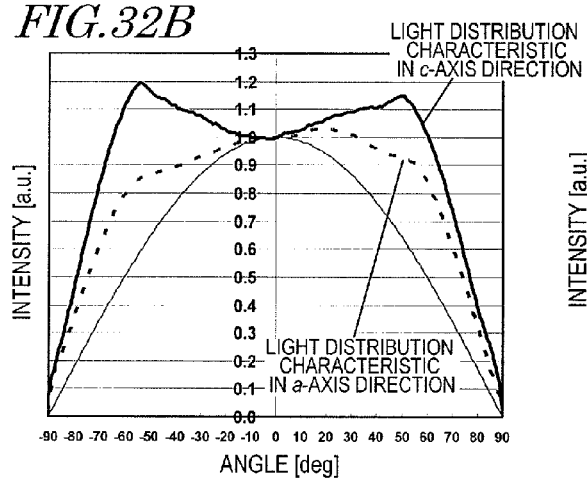
Figure 32C:
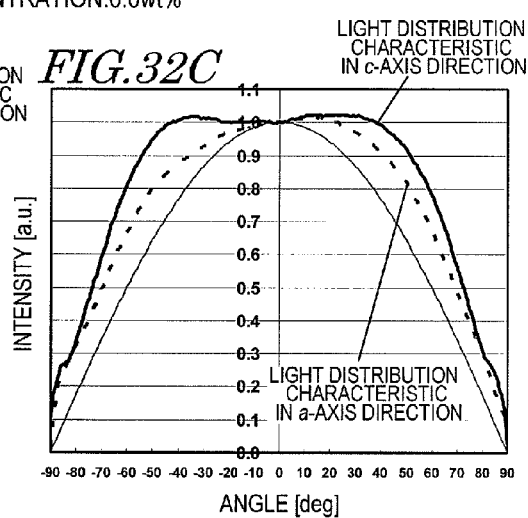
Figure 32D:
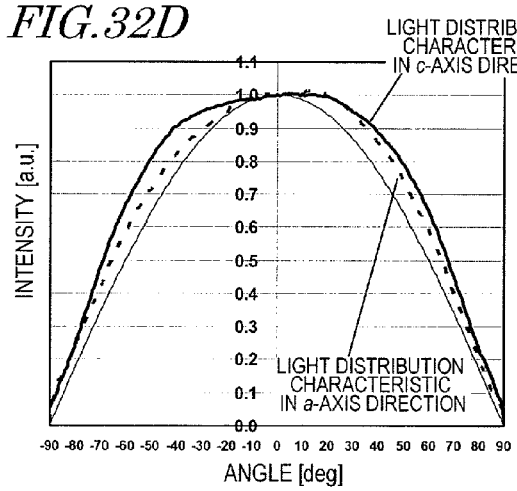
Figure 32E:
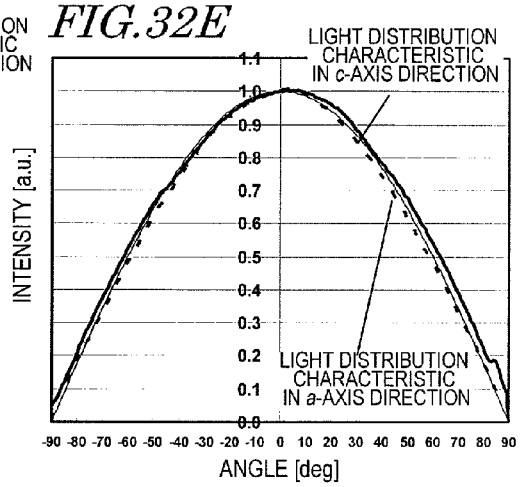

Each of the semiconductor light-emitting chips has a square shape in which each side thereof is 350 µm long. The thickness of a substrate thereof is 100 µm. At a surface (rear surface of the substrate) of the semiconductor light-emitting chip, striped projection and recess portions are formed. As shown in FIG. 26D, the striped projection and recess portions have a generally isosceles triangular cross-section. The projection portions are located at an interval of 8 µm and each have a height of 2.5 µm. Angle θ made by the direction in which the stripes extend and the direction of the electric field of the polarized light (a-axis direction of the light emitting layer) was varied to 0°, 5°, 0°, 45° and 90°. FIG. 30 schematically shows a measuring system for measuring the polarization degree. Each of semiconductor light-emitting devices 11 formed of nitride semiconductors, which are targets of measurement, is caused to emit light by a power source 16. It is confirmed by a stereoscopic microscope 13 that the semiconductor light-emitting device 11 has emit light. The stereoscopic microscope 13 has two ports. To one port, a silicon photodetector 14 is attached. To the other port, a CCD camera 15 is attached. A polarizing plate 9 is inserted between the semiconductor light-emitting device 11 and the stereoscopic microscope 13. The polarizing plate 9 is rotated, so that the maximum value and the minimum value of the light emitting intensity are measured by the silicon photodetector 14. FIG. 31 shows the normalized polarization degree of light from each of these semiconductor light-emitting devices. The normalized polarization degree refers to a value normalized with the value when the angle θ is 0° being 1.0. According to the results shown in FIG. 31, the polarization degree is decreased when the angle θ is 5° or higher. Therefore, for realizing a semiconductor light-emitting device having the polarization degree maintained, the angle θ may be not less than 0° and not more than less than 5°. Owing to such an arrangement, the decrease in the polarization degree can be suppressed. Alternatively, the angle θ may be approximately 0°. For realizing a semiconductor light-emitting device having the polarization degree decreased, the angle θ may be not less than 5° and not more than 90°. Table 3 shows the angle made by the direction in which the stripes extend and the a-axis direction of the light emitting layer, and the normalized polarization degree.

TABLE 3

| Direction of extension | Normalized polarization degree |
| --- | --- |
| 0° | 1 |
| 5° | 0.38 |
| 30° | 0.21 |
| 45° | 0.19 |
| 90° | 0.22 |

Hereinafter, results of evaluation mainly on the light distribution characteristics of the semiconductor light-emitting devices in Embodiments 1 and 2 will be described by way of Examples 1 through 6 and Comparative example 1.

Example 1

Hereinafter, a semiconductor light-emitting device in Example 1 will be described with reference to FIG. 11. First, an overview of a method for producing the semiconductor light-emitting chip 100 included in the semiconductor light-emitting device in Example 1 will be described.

First, on a wafer-state n-type GaN substrate having the m-plane as a main plane, an n-type nitride semiconductor layer formed of n-type GaN and having a thickness of 2 µm, an active layer having a three-cycle quantum well structure having quantum well layers formed of InGaN and barrier layers formed of GaN, and a p-type nitride semiconductor layer formed of p-type GaN and having a thickness of 0.5 µm were formed by, for example, a MOCVD method.

As an n-side electrode, a Ti/Al layer was formed. As a p-side electrode, an Ag layer was formed. Then, a rear surface of the n-type GaN substrate was polished to provide a thickness of 100 µm.

Next, in the wafer having the light emitting structure formed thereon, a groove having a depth of about several tens of micrometers from the surface thereof was formed in the c-axis direction [0001] and the a-axis direction [11-20] of the wafer by use of laser. Then, the wafer was broken to obtain the semiconductor light-emitting chips 100 formed of an m-plane GaN-based semiconductor and having a side of 450 µm. In this structure, the ratio of the area size of the second light extraction plane 122 to the area size of the first light extraction plane 121 is 44%.

Next, the semiconductor light-emitting chips 100 were flip-chip-mounted on the mounting substrate 101 formed of AlN. Thus, a plurality of semiconductor light-emitting devices were produced. The mounting substrate 101 formed of AlN has a thickness of about 0.7 mm. On a surface of the mounting substrate 101, an electrode 102 formed of silver (Ag) and having a thickness of about 4 µm is formed.

In this state, the light emitting wavelength at an operating current of 10 mA was measured. The result was 445 nm. In this state, the polarization degree at an operating current of 5 mA was measured. The polarization degree was in the range of 0.774 to 0.815.

Next, titanium oxide (TiO$_2$) STT-30EHJ (particle diameter: 30 to 50 nm) produced by Titan Kokyo, Ltd. was mixed with silicone KER-2500 produced by Shin-Etsu Chemical Co., Ltd. to prepare a light-transmissive member containing particles. The particle-containing light-transmissive member was formed only on side surfaces of the semiconductor light-emitting chip 100 with a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. The particle concentration of the particle-containing light-transmissive member was varied to 0.0% by weight, 0.2% by weight, 0.4% by weight, 0.7% by weight, 1.0% by weight, 3.0% by weight, 10.0% by weight, and 15.0% by weight to fabricate semiconductor light-emitting devices corresponding to the device shown in FIG. 11 in Embodiment 1. The density of silicone is about 1 g/cm$^3$, and the density of TiO$_2$ is about 4.26 g/cm$^3$. Therefore, a value obtained by dividing the value of percent by weight with 4.26 corresponds to the value of percent by volume.

FIGS. 32A through 32E respectively show measurement results of the light distribution characteristics in the a-axis direction and the c-axis direction of the semiconductor light-emitting elements which have titanium oxide ($TiO_2$) particle concentrations of 0.0% by weight, 0.2% by weight, 0.4% by weight, 0.7% by weight and 15.0% by weight. In the figures, the thick dashed line represents the light distribution characteristic in the a-axis direction, the thick solid line represents the light distribution characteristic in the c-axis direction, and the thin solid line represents the shape of lambertian. When the particle concentration is 0.0% by weight, peaks of the light distribution characteristic in the c-axis direction are observed at about ±45° to ±75°. The light distribution characteristic in the a-axis direction has a shape relatively close to the shape of lambertian. As can be seen, in the semiconductor light-emitting device including the active layer having the m-plane as the main plane, the light distribution characteristic in the a-axis direction exhibits totally different shapes from the distribution characteristic in the c-axis direction. It is seen that when the particle concentration is increased, the light distribution characteristic in the a-axis direction substantially keeps having the shape of lambertian, whereas the shape of the light distribution characteristic in the c-axis direction is changed to be close to the shape of the light distribution characteristic in the a-axis direction.

Figure 33:
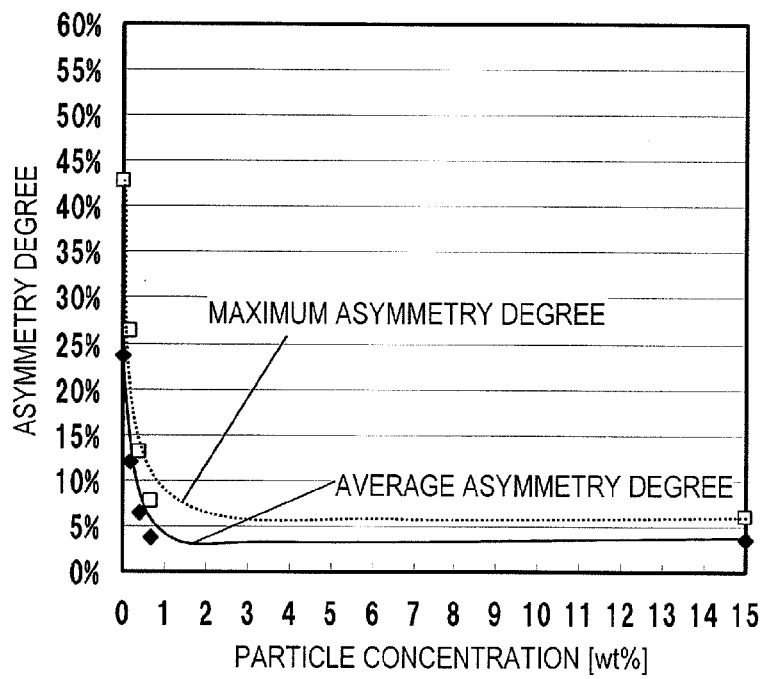
FIG. 33 is a graph showing the numerized symmetry between the light distribution characteristics in the a-axis direction and the light distribution characteristics in the c-axis direction.

FIG. 33 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. The asymmetry degree is a value obtained by normalizing a difference between the luminous intensity in the a-axis direction and the luminous intensity in the c-axis direction by use of the luminous intensity in the m-axis direction, namely, by use of the luminous intensity at an angle of 0°. Thus, an asymmetry degree of 10% means that there is a luminous intensity difference of 10% in the m-axis direction between the a-axis direction and the c-axis direction. Regarding the semiconductor light-emitting devices including the light-transmissive members having particle concentrations of 1.0% by weight, 3.0% by weight and 10.0% by weight, no data is provided because the light distribution characteristics thereof were not measured. It is seen that until the particle concentration is about 0.7%, the maximum asymmetry degree and the average asymmetry degree are rapidly decreased. Table 4 shows the values of the particle concentration and the asymmetry degree.

TABLE 4

| Particle concentration | Maximum asymmetry degree [%] | Average asymmetry degree [%] |
| --- | --- | --- |
| 0.0% by weight | 42.9 | 23.6 |
| 0.2% by weight | 26.4 | 12.1 |
| 0.4% by weight | 13.1 | 6.4 |
| 0.7% by weight | 7.7 | 3.7 |
| 15.0% by weight | 6.0 | 3.5 |

Figure 34:
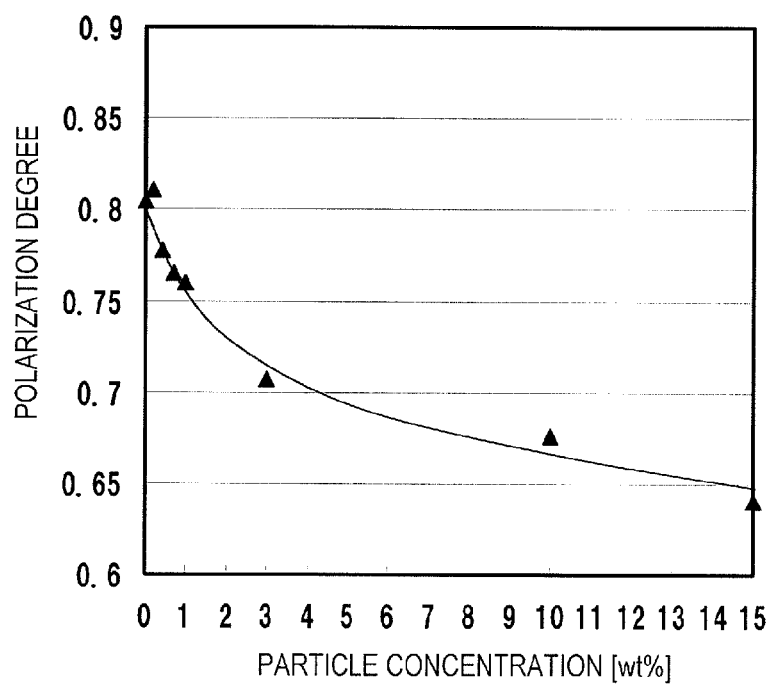
FIG. 34 is a graph showing the relationship between the particle concentration and the polarization degree.
Figure 35A:
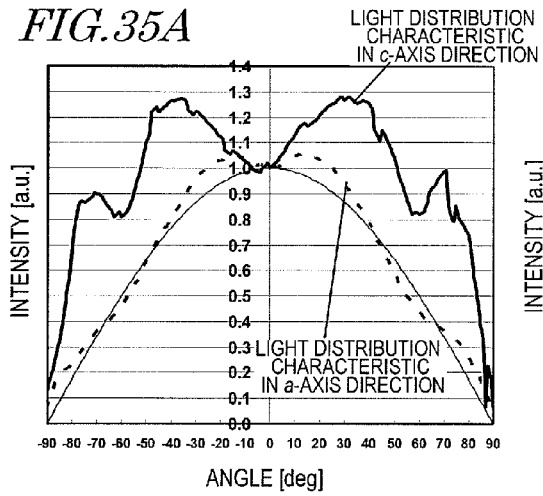
FIGS. 35A through 35F respectively show measurement results of the light distribution characteristics in the a-axis direction and the c-axis direction of semiconductor light-emitting elements which have titanium oxide ($TiO_2$) particle concentrations of 0.0% by weight, 0.2% by weight, 0.4% by weight, 0.7% by weight, 1.0% by weight and 3.0% by weight.
Figure 35B:
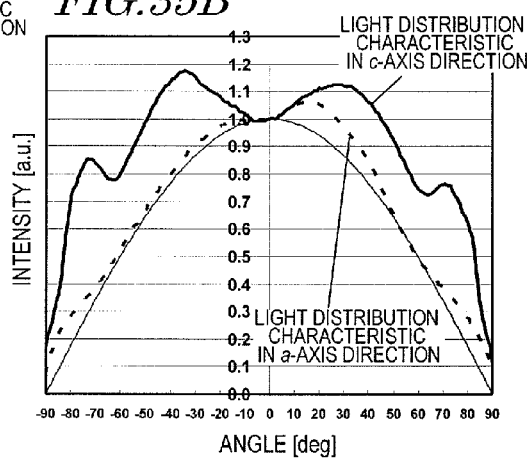
Figure 35C:
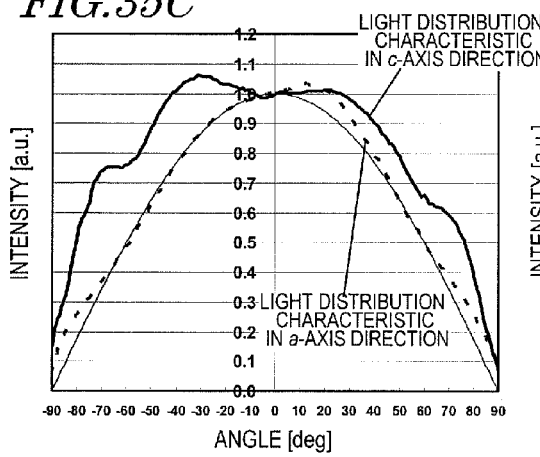
Figure 35D:
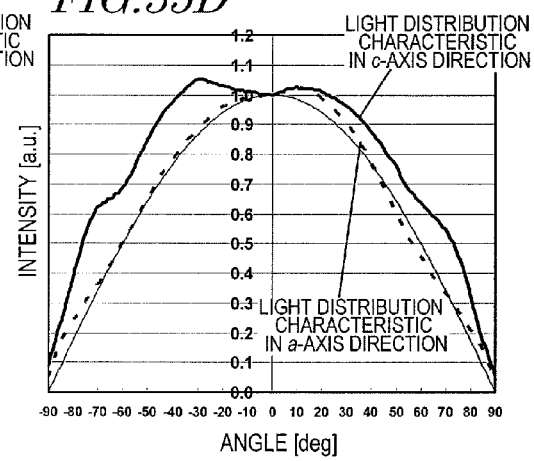
Figure 35E:
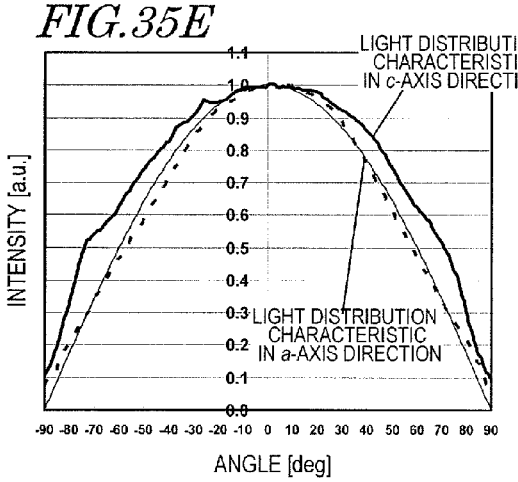
Figure 35F:
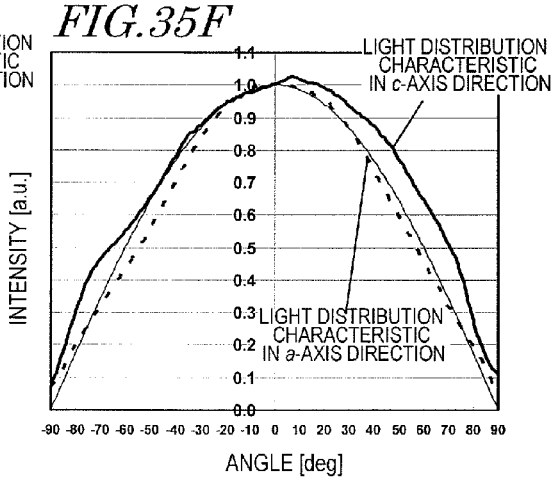

FIG. 34 shows the relationship between the particle concentration and the polarization degree. Light going out of the second light extraction planes 122 is scattered by the particles 125b. Therefore, as the particle concentration is increased, the polarization degree is slowly decreased. Table 5 shows the values of the particle concentration and the asymmetry degree.

TABLE 5

| Particle concentration | Polarization degree |
| --- | --- |
| 0.0% by weight | 0.805 |
| 0.2% by weight | 0.811 |
| 0.4% by weight | 0.777 |
| 0.7% by weight | 0.765 |
| 1.0% by weight | 0.760 |
| 3.0% by weight | 0.707 |
| 10.0% by weight | 0.676 |
| 15.0% by weight | 0.640 |

The measurements shown in FIG. 32 through FIG. 34 were performed in a state where the second light-transmissive member 126 was not formed.

Example 2

Hereinafter, a semiconductor light-emitting device in Example 2 will be described with reference to FIG. 12. On the first light extraction plane 121 and a surface of the first light-transmissive member 124 of the semiconductor light-emitting device produced in Example 1, a semi-spherical silicone resin having an outer profile of 2.2 mm was formed to produce a semiconductor light-emitting device corresponding to the device shown in FIG. 12 in Embodiment 1. The semi-spherical silicone resin corresponds to the second light-transmissive member 126 in the embodiment. The semiconductor light-emitting device having a particle concentration of 0.0% by weight corresponds to a device of a conventional structure.

FIGS. 35A through 35F respectively show measurement results of the light distribution characteristics in the a-axis direction and the c-axis direction of the semiconductor light-emitting elements which have titanium oxide ($TiO_2$) particle concentrations of 0.0% by weight, 0.2% by weight, 0.4% by weight, 0.7% by weight, 1.0% by weight and 3.0% by weight. In the figures, the thick dashed line represents the light distribution characteristic in the a-axis direction, the thick solid line represents the light distribution characteristic in the c-axis direction, and the thin solid line represents the shape of lambertian. When the particle concentration is 0.0% by weight, a strong peak of the light distribution characteristic in the c-axis direction is observed at about ±45°, and a weak peak thereof is observed at about ±75°. The weak peak at about ±75° is considered to be caused as a diffraction peak of the strong peak at about ±45° by light reflection in the semi-spherical silicone resin. By contrast, the light distribution characteristic in the a-axis direction has a shape relatively close to the shape of lambertian. As can be seen, in the semiconductor light-emitting device including the active layer having the m-plane as the main plane, the light distribution characteristic in the a-axis direction exhibit totally different shapes from the distribution characteristic in the c-axis direction. The strong peak of the light distribution characteristic in the c-axis direction that is observed at about ±45° is stronger than the intensity in the m-axis direction, namely, the intensity of a front surface of the semiconductor light-emitting device. Thus, the semiconductor light emitting is considered to be difficult to be handled for practical use.

It is seen that when the particle concentration is increased, the light distribution characteristic in the a-axis direction substantially keeps having the shape of lambertian, whereas the shape of the light distribution characteristic in the c-axis direction is changed to be close to the shape of the light distribution characteristic in the a-axis direction.

Figure 36:
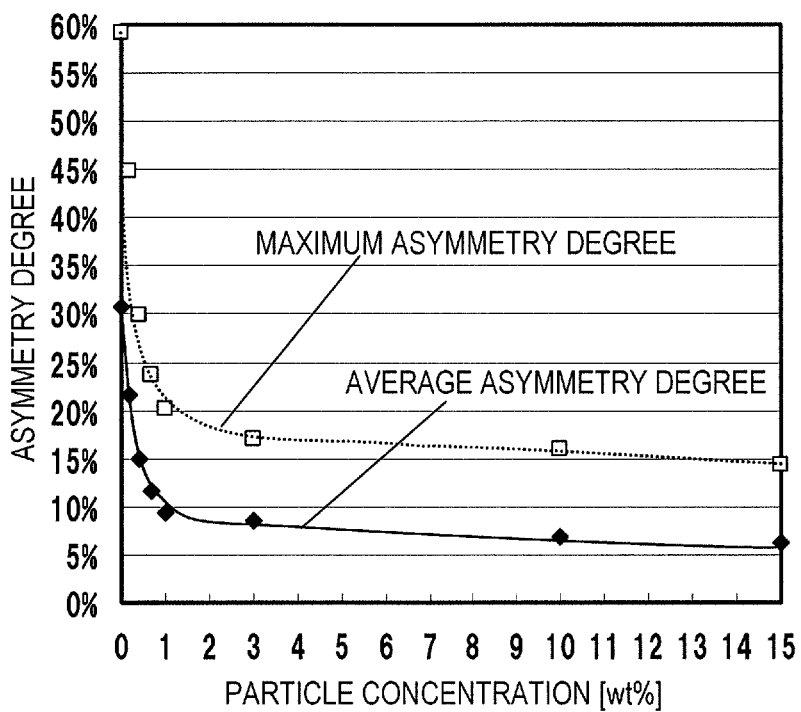
FIG. 36 is a graph showing the numerized symmetry between the light distribution characteristics in the a-axis direction and the light distribution characteristics in the c-axis direction.

FIG. 36 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. When the particle concentration is 0.2% by weight, an effect of decreasing the asymmetry degree is provided. Until the particle concentration is about 0.7%, the maximum asymmetry degree and the average asymmetry degree are rapidly decreased. When the particle concentration is 1.0% by weight or greater, the maximum asymmetry degree and the average asymmetry degree are slowly decreased. Therefore, the particle concentration may be 0.2% by weight or greater, or may be 0.7% by weight or greater. When converted into the volume, the particle concentration may be 0.047% by volume or greater, or may be 0.164% by volume or greater. Table 6 shows the values of the particle concentration and the asymmetry degree.

TABLE 6

| Particle concentration | Maximum asymmetry degree [%] | Average asymmetry degree [%] |
|---|---|---|
| 0.0% by weight | 59.2 | 30.8 |
| 0.2% by weight | 44.9 | 21.5 |
| 0.4% by weight | 29.8 | 15.0 |
| 0.7% by weight | 23.7 | 11.5 |
| 1.0% by weight | 20.2 | 9.4 |
| 3.0% by weight | 16.9 | 8.5 |
| 10.0% by weight | 16.0 | 6.9 |
| 15.0% by weight | 14.2 | 6.1 |

Figure 37:
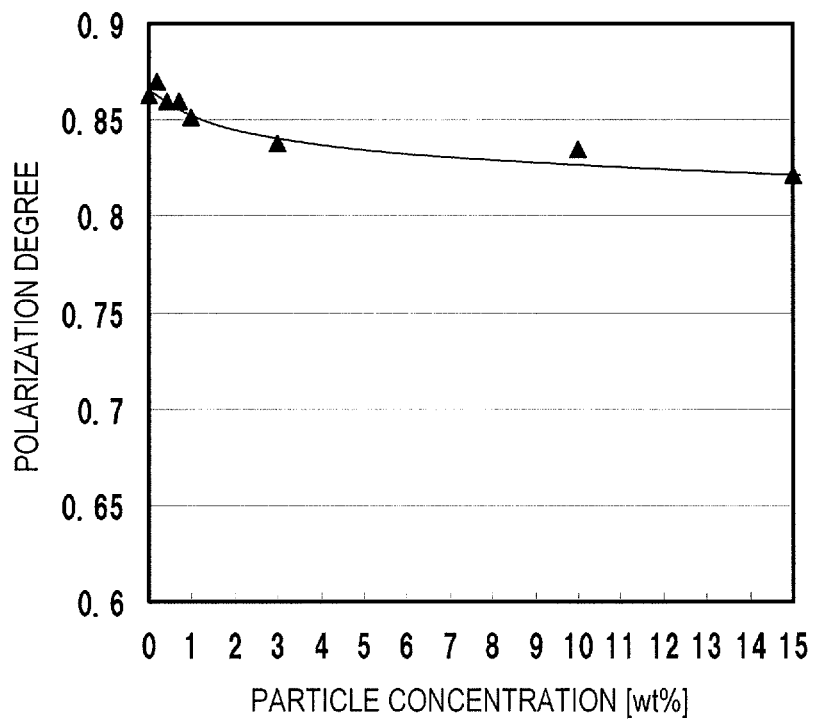
FIG. 37 is a graph showing the relationship between the particle concentration and the polarization degree.

FIG. 37 shows the relationship between the particle concentration and the polarization degree. Light going out of the second light extraction planes 122 is scattered by the particles 125b. Therefore, as the particle concentration is increased, the polarization degree is slightly decreased. A comparison between FIG. 37 and FIG. 34 in Embodiment 1 shows the difference in the polarization degree very well. When the surface of the first light extraction plane 121 is covered with a resin, the light extracting efficiency from the first light extraction plane 121 is improved. Since the light extracted from the first light extraction plane 121 has the polarization degree maintained, the polarization degree thereof is higher than that in Embodiment 1. In addition, the light extracted from the first light extraction plane 121 is not easily influenced by the second light extraction planes 122, and therefore maintains the high polarization degree thereof even when the particle concentration is increased. Table 7 shows the values of the particle concentration and the asymmetry degree.

TABLE 7

| Particle concentration | Polarization degree |
|---|---|
| 0.0% by weight | 0.863 |
| 0.2% by weight | 0.870 |
| 0.4% by weight | 0.860 |
| 0.7% by weight | 0.859 |
| 1.0% by weight | 0.851 |
| 3.0% by weight | 0.838 |
| 10.0% by weight | 0.835 |
| 15.0% by weight | 0.821 |

Figure 38:
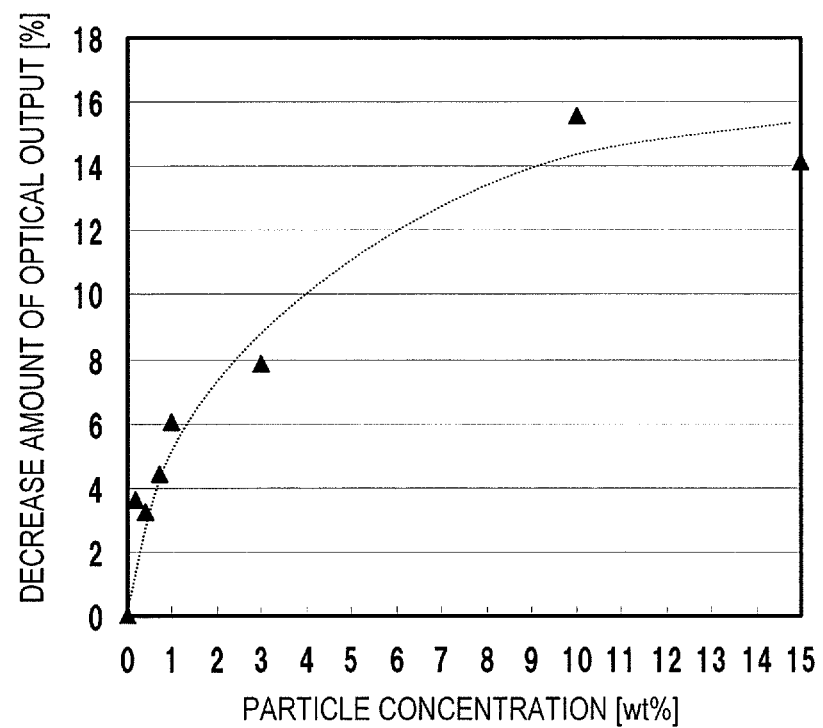
FIG. 38 is a graph showing the relationship between the particle concentration and the decrease amount of the optical output.

FIG. 38 shows the relationship between the particle concentration and the decrease amount of the optical output. The vertical axis represents the decrease amount of the optical output with the optical output when the particle concentration is 0.0% by weight being 100%. Light going out of the second light extraction planes 122 is scattered and further absorbed. Therefore, as the particle concentration is increased, the optical output is decreased. The particle concentration may be 3% by weight or less. When converted into the volume, the particle concentration may be 0.704% by volume or less. By making the particle concentration 3% by weight or less or 0.704% by volume or less, the decrease in the optical output may be made less than 10%. In order to also provide the effect of decreasing the asymmetry degree, the particle concentration may be not less than 0.2% by weight and not more than 3.0% by weight. Further, the particle concentration may be not less than 0.7% by weight and not more than 3.0% by weight. When converted into the volume, the particle concentration may be not less than 0.047% by volume and not more than 0.704% by volume. Further, the particle concentration may be not less than 0.164% by volume and not more than 0.704% by volume. Table 8 shows the values of the particle concentration and the decrease amount of the optical output.

TABLE 8

| Particle concentration | Optical output decrease amount [%] |
|---|---|
| 0.0% by weight | 0 |
| 0.2% by weight | 3.6 |
| 0.4% by weight | 3.3 |
| 0.7% by weight | 4.4 |
| 1.0% by weight | 6.0 |
| 3.0% by weight | 7.8 |
| 10.0% by weight | 15.6 |
| 15.0% by weight | 14.0 |

Figure 39A:
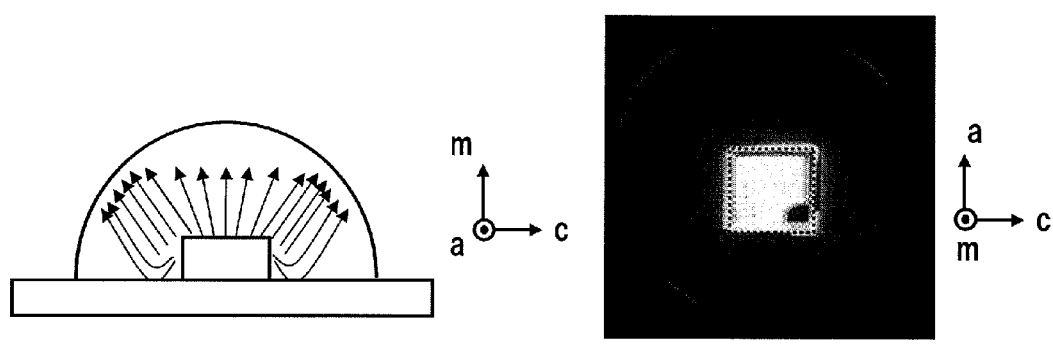
FIGS. 39A and 39B respectively show a microphotograph of a top surface of a semiconductor light-emitting device having a particle concentration of 0.0% by weight and a microphotograph of a top surface of a semiconductor light-emitting device having a particle concentration of 1.0% by weight.
Figure 39B:
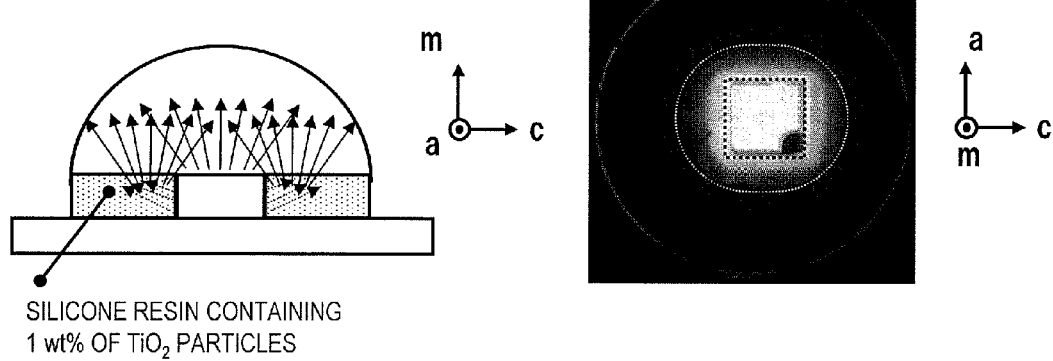

FIG. 39A provides a schematic view of a semiconductor light-emitting device having a particle concentration of 0.0% by weight and a microphotograph of a top surface thereof. FIG. 39B provides a schematic view of a semiconductor light-emitting device having a particle concentration of 1.0% by weight and a microphotograph of a top surface thereof. In each of the photographs in the figures, the dotted line indicates the outer profile of the semiconductor light-emitting chip. It is seen that in the semiconductor light-emitting device having a particle concentration of 1.0% by weight, light going out of the side surfaces thereof is diffused inside the light-transmissive member containing particles, and thus light is emitted in an area outside the outer profile of the semiconductor light-emitting chip represented by the dotted line. It is also seen that the area of the particle-containing light-transmissive member in which the light is diffused exhibits a shape close to an elliptical shape having a longer axis in the c-axis direction.

Example 3

Figure 40:
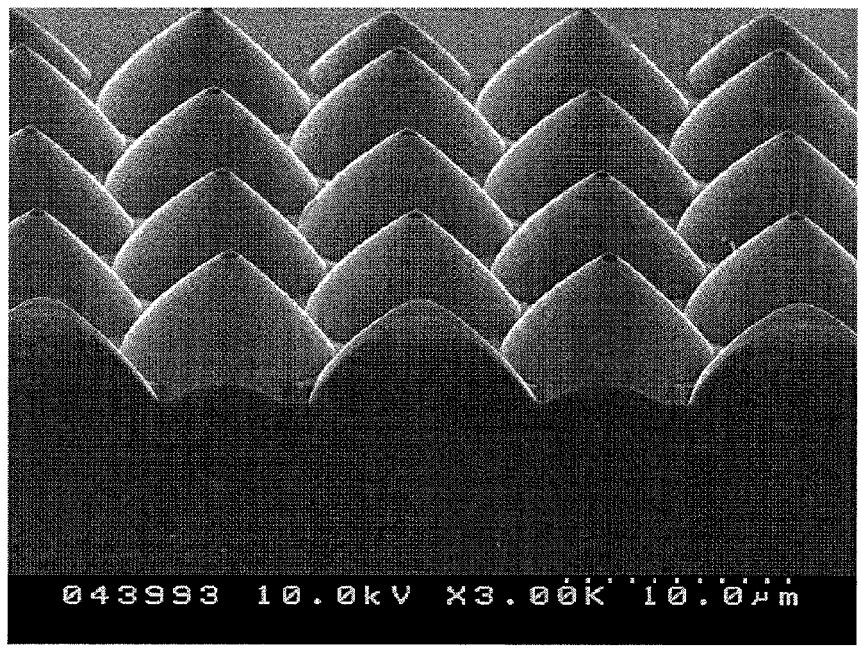
FIG. 40 shows a cross-sectional SEM image of projection and recess portions formed at the first light extraction plane of a semiconductor light-emitting chip 100.

Hereinafter, a semiconductor light-emitting device in Example 3 will be described with reference to FIGS. 14A and 14B. A semiconductor light-emitting chip 100 was produced in substantially the manner as in Example 1. At a rear surface of the semiconductor light-emitting chip 100, namely, at the first light extraction plane, a resist was formed by use of lithography, and then projection and recess portions were formed by dry etching by use of chlorine-based gas. The projection and recess portions include projection portions having a shape close to a semi-spherical shape having a diameter of 10 μm. FIG. 40 shows a cross-sectional SEM image of the projection and recess portions formed at the first light extraction plane of the semiconductor light-emitting chip 100 produced as described above. Like in Example 1, such semiconductor light-emitting chips 100 were flip-chip-mounted on the mounting substrate 101 formed of AlN. Thus, a plurality of semiconductor light-emitting devices were produced. The polarization degree was measured in a state where an operating current of 5 mA was flowing thereto. The polarization degree was in the range of 0.378 to 0.401. The light emitting wavelength at an operating current of 10 mA was 450 nm. Unlike in Example 1, the semiconductor light-emitting chip 100 in Example 3 includes the projection and recess portions at the first light extraction plane. Light going out of the first light extraction plane is scattered by the projection and recess portions. Owing to this, the polarization degree can be decreased in Example 3 as compared with in Example 1.

Next, titanium oxide STT-30EHJ (particle diameter: 30 to 50 nm) produced by Titan Kokyo, Ltd. was incorporated into silicone KER-2500 produced by Shin-Etsu Chemical Co., Ltd. to produce a light-transmissive member containing particles. The particle-containing light-transmissive member was formed only on side surfaces of the semiconductor light-emitting chip 100 by use of a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. The particle concentration of the particle-containing light-transmissive member was varied to 0.0% by weight, 3.0% by weight, 10.0% by weight, and 15.0% by weight to produce four types of semiconductor light-emitting elements.

In a final step, the light-transmissive member and the first light extraction plane 121 were sealed with a silicone resin such that the outer profile of the semiconductor light-emitting chip 100 would have a semi-spherical shape. In FIG. 14, the first and second light-transmissive members 124 and 126 each have a quadrangular prism shape, which is different from the shape of the first and second light-transmissive members 124 and 126 in this example. The semi-spherical silicone resin corresponds to the second light-transmissive member 126 in the embodiments. The semiconductor light-emitting device having a particle concentration of 0.0% by weight corresponds to a device of a conventional structure.

Figure 41:
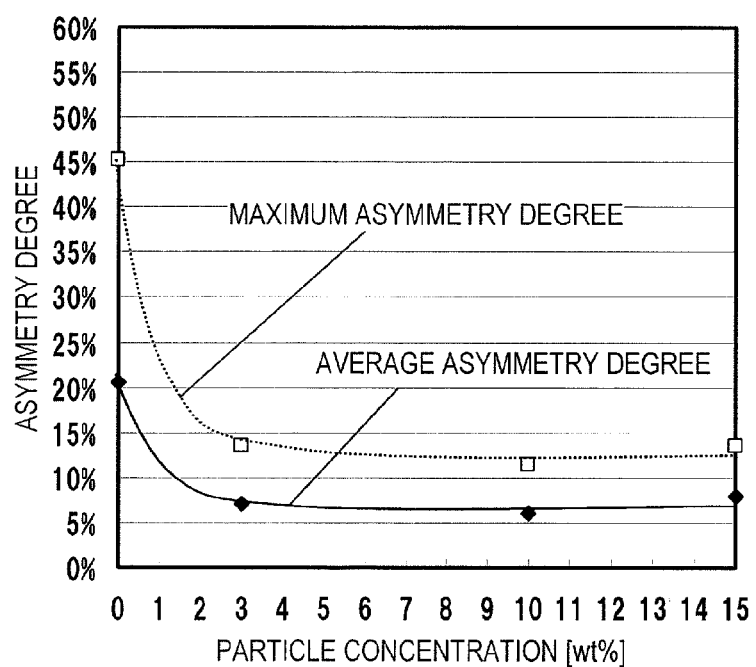
FIG. 41 is a graph showing the numerized symmetry between the light distribution characteristics in the a-axis direction and the light distribution characteristics in the c-axis direction.

FIG. 41 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. When the particle concentration is 3.0% by weight or greater, the maximum asymmetry degree and the average asymmetry degree are generally constant.

Figure 42:
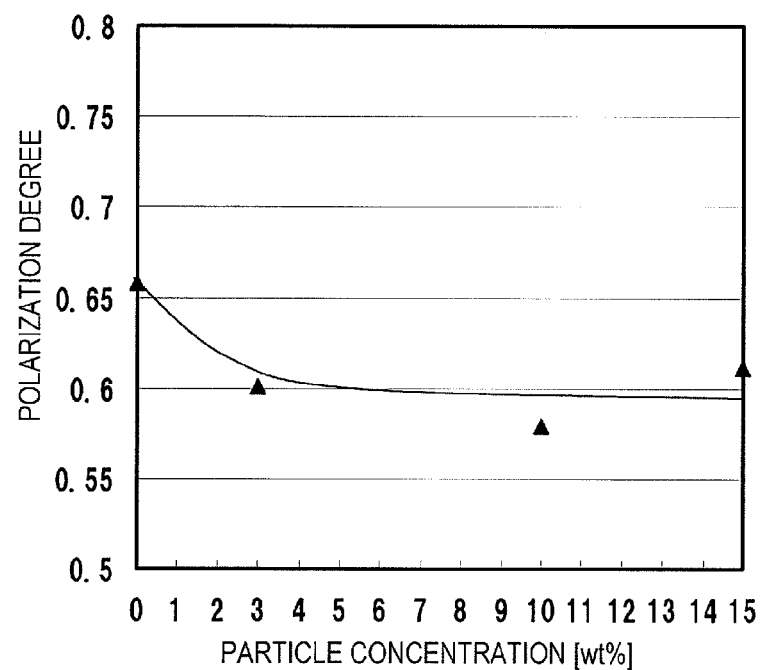
FIG. 42 is a graph showing the relationship between the particle concentration and the polarization degree.

FIG. 42 shows the relationship between the particle concentration and the polarization degree. Light going out of the second light extraction planes 122 is scattered by the particles 125b. Therefore, as the particle concentration is increased, the polarization degree is decreased. It is seen that the polarization degree in this example is lower as a whole than in FIG. 37 in Example 2. A reason for this is that the light is scattered by the projection and recess portions formed at the surface of the first light extraction plane 121.

Figure 43:
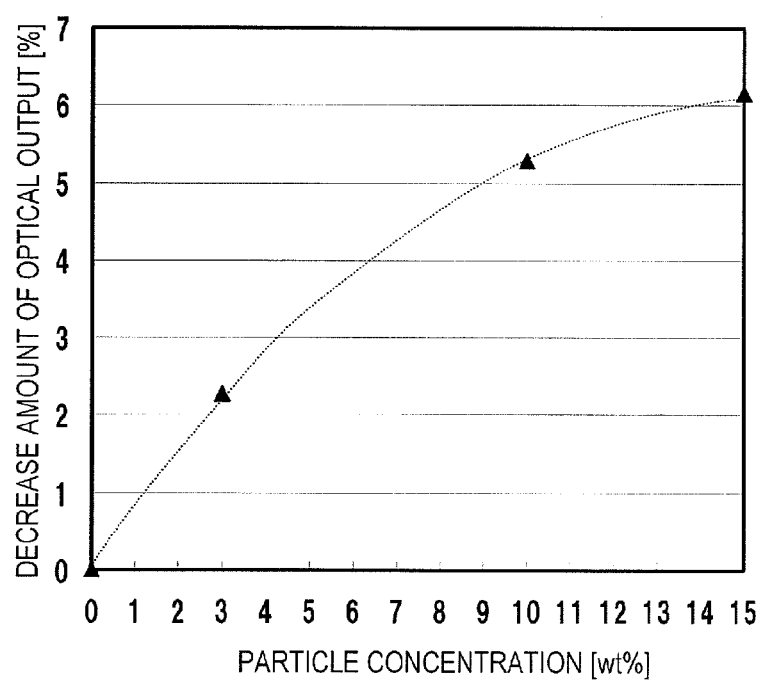
FIG. 43 is a graph showing the relationship between the particle concentration and the decrease amount of the optical output.

FIG. 43 shows the relationship between the particle concentration and the decrease amount of the optical output. The vertical axis represents the decrease amount of the optical output with the optical output when the particle concentration is 0.0% by weight being 100%. Light going out of the second light extraction planes 122 is scattered and further absorbed. Therefore, as the particle concentration is increased, the optical output is decreased. It is seen that the decrease amount of the optical output is suppressed to half or lower of that in FIG. 38 in Example 2. A reason for this is that the amount of light going out of the first extraction plane 121 is increased by the projection and recess portions formed at the surface of the first extraction plane 121. In order to make the decrease amount of the optical output less than 5%, the particle concentration may be 9% by weight or less. In order to make the decrease amount of the optical output less than 3%, the particle concentration may be 4.5% by weight or less. When converted into the volume, the particle concentration may be made 2.113% by volume or less, or 1.056 volume or less. In order to provide the effect of decreasing the asymmetry degree shown in FIG. 41, the particle concentration may be not less than 3.0% by weight and not more than 9.0% by weight. Further, the particle concentration may be not less than 3.0% by weight and not more than 4.5% by weight. When converted into the volume, the particle concentration may be not less than 0.704% by volume and not more than 2.113% by volume, or further may be not less than 0.704% by volume and not more than 1.056% by volume.

Example 4

Hereinafter, a semiconductor light-emitting device in Example 4 will be described with reference to FIG. 11.

First, on a wafer-state n-type GaN substrate having the (20-2-1) plane as a main plane, an n-type nitride semiconductor layer formed of n-type GaN and having a thickness of 2 μm, an active layer having a three-cycle quantum well structure having quantum well layers formed of InGaN and barrier layers formed of GaN, and a p-type nitride semiconductor layer formed of p-type GaN and having a thickness of 0.5 μm were formed by, for example, MOCVD. The (20-2-1) plane is a semi-polar plane.

As an n-side electrode, a Ti/Al layer was formed. As a p-side electrode, an Ag layer was formed. Then, a rear surface of the n-type GaN substrate was polished to provide a thickness of 100 μm.

Next, in the wafer having the light emitting structure formed thereon, a groove having a depth of about several tens of micrometers from the surface thereof was formed in the [10-14] direction and the [1-210] direction of the wafer by use of laser. Then, the wafer was broken to obtain the semiconductor light-emitting chips 100 formed of an m-plane GaN-based semiconductor and having a side of 450 μm. In this structure, the ratio of the area size of the second light extraction plane 122 with respect to the area size of the first light extraction plane 121 is 44%.

Next, a plurality of semiconductor light-emitting devices were produced in substantially the same manner as in Example 1.

In this state, the light emitting wavelength at an operating current of 10 mA was measured. The result was 456 nm. The polarization degree at an operating current of 5 mA was measured. The polarization degree was in the range of 0.735 to 0.783, and the electric field direction was polarized in the [1-210] direction.

Next, titanium oxide ($TiO_2$) STT-30EHJ (particle diameter: 30 to 50 nm) produced by Titan Kokyo, Ltd. was mixed with silicone KER-2500 produced by Shin-Etsu Chemical Co., Ltd. to prepare a light-transmissive member containing particles. The particle-containing light-transmissive member was formed only on side surfaces of the semiconductor light-emitting chip 100 with a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. In other words, in this example, the second light-transmissive member 126 was not formed. The $TiO_2$ particle concentration of the particle-containing light-transmissive member was varied to 0.0% by weight, 0.4% by weight, 1.0% by weight, and 3.0% by weight to produce semiconductor light-emitting devices corresponding to the device shown in FIG. 11 in Embodiment 1. The density of silicone is about 1 $g/cm^3$, and the density of $TiO_2$ is about 4.26 $g/cm^3$. Therefore, a value obtained by dividing the value of percent by weight with 4.26 corresponds to the value of percent by volume.

FIGS. 44A through 44D respectively show measurement results of the light distribution characteristics in the [1-210] direction and the [10-14] direction of the semiconductor light-emitting elements which have titanium oxide ($TiO_2$) particle concentrations of 0.0% by weight, 0.4% by weight, 1.0% by weight and 3.0% by weight. In the figures, the thick dashed line represents the light distribution characteristic in the [1-210] direction, the thick solid line represents the light distribution characteristic in the [10-14] direction, and the thin solid line represents the shape of lambertian. When the $TiO_2$ particle concentration is 0.0% by weight, the light distribution characteristic in a direction perpendicular to the [1-210] direction, which is the polarization direction, namely, the light distribution characteristic in the [10-14] direction is largely distorted. As the $TiO_2$ particle concentration is increased, the shape of the light distribution characteristic in the [10-14] direction is made closer to the shape of lambertian. When the $TiO_2$ particle concentration is 1.0% by weight, the light distribution characteristic in the [1-210] direction and the light distribution characteristic in the [10-14] direction have almost the same shape.

Figure 45:
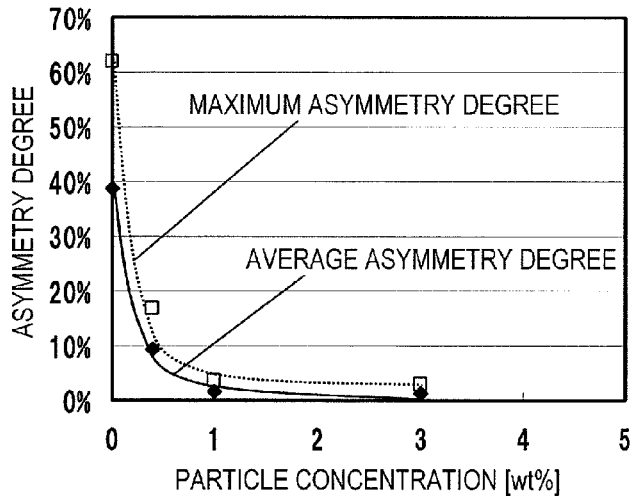
FIG. 45 shows the relationship between the particle concentration and each of the maximum asymmetry degree and the average asymmetry degree of the semiconductor light-emitting elements in Example 4.

FIG. 45 shows the numerized symmetry between the light distribution characteristics in the [1-210] direction and the light distribution characteristics in the [10-14] direction, and shows the relationship between the particle concentration and each of the maximum asymmetry degree and the average asymmetry degree. White squares represent the maximum asymmetry degree, and black diamond shapes represent the average asymmetry degree. The asymmetry degree is a value obtained by normalizing a difference between the luminous intensity in the [1-210] direction and the luminous intensity in the [10-14] direction by use of the luminous intensity in the [20-2-1] direction, namely, by use of the luminous intensity at an angle of 0°. When the particle concentration is about 0.4%, the maximum asymmetry degree and the average asymmetry degree are rapidly decreased. When the particle concentration is 1.0% or higher, the maximum asymmetry degree and the average asymmetry degree are stabilized. Table 9 shows the values of the particle concentration and the asymmetry degree.

TABLE 9

| Particle concentration | Maximum asymmetry degree [%] | Average asymmetry degree [%] |
| --- | --- | --- |
| 0.0% by weight | 62.1 | 38.6 |
| 0.4% by weight | 16.8 | 9.4 |
| 1.0% by weight | 3.4 | 1.6 |
| 3.0% by weight | 3.0 | 1.4 |

Example 5

Hereinafter, a semiconductor light-emitting device in Example 5 will be described with reference to FIGS. 14A and 14B. A semiconductor light-emitting chip 100 was produced in substantially the manner as in Example 4. The active layer was formed at the (20-2-1) plane, namely, a semi-polar plane. At a rear surface of the semiconductor light-emitting chip 100, namely, at the first light extraction plane, a resist was formed by use of lithography, and then projection and recess portions were formed dry etching by use of chlorine-based gas. The projection and recess portions each have a shape close to a semi-spherical shape having a height of 5 μm and a diameter of 10 μm. Next, a plurality of semiconductor light-emitting devices were produced in substantially the same manner as in Example 1. The polarization degree was measured at an operating current of 5 mA. The polarization degree was in the range of 0.305 to 0.370. The light emitting wavelength at an operating current of 10 mA was 456 nm. Unlike in Example 4, the semiconductor light-emitting chip 100 in Example 5 includes the projection and recess portions at the first light extraction plane. Light going out of the first light extraction plane is scattered by the projection and recess portions. Owing to this, the polarization degree can be decreased in Example 5 as compared with in Example 4.

Next, the $TiO_2$ particle concentration of the particle-containing light-transmissive member was varied to 0.0% by weight, 0.4% by weight, 1.0% by weight, and 3.0% by weight to produce semiconductor light-emitting devices corresponding to the device shown in FIG. 11 in Embodiment 1 in substantially the same manner as in Example 4. The density of silicone is about 1 $g/cm^3$, and the density of $TiO_2$ is about 4.26 $g/cm^3$. Therefore, a value obtained by dividing the value of percent by weight with 4.26 corresponds to the value of percent by volume. In this example, the second light-transmissive member 126 was not formed.

Figure 46:
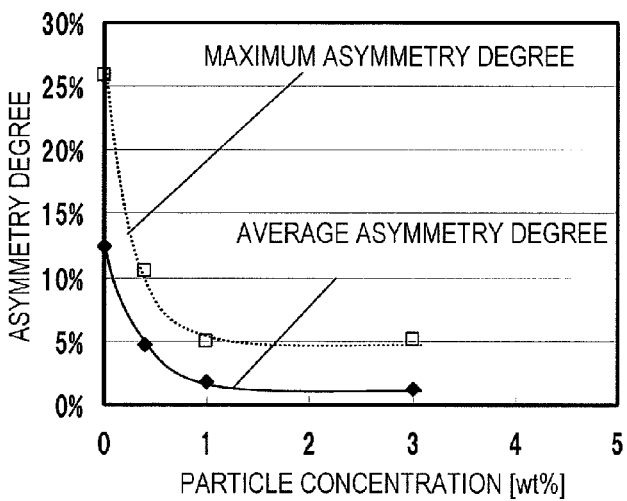
FIG. 46 shows the relationship between the particle concentration and each of the maximum asymmetry degree and the average asymmetry degree of semiconductor light-emitting elements in Example 5.

FIG. 46 shows the numerized symmetry between the light distribution characteristics in the [1-210] direction and the light distribution characteristics in the [10-14] direction, and shows the relationship between the particle concentration and each of the maximum asymmetry degree and the average asymmetry degree. White squares represent the maximum asymmetry degree, and black diamond shapes represent the average asymmetry degree. The asymmetry degree is a value obtained by normalizing a difference between the luminous intensity in the [1-210] direction and the luminous intensity in the [10-14] direction by use of the luminous intensity in the [20-2-1] direction, namely, by use of the luminous intensity at an angle of 0°. When the particle concentration is about 0.4%, the maximum asymmetry degree and the average asymmetry degree are rapidly decreased. When the particle concentration is 1.0% or higher, the maximum asymmetry degree and the average asymmetry degree are stabilized. Table 10 shows the values of the particle concentration and the asymmetry degree.

TABLE 10

| Particle concentration | Maximum asymmetry degree [%] | Average asymmetry degree [%] |
| --- | --- | --- |
| 0.0% by weight | 25.8 | 12.5 |
| 0.4% by weight | 10.5 | 4.7 |
| 1.0% by weight | 5.0 | 1.8 |
| 3.0% by weight | 5.1 | 1.3 |

Example 6

Hereinafter, a semiconductor light-emitting device in Example 6 will be described with reference to FIG. 11. A semiconductor light-emitting device including an active layer having the m-plane as a growth plane was produced in substantially the same manner as in Embodiment 1.

The light emitting wavelength at an operating current of 10 mA was measured. The light emitting wavelength was 445 nm. The polarization degree at an operating current of 5 mA was measured. The polarization degree was in the range of 0.755 to 0.784.

Next, zinc oxide (ZnO) ZS-032-D (particle diameter: 25 nm) produced by Showa Denko K.K. was incorporated into silicone KER-2500 produced by Shin-Etsu Chemical Co., Ltd. to produce a light-transmissive member containing particles. The particle-containing light-transmissive member was formed only on side surfaces of the semiconductor light-emitting chip 100 by use of a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. In other words, in this example, the second light-transmissive member 126 was not formed. The ZnO particle concentration of the particle-containing light-transmissive member was varied to 0.0% by weight, 0.4% by weight, 1.0% by weight and 3.0% by weight to produce semiconductor light-emitting devices corresponding to the device shown in FIG. 11 in Embodiment 1. The density of silicone is about 1 g/cm$^3$, and the density of ZnO is about 5.61 g/cm$^3$. Therefore, a value obtained by dividing the value of percent by weight with 5.61 corresponds to the value of percent by volume.

Figure 47:
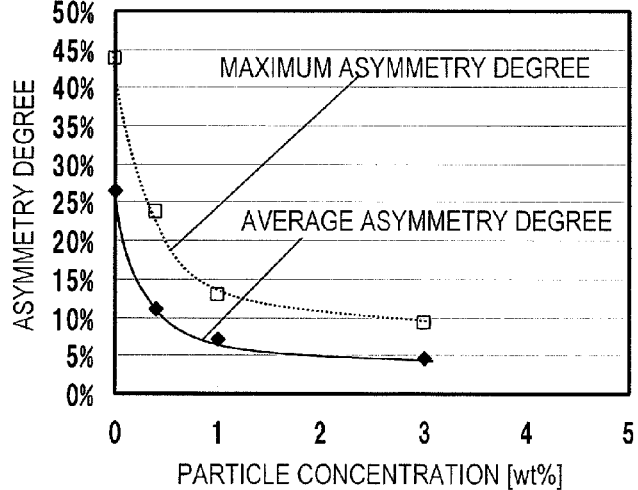
FIG. 47 shows the relationship between the particle concentration and each of the maximum asymmetry degree and the average asymmetry degree of semiconductor light-emitting elements in Example 6.

FIG. 47 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. When the particle concentration is about 0.4%, the maximum asymmetry degree and the average asymmetry degree are rapidly decreased. When the particle concentration is 1.0% or higher, the maximum asymmetry degree and the average asymmetry degree are stabilized. Table 11 shows the values of the particle concentration and the asymmetry degree.

TABLE 11

| Particle concentration | Maximum asymmetry degree [%] | Average asymmetry degree [%] |
| --- | --- | --- |
| 0.0% by weight | 43.7 | 26.6 |
| 0.4% by weight | 23.7 | 11.0 |
| 1.0% by weight | 12.0 | 7.0 |
| 3.0% by weight | 9.2 | 4.5 |

As can be seen, in Examples 1 through 6, the asymmetry of the light distribution characteristic of a nitride-based semiconductor light-emitting device having a non-polar plane such as the a-plane or the m-plane, or a semi-polar plane such as the (20-21) plane, (20-2-1) plane, (10-1-3) plane, (11-22) plane, -r-plane or (11-22) plane as a growth plane can be alleviated.

Comparative Example 1

Hereinafter, a semiconductor light-emitting device in Comparative example 1 will be described.

First, on a wafer-state n-type GaN substrate having the c-plane as a main plane, an n-type nitride semiconductor layer formed of n-type GaN and having a thickness of 2 μm, an active layer having a three-cycle quantum well structure having quantum well layers formed of InGaN and barrier layers formed of GaN, and a p-type nitride semiconductor layer formed of p-type GaN and having a thickness of 0.5 μm were formed by, for example, MOCVD. The c-plane is a polar plane.

As an n-side electrode, a Ti/Al layer was formed. As a p-side electrode, an Ag layer was formed. Then, a rear surface of the n-type GaN substrate was polished to provide a thickness of 100 μm.

Next, projection and recess portions each having a shape close to a semi-spherical shape having a height of 5 μm and a diameter of 10 μm were formed in substantially the same manner as in Example 3, namely, at the first light extraction plane.

Next, in a wafer having the light emitting structure formed thereon, a groove having a depth of about several tens of micrometers from the surface thereof was formed in the a-axis direction and the m-axis direction of the wafer by use of laser. Then, the wafer was broken to obtain the semiconductor light-emitting chips 100 formed of an m-plane GaN-based semiconductor and having a side of 450 μm. In this structure, the ratio of the area size of the second light extraction plane 122 with respect to the area size of the first light extraction plane 121 is 44%. The semiconductor light-emitting chip 100 was mounted on the mounting substrate in substantially the same manner as in Example 1, and the semiconductor light-emitting devices were produced.

Figure 48:
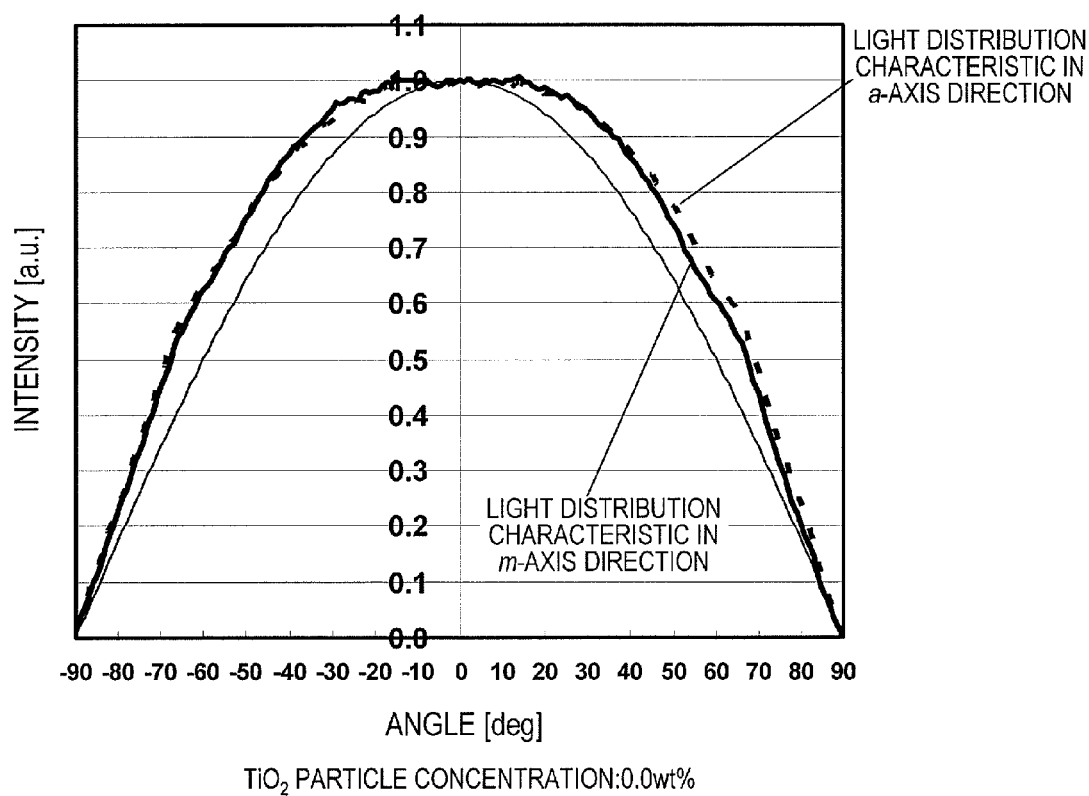
FIG. 48 shows measurement results of the light distribution characteristics in the a-axis direction and the m-axis direction of semiconductor light-emitting elements in Comparative example 1.
Figure 49A:
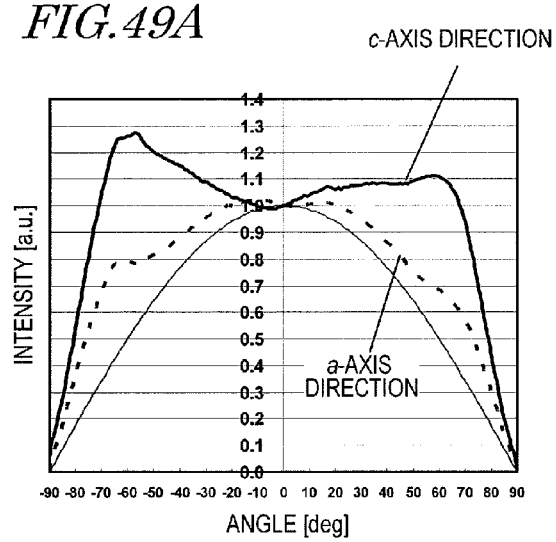
FIGS. 49A through 49D respectively show measurement results of the light distribution characteristics in the a-axis direction and the c-axis direction of semiconductor light-emitting devices in Example 7 which have particle concentrations of the first light-transmissive member of 0.0% by weight, 0.4% by weight, 1.0% by weight and 3.0% by weight.
Figure 49B:
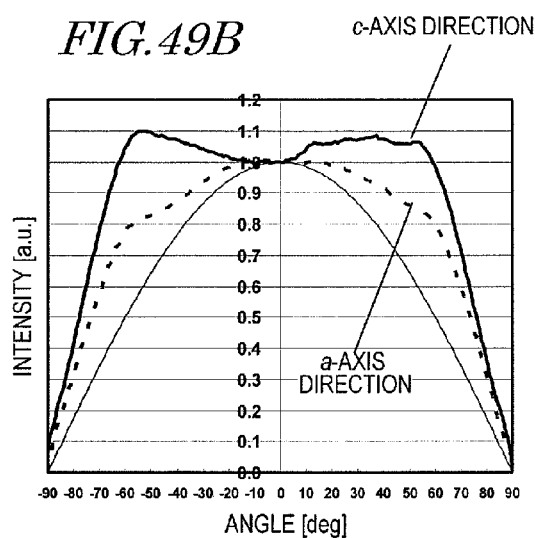
Figure 49C:
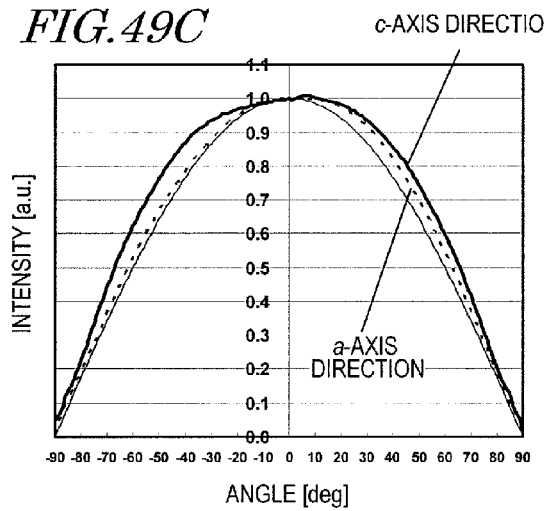
Figure 49D:
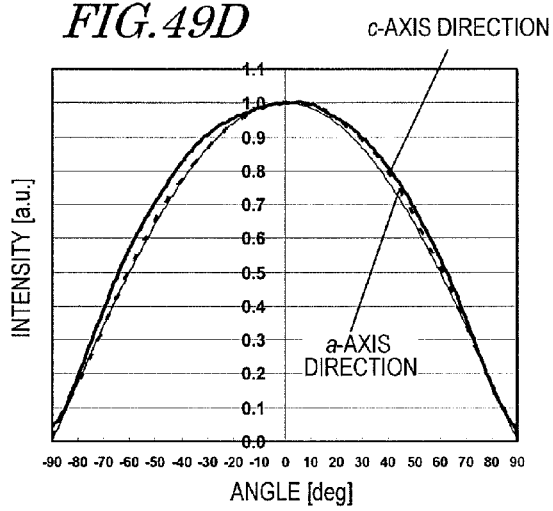

FIG. 48 shows measurement results of the light distribution characteristics in the a-axis direction and the m-axis direction. In the figure, the thick dashed line represents the light distribution characteristic in the a-axis direction, the thick solid line represents the light distribution characteristic in the m-axis direction, and the thin solid line represents the shape of lambertian. The average asymmetry degree was as low as 0.0121, and the maximum asymmetry degree was as low as 0.0287.

Regarding the semiconductor light-emitting devices in Embodiments 3 and 4, mainly the color non-uniformity was evaluated. Now, the results will be described by way of Examples 7 through 11 and Comparative example 2.

Example 7

The anisotropy of the light emitting intensity and the anisotropy of the light emitting wavelength are most conspicuously observed between the characteristic in the case where the polarization direction of the light emitting layer is used as the reference axis and the characteristic in the case where a direction perpendicular to the polarization direction and parallel to the light emitting layer is used as the reference axis. In the following examples, the light distribution characteristics were evaluated regarding the above-described two characteristics.

In Example 7, semiconductor light-emitting devices each having a structure shown in FIG. 23 were produced. First, a method for producing a semiconductor light-emitting chip 100 will be described.

First, on a wafer-state n-type GaN substrate having the m-plane as a main plane, an n-type nitride semiconductor layer formed of n-type GaN and having a thickness of 2 μm, an active layer having a three-cycle quantum well structure having quantum well layers formed of InGaN and barrier layers formed of GaN, and a p-type nitride semiconductor layer formed of p-type GaN and having a thickness of 0.5 μm were formed by, for example, MOCVD.

As an n-side electrode, a Ti/Al layer was formed. As a p-side electrode, an Ag layer was formed. Then, a rear surface of the n-type GaN substrate was polished to provide a thickness of 100 μm.

Next, in the wafer having the light emitting structure formed thereon, a groove having a depth of about several tens of micrometers from the surface thereof was formed in the c-axis direction [0001] and the a-axis direction [11-20] of the wafer by use of laser. Then, the wafer was broken to obtain the semiconductor light-emitting chips 100 formed of an m-plane GaN-based semiconductor and having a side of 450 μm. In this structure, the ratio of the area size of the second light extraction plane 122 with respect to the area size of the first light extraction plane 121 is 44%.

Next, the semiconductor light-emitting chips 100 were flip-chip-mounted on the mounting substrate 101 formed of AlN. Thus, a plurality of semiconductor light-emitting devices were produced. The mounting substrate 101 formed of AlN has a thickness of about 0.7 mm. On a surface of the mounting substrate 101, an electrode 102 formed of silver (Ag) and having a thickness of about 4 μm is formed.

Next, titanium oxide ($TiO_2$) STT-30EHJ (particle diameter: 30 to 50 nm) produced by Titan Kokyo, Ltd. was incorporated into silicone KER-2500 produced by Shin-Etsu Chemical Co., Ltd. to produce a light-transmissive member containing particles. The particle-containing light-transmissive member was formed only on side surfaces of the semiconductor light-emitting chip 100 by use of a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. The semiconductor light-emitting devices having particle concentrations of the particle-containing light-transmissive member of 0.0% by weight, 0.4% by weight, 1.0% by weight and 3.0% by weight were produced. The density of silicone is about 1 $g/cm^3$, and the density of $TiO_2$ is about 4.26 $g/cm^3$. Therefore, a value obtained by dividing the value of percent by weight with 4.26 corresponds to the value of percent by volume. Thus, four types of semiconductor light-emitting devices with no wavelength converting member 130 were first produced. The dependence of the light emitting intensity and the light emitting wavelength on the outgoing direction of these semiconductor light-emitting devices were examined.

FIGS. 49A through 49D respectively show measurement results of the light distribution characteristics in the a-axis direction and the c-axis direction of the semiconductor light-emitting elements which have titanium oxide ($TiO_2$) particle concentrations of the first light-transmissive member of 0.0% by weight, 0.4% by weight, 1.0% by weight and 3.0% by weight. In the figures, the thick dashed line represents the light distribution characteristic in the a-axis direction, the thick solid line represents the light distribution characteristic in the c-axis direction, and the thin solid line represents the shape of lambertian. When the particle concentration is 0.0% by weight, peaks of the light distribution characteristic in the c-axis direction are observed at about ±45° to ±75°. The shape of the profile of the light distribution characteristic in the a-axis direction is closer to the shape of lambertian than the shape of the profile of the light distribution characteristic in the c-axis direction. As can be seen, in the semiconductor light-emitting device including the active layer having the m-plane as the main plane, the light distribution characteristic in the a-axis direction and the distribution characteristic in the c-axis direction exhibit totally different profiles from each other. Meanwhile, as the particle concentration is increased to 0.4% by weight, 1.0% by weight and 3.0% by weight, the profile of the light distribution characteristic in the c-axis direction and the profile of the light distribution characteristic in the a-axis direction become closer so as to match each other. The profile of the light distribution characteristic in the a-axis direction better matches the shape of lampertian.

Figure 50:
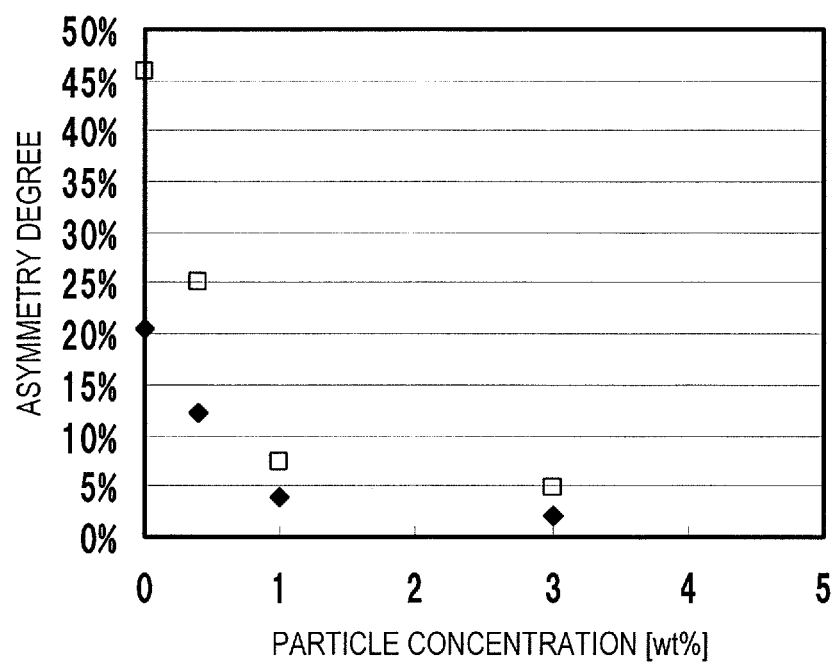
FIG. 50 shows the relationship between the particle concentration and each of the maximum asymmetry degree and the average asymmetry degree of the semiconductor light-emitting devices in Example 7.

FIG. 50 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. The asymmetry degree is a value obtained by normalizing a difference between the luminous intensity in the a-axis direction and the luminous intensity in the c-axis direction by use of the luminous intensity in the m-axis direction, namely, by use of the luminous intensity at an angle of 0°. Thus, an asymmetry degree of 10% means that there is a luminous intensity difference of 10% in the m-axis direction between the a-axis direction and the c-axis direction. A smaller asymmetry degree means a smaller anisotropy of the light emitting intensity in accordance with the outgoing direction. As can be seen from FIG. 50, as the particle concentration is increased, the maximum asymmetry degree and the average asymmetry are decreased. When the particle concentration exceeds 1.0%, the asymmetry degrees are almost stabilized.

Figure 51A:
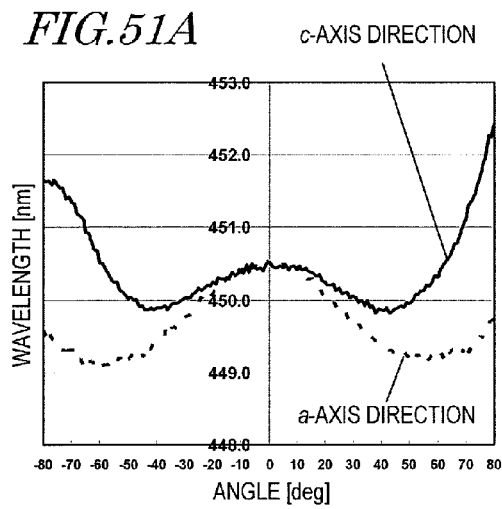
FIGS. 51A through 51D respectively show the angle from the normal direction (m-axis direction) and measurement results of the light emitting wavelength in the a-axis direction and the c-axis direction of the semiconductor light-emitting devices in Example 7 which have particle concentrations of the first light-transmissive member of 0.0% by weight, 0.4% by weight, 1.0% by weight and 3.0% by weight.
Figure 51B:
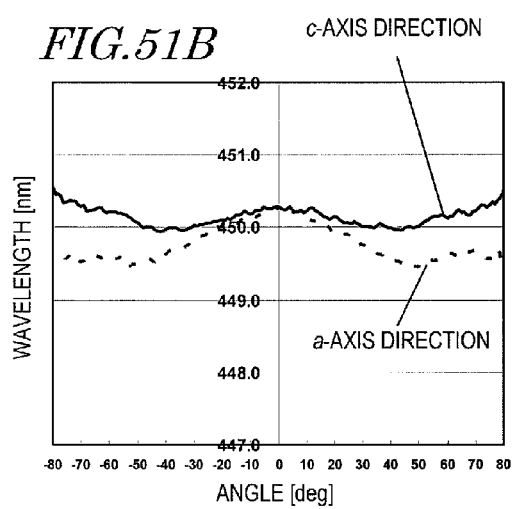
Figure 51C:
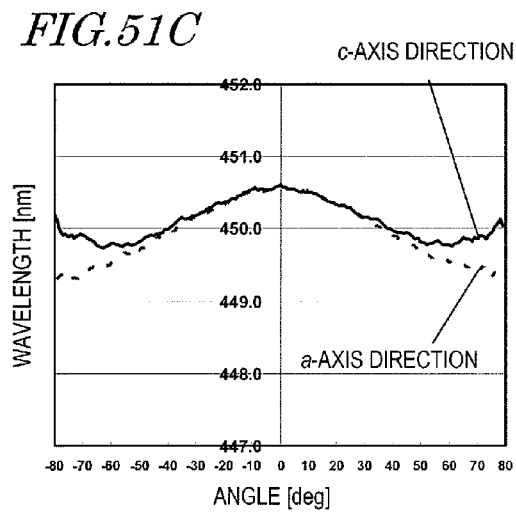
Figure 51D:
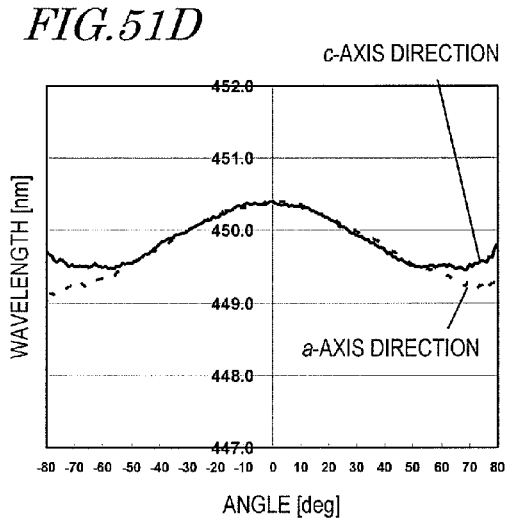

FIGS. 51A through 51D respectively show measurement results of the light emitting wavelength in the a-axis direction and the c-axis direction of the semiconductor light-emitting devices which have titanium oxide ($TiO_2$) particle concentrations of 0.0% by weight, 0.4% by weight, 1.0% by weight and 3.0% by weight. The value of the light emitting wavelength shown in the figures is the value of a dominant wavelength. As described above, an active layer emits light of three wavelengths. The wavelength of light extracted outside is determined by a mixing ratio of the three wavelengths. As shown in FIG. 51A, on the large angle side in the c-axis direction, λ1 is dominant. Therefore, light of a long wavelength is observed. By contrast, on the large angle side in the a-axis direction, λ2 and λ3 are dominant. Therefore, light of a short wavelength is observed. In this manner, the wavelength of light going out of a semiconductor light-emitting device including an active layer having the m-plane as a main plane varies in accordance with the angle from the normal direction (m-axis direction) or the outgoing direction from the main plane. Meanwhile, as shown in FIGS. 51B, 51C and 51D, as the particle concentration is increased to 0.4% by weight, 1.0% by weight and 3.0% by weight, the light emitting wavelength in the c-axis direction and the light emitting wavelength in the a-axis direction become closer so as to match each other.

Figure 52:
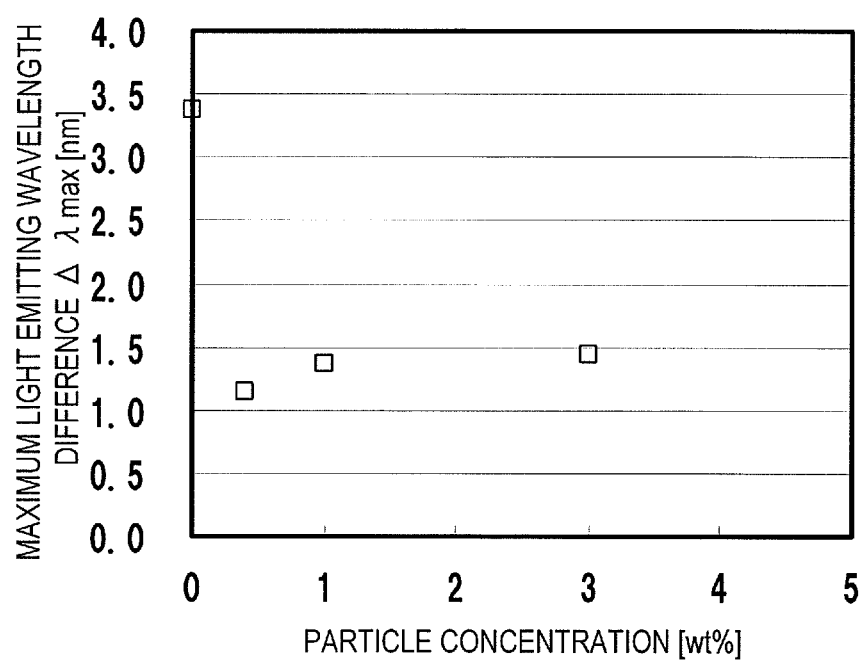
FIG. 52 shows the relationship between the particle concentration and the maximum light emitting wavelength difference of the semiconductor light-emitting devices in Example 7.

FIG. 52 shows the relationship of the particle concentration with respect to a difference between the maximum value and the minimum value of the light emitting wavelength in the c-axis direction and the light emitting wavelength in the a-axis direction in FIG. 51 (maximum light emitting wavelength difference Δλmax). A smaller Δλmax means a smaller anisotropy of the light emitting wavelength in accordance with the outgoing direction from the main plane. It is seen that since the first light-transmissive member contains particles, Δλmax is decreased.

Now, a wavelength converting member 130 was formed so as to cover the first light extraction plane 121 and a surface of the first light-transmissive member 124 of each of the four semiconductor light-emitting devices. Thus, four semiconductor light-emitting devices which output white light and are different in the particle concentration of the first light-transmissive member (white LEDs) were produced. The wavelength converting member was formed of a silicone resin containing 10% by weight of YAG. Specifically, a flat plate-like YAG-containing silicone resin having a thickness of 400 μm was produced, and cut into 3 mm-square pieces. The pieces were respectively bonded to the semiconductor light-emitting devices. The semiconductor light-emitting devices thus produced each had a color rendering index (CRI) of 71.4 to 73.0.

Figure 53A:
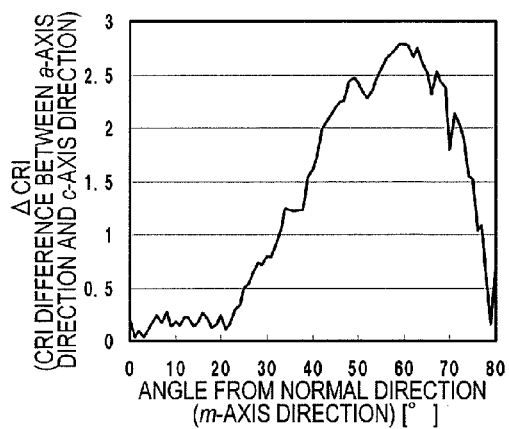
FIGS. 53A through 53D respectively show the relationship of the angle from the normal direction (m-axis direction) with respect to a difference in the color rendering index in the a-axis direction and in the c-axis direction of the semiconductor light-emitting devices in Example 7 which have particle concentrations of the first light-transmissive member of 0.0% by weight, 0.4% by weight, 1.0% by weight and 3.0% by weight.
Figure 53B:
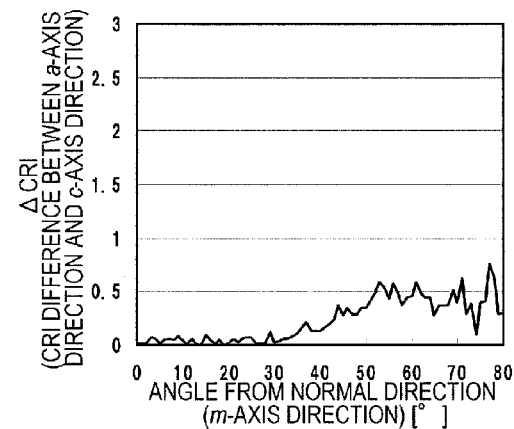
Figure 53C:
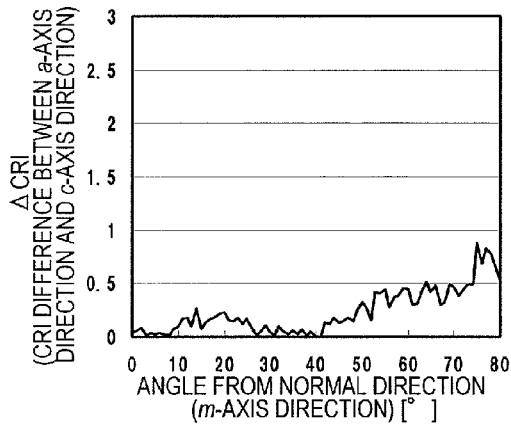
Figure 53D:
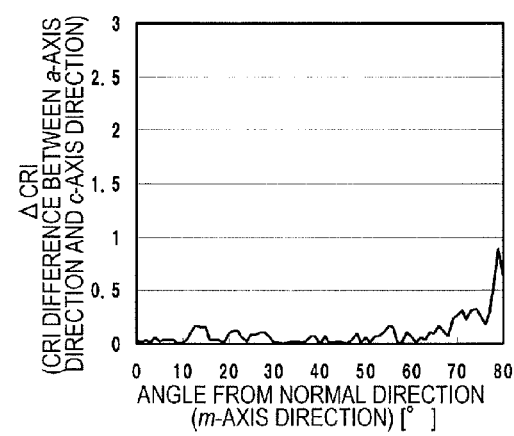

FIGS. 53A through 53D show the relationship of the angle from the normal direction (m-axis direction) with respect to the CRI difference ($\Delta$CRI) between in the c-axis direction and the a-axis direction of the semiconductor light-emitting devices having the respective particle concentrations. $\Delta$CRI means color non-uniformity in accordance with the outgoing direction. A smaller $\Delta$CRI means a smaller anisotropy of the color rendering index in accordance with the outgoing direction. As shown in FIG. 53A, when the particle concentration is 0.0% by weight, the color non-uniformity is large in the range of angles from the normal direction of 30° to 70°. A reason for this is that the light emitting intensity and the light emitting wavelength of the excited wavelength depends on the outgoing direction. It is seen that in a structure containing particles at an amount of 0.4% by weight or greater, the anisotropy of the color rendering index in accordance with the outgoing direction is decreased to about ¼.

As described above, it has been confirmed that use of the first light-transmissive member 124 containing particles can improve the anisotropy of the light emitting intensity and the anisotropy of the light emitting wavelength in accordance with the outgoing direction of the excited wavelength and thus can suppress the color non-uniformity at the time of wavelength conversion (anisotropy of the color rendering index in accordance with the outgoing direction).

Example 8

In Example 8, semiconductor light-emitting devices shown in FIGS. 26A and 26B were produced. The semiconductor light-emitting chip 100 shown in FIG. 26B was produced in substantially the same manner as in Example 1. The main plane is the m-plane. On a rear surface of the semiconductor light-emitting chip 100, namely, at the first light extraction plane 121, a resist was formed by use of lithography, and then projection and recess portions were formed dry etching by use of chlorine-based gas. The projection and recess portions each have a shape close to a semi-spherical shape having a height of 5 μm and a diameter of 10 μm. Like in Example 1, such semiconductor light-emitting chips 100 were flip-chip-mounted on the mounting substrate 101 formed of AlN. Thus, a plurality of semiconductor light-emitting devices were produced. The light emitting wavelength at an operating current of 5 mA was 450 nm.

Next, titanium oxide ($TiO_2$) STT-30EHJ (particle diameter: 30 to 50 nm) produced by Titan Kokyo, Ltd. was incorporated into silicone KER-2500 produced by Shin-Etsu Chemical Co., Ltd. to produce a light-transmissive member containing particles. The particle-containing light-transmissive member was formed only on side surfaces of the semiconductor light-emitting chip 100 by use of a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. The particle concentration of the particle-containing light-transmissive member was varied to 0.0% by weight, 0.4% by weight, 1.0% by weight or 3.0% by weight to produce four types of semiconductor light-emitting devices with no light emitting converting member 130 were first produced. Regarding these semiconductor light-emitting devices, the dependence of the light emitting intensity and the light emitting wavelength on the outgoing direction were examined.

Figure 54:
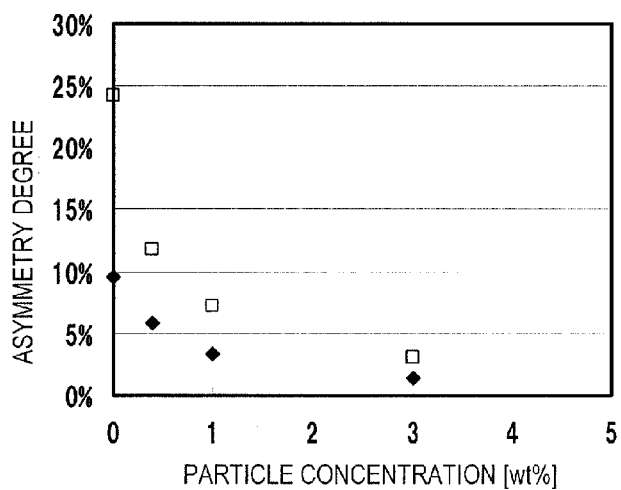
FIG. 54 shows the relationship between the particle concentration and each of the maximum asymmetry degree and the average asymmetry degree of semiconductor light emitting in Example 8.

FIG. 54 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. As can be seen from FIG. 54, as the particle concentration is increased, the maximum asymmetry degree and the average asymmetry are decreased. When the particle concentration exceeds 1.0%, the asymmetry degrees are almost stabilized.

Figure 55:
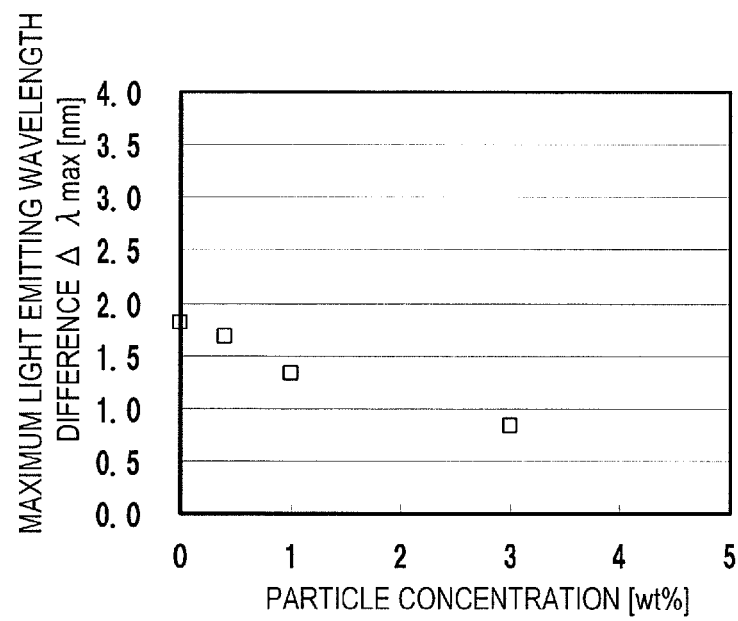
FIG. 55 shows the relationship between the particle concentration and the maximum light emitting wavelength difference of the semiconductor light-emitting devices in Example 8.

FIG. 55 shows the relationship of the particle concentration with respect to the maximum light emitting wavelength difference $\Delta\lambda$max between the light emitting wavelength in the c-axis direction and the light emitting wavelength in the a-axis direction. It is seen that since the first light-transmissive member contains particles, $\Delta\lambda$max is decreased.

Figure 56:
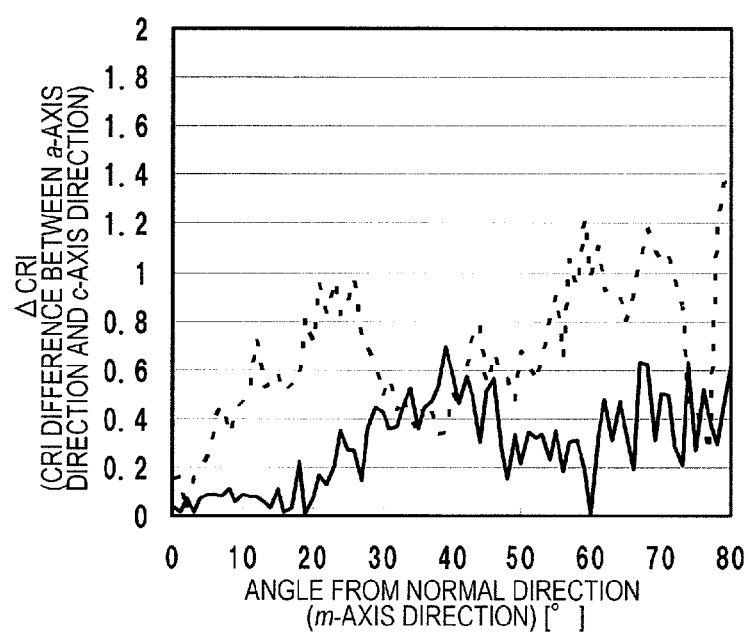
FIG. 56 shows the relationship of the angle from the normal direction (m-axis direction) with respect to a difference in the color rendering index in the a-axis direction and in the c-axis direction of the semiconductor light-emitting devices in Example 8.

Now, like in Example 7, a wavelength converting member 130 was formed so as to cover the first light extraction plane 121 and a surface of the first light-transmissive member 124 of each of the four semiconductor light-emitting devices. Thus, four semiconductor light-emitting devices which output white light and are different in the particle concentration of the first light-transmissive member (white LEDs) were produced. The wavelength converting member was formed of a silicone resin containing 10% by weight of YAG. FIG. 56 shows the relationship between $\Delta$CRI and the angle from the normal direction (m-axis direction) when the particle concentration is 0.0% by weight and 3.0% by weight. The dashed line represents the characteristic of the semiconductor light-emitting device having a particle concentration of 0.0% by weight, and the solid line represents the characteristic of the semiconductor light-emitting device having a particle concentration of 3.0% by weight. As can be seen FIG. 56, since the first light-transmissive member contains particles, the anisotropy of the color rendering index in accordance with the outgoing direction is decreased to about ½.

Example 9

In Example 9, semiconductor light-emitting devices shown in FIGS. 26A and 26B were produced.

First, on a wafer-state n-type GaN substrate having the (20-2-1) plane as a main plane, an n-type nitride semiconductor layer formed of n-type GaN and having a thickness of 2 μm, an active layer having a three-cycle quantum well structure having quantum well layers formed of InGaN and barrier layers formed of GaN, and a p-type nitride semiconductor layer formed of p-type GaN and having a thickness of 0.5 μm were formed by, for example, MOCVD. The (20-2-1) plane is a semi-polar plane.

As an n-side electrode, a Ti/Al layer was formed. As a p-side electrode, an Ag layer was formed. Then, a rear surface of the n-type GaN substrate was polished to provide a thickness of 100 μm.

Next, projection and recess portions each having a shape close to a semi-spherical shape having a height of 5 μm and a diameter of 10 μm were formed at the first light extraction plane in substantially the same manner as in Example 2.

Next, in the wafer having the light emitting structure formed thereon, a groove having a depth of about several tens of micrometers from the surface thereof was formed in the [10-14] direction and the [1-210] direction (a-axis direction) of the wafer by use of laser. Then, the wafer was broken to obtain semiconductor light-emitting chips 100 formed of an m-plane GaN-based semiconductor and having a side of 450 μm. In this structure, the ratio of the area size of the second light extraction plane 122 with respect to the area size of the first light extraction plane 121 is 44%.

The semiconductor light-emitting chips thus produced were mounted in substantially the same manner as in Example 1 to produce a plurality of semiconductor light-emitting devices. The light emitting wavelength at an operating current of 5 mA was 456 nm.

Next, titanium oxide ($TiO_2$) STT-30EHJ (particle diameter: 30 to 50 nm) produced by Titan Kokyo, Ltd. was incorporated into silicone KER-2500 produced by Shin-Etsu Chemical Co., Ltd. to produce a light-transmissive member containing particles. The particle-containing light-transmissive member was formed only on side surfaces of the semiconductor light-emitting chip 100 by use of a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. The particle concentration of the particle-containing light-transmissive member was varied to 0.0% by weight, 0.4% by weight, 1.0% by weight or 3.0% by weight to produce four types of semiconductor light-emitting devices with no light emitting converting member 130. The dependence of the light emitting intensity and the light emitting wavelength on the outgoing direction of these semiconductor light-emitting devices were examined.

Figure 57:
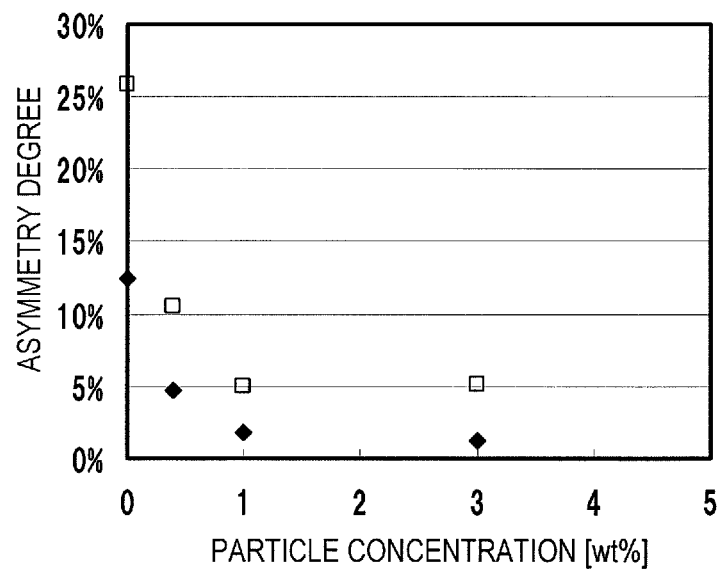
FIG. 57 shows the relationship between the particle concentration and each of the maximum asymmetry degree and the average asymmetry degree of semiconductor light-emitting devices in Example 9.

FIG. 57 shows the numerized symmetry between the light distribution characteristics in the a-axis direction and the light distribution characteristics in the [−101-4] direction, and shows the relationship between the particle concentration and each of the maximum asymmetry degree and the average asymmetry degree. White squares represent the maximum asymmetry degree, and black diamond shapes represent the average asymmetry degree. As can be seen from FIG. 57, as the particle concentration is increased, the maximum asymmetry degree and the average asymmetry are decreased. When the particle concentration exceeds 1.0%, the asymmetry degrees are almost stabilized.

Figure 58:
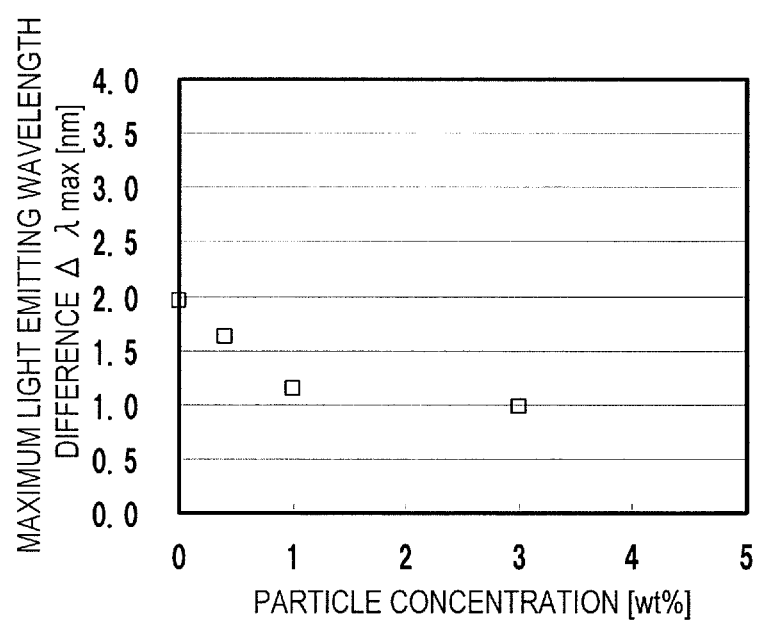
FIG. 58 shows the relationship between the particle concentration and the maximum light emitting wavelength difference of the semiconductor light-emitting devices in Example 9.

FIG. 58 shows the relationship of the particle concentration with respect to the maximum light emitting wavelength difference Δλmax between the light emitting wavelength in the [−101-4] direction and the light emitting wavelength in the a-axis direction. It is seen that since the first light-transmissive member contains particles, Δλmax is decreased. When the particle concentration exceeds 1.0%, the maximum light emitting wavelength difference Δλmax is almost stabilized.

Figure 59:
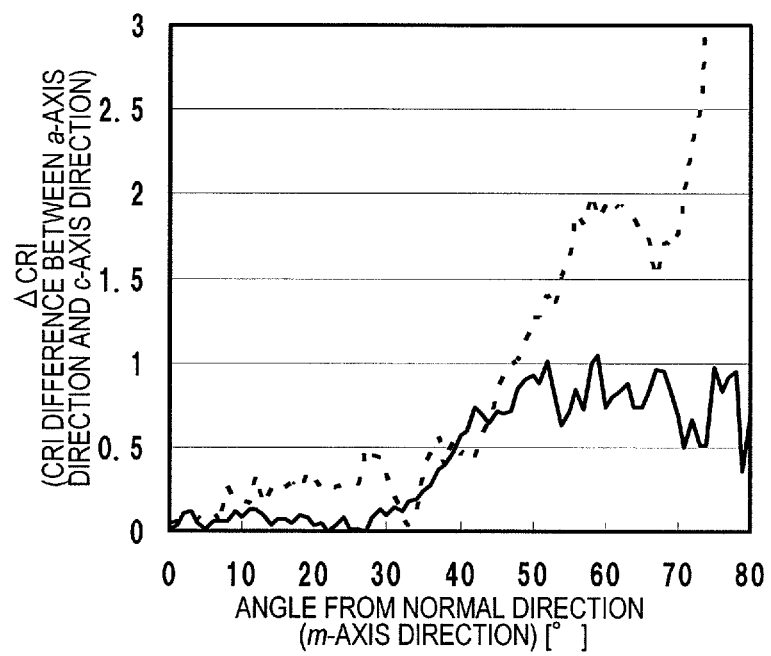
FIG. 59 shows the relationship of the angle from the normal direction (m-axis direction) with respect to a difference in the color rendering index in the a-axis direction and in the [−101-4] axis direction of the semiconductor light-emitting devices in Example 9.

Next, in substantially the same manner as in Example 7, a wavelength converting member 130 was formed so as to cover the first light extraction plane 121 and a surface of the first light-transmissive member 124 of each of the semiconductor light-emitting devices. Thus, a plurality of semiconductor light-emitting devices which output white light and are different in the particle concentration of the first light-transmissive member (white LEDs) were produced. The wavelength converting member was formed of a silicone resin containing 10% by weight of YAG. FIG. 59 shows the relationship between ΔCRI and the angle from the normal direction (m-axis direction) when the particle concentration of the first light-transmissive member 124 is 0.0% by weight and 3.0% by weight. ΔCRI represents a difference between the CRI in the [−101-4] direction and the CRI in the a-axis direction. The dashed line represents the characteristic of the semiconductor light-emitting device having a particle concentration of 0.0% by weight, and the solid line represents the characteristic of the semiconductor light-emitting device having a particle concentration of 3.0% by weight. As can be seen FIG. 59, since the first light-transmissive member contains particles, the anisotropy of the color rendering index in accordance with the outgoing direction is decreased to about ½.

Example 10

In Example 10, semiconductor light-emitting devices shown in FIG. 23 were produced. The semiconductor light-emitting chip 100 shown in FIG. 23 was produced in substantially the same manner as in Example 1. The main plane is the m-plane. Like in Example 1, such semiconductor light-emitting chips 100 were flip-chip-mounted on the mounting substrate 101 formed of AlN. Thus, a plurality of semiconductor light-emitting devices were produced. The light emitting wavelength at an operating current of 10 mA was 450 nm.

Next, zinc oxide (ZnO) ZS-032-D (particle diameter: 25 nm) produced by Showa Denko K.K. was incorporated into silicone KER-2500 produced by Shin-Etsu Chemical Co., Ltd. to produce a light-transmissive member containing particles. The particle-containing light-transmissive member was formed only on side surfaces of the semiconductor light-emitting chip 100 by use of a dispenser. Herein, the side surfaces of the semiconductor light-emitting chip 100 correspond to the second light extraction planes 122 and the third light extraction planes 123 in the embodiments. The first light extraction plane 121 is not covered with the particle-containing light-transmissive member. The ZnO particle concentration of the particle-containing light-transmissive member was varied to 0.0% by weight, 0.4% by weight, 1.0% by weight or 3.0% by weight. The density of silicone is about 1 $g/cm^3$, and the density of ZnO is about 5.61 $g/cm^3$. Therefore, a value obtained by dividing the value of percent by weight with 5.61 corresponds to the value of percent by volume. Thus, four types of semiconductor light-emitting devices with no wavelength converting member 130 were produced. The dependence of the light emitting intensity and the light emitting wavelength on the outgoing direction of these semiconductor light-emitting devices were examined.

Figure 60:
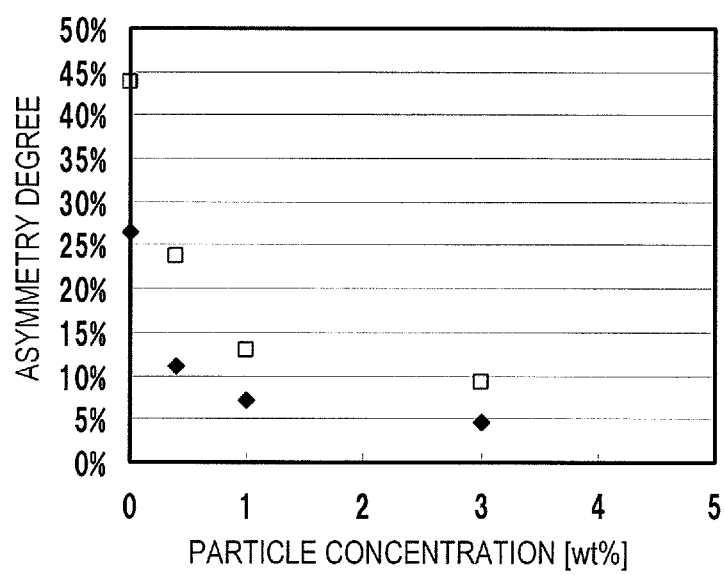
FIG. 60 shows the relationship between the particle concentration and each of the maximum asymmetry degree and the average asymmetry degree of semiconductor light-emitting devices in Example 10.

FIG. 60 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. As can be seen from FIG. 60, as the particle concentration is increased, the maximum asymmetry degree and the average asymmetry are decreased. When the particle concentration exceeds 1.0%, the asymmetry degrees are almost stabilized.

Figure 61:
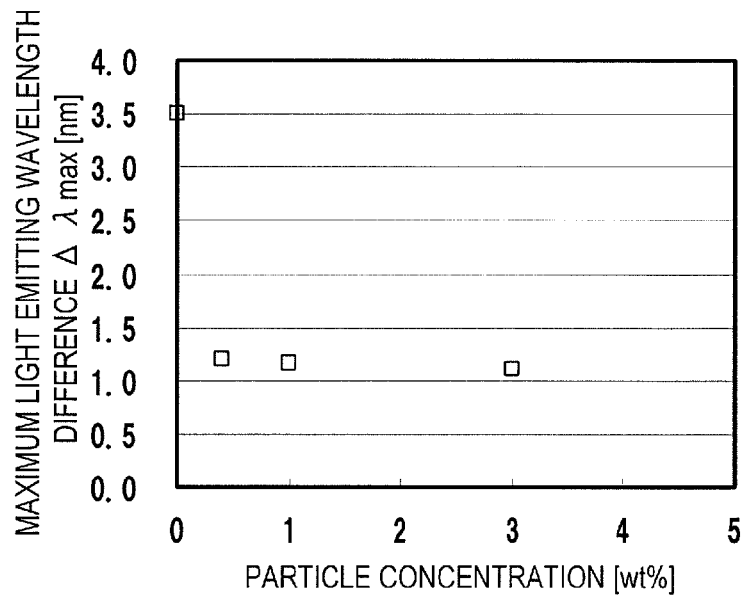
FIG. 61 shows the relationship between the particle concentration and the maximum light emitting wavelength difference of the semiconductor light-emitting devices in Example 10.

FIG. 61 shows the relationship of the particle concentration with respect to the maximum light emitting wavelength difference Δλmax between the light emitting wavelength in the c-axis direction and the light emitting wavelength in the a-axis direction. It is seen that since the first light-transmissive member contains particles, Δλmax is decreased. When the particle concentration exceeds 0.4%, the maximum light emitting wavelength difference Δλmax is almost stabilized.

Figure 62:
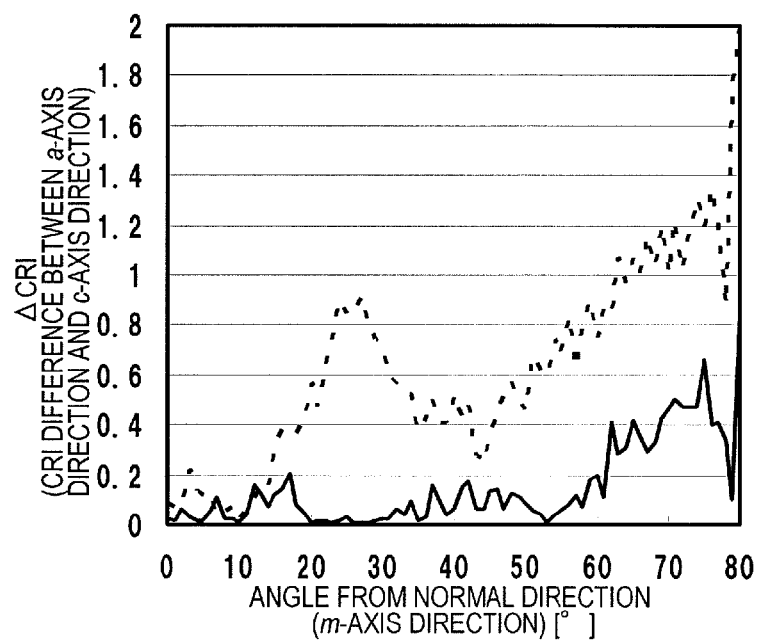
FIG. 62 shows the relationship of the angle from the normal direction (m-axis direction) with respect to a difference in the color rendering index in the a-axis direction and in the c-axis direction of the semiconductor light-emitting devices in Example 10.

Next, in substantially the same manner as in Example 1, white LEDs were produced. The wavelength converting member 130 was formed of a silicone resin containing 10% by weight of YAG. FIG. 62 shows the relationship between ΔCRI and the angle from the normal direction (m-axis direction) when the particle concentration is 0.0% by weight and 3.0% by weight. The dashed line represents the characteristic of the semiconductor light-emitting device having a particle concentration of 0.0% by weight, and the solid line represents the characteristic of the semiconductor light-emitting device having a particle concentration of 3.0% by weight. It is seen that since the light-transmissive member contains particles, the anisotropy of the color rendering index in accordance with the outgoing direction is decreased to about ½.

Example 11

In Example 11, semiconductor light-emitting devices shown in FIG. 24 were produced. From Examples 1 through 4, it was found that the anisotropy of the color rendering index of the wavelength-converted spectrum in accordance with the outgoing direction can be decreased by decreasing (improving) the anisotropy of the light emitting intensity and the anisotropy of the light emitting wavelength of the excited wavelength spectrum in accordance with the outgoing direction. In this example, the particle concentration, the asymmetry degree, the maximum light emitting wavelength, and the decrease amount of the optical output were studied in detail while the excited wavelength spectrum is paid attention to.

A semiconductor light-emitting chip having the m-plane as a main plane was produced in substantially the same manner as in Example 1. The semiconductor light-emitting chip was mounted on a mounting substrate formed of AlN in substantially the same manner as in Example 1. On side surfaces of the semiconductor light-emitting chip, a light-transmissive member containing titanium oxide (first light-transmissive member 124) was located. A silicone resin (second light-transmissive member 126) having a shape close to a semi-spherical shape and a diameter of 2.2 mm was formed so as to cover the first light extraction plane 121 and a surface of the first light-transmissive member 124. The wavelength converting member 130 was not formed such that the excited wavelength spectrum would be paid attention to. Eight types of semiconductor light-emitting devices having titanium oxide particle concentrations of 0.0% by weight, 0.2% by weight, 0.4% by weight, 0.7% by weight, 1.0% by weight, 3.0% by weight, 10.0% by weight and 15.0% by weight were produced.

Figure 63:
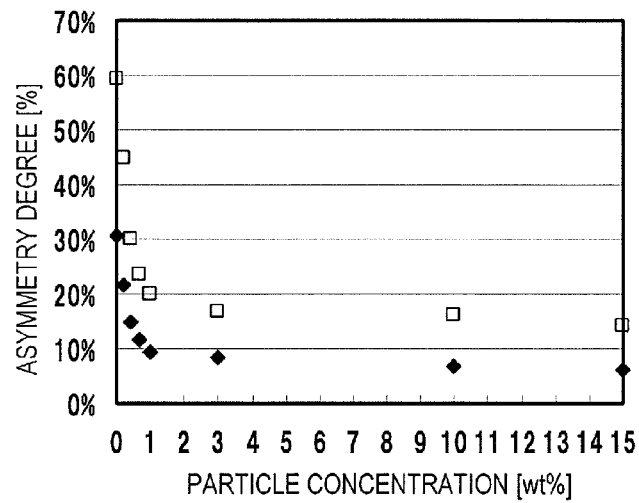
FIG. 63 shows the relationship between the particle concentration and each of the maximum asymmetry degree and the average asymmetry degree of semiconductor light-emitting devices in Example 11.

FIG. 63 shows the numerized symmetry between the light distribution characteristics in the a-axis direction and the light distribution characteristics in the c-axis direction, and shows the relationship between the particle concentration and each of the maximum asymmetry degree and the average asymmetry degree. White squares represent the maximum asymmetry degree, and black diamond shapes represent the average asymmetry degree. As can be seen from FIG. 63, when the particle concentration of the first light-transmissive member is 0.2% by weight, an effect of decreasing the asymmetry degree is provided. Until the particle concentration is about 0.7%, the maximum asymmetry degree and the average asymmetry degree are rapidly decreased (improved). When the particle concentration is 1.0% by weight or greater, the maximum asymmetry degree and the average asymmetry degree are slowly improved. Therefore, in order to decrease the anisotropy of the light emitting intensity of the excited wavelength spectrum in accordance with the outgoing direction, the particle concentration may be 0.2% by weight or greater, or further 0.7% by weight or greater. When converted into the volume, the particle concentration of the first light-transmissive member may be 0.047% by volume or greater, or further 0.164% by volume or greater.

Figure 64:
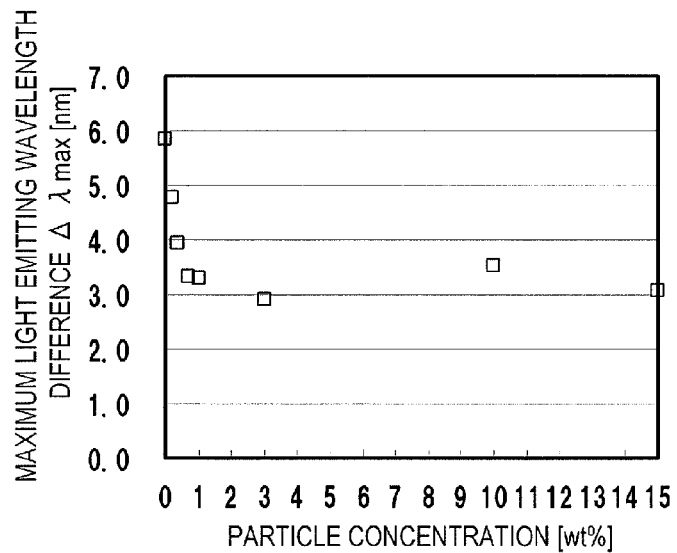
FIG. 64 shows the relationship between the particle concentration and the maximum light emitting wavelength difference of the semiconductor light-emitting devices in Example 11.

FIG. 64 shows the relationship of the particle concentration with respect to the maximum light emitting wavelength difference Δλmax between the light emitting wavelength in the c-axis direction and the light emitting wavelength in the a-axis direction. When the particle concentration of the first light-transmissive member is 0.2% by weight, an effect of improving Δλmax is provided. Until the particle concentration is about 0.7%, Δλmax is rapidly decreased (improved). When the particle concentration is 1.0% by weight or greater, Δλmax is almost constant. Therefore, in order to decrease the anisotropy of the light emitting wavelength of the excited wavelength spectrum in accordance with the outgoing direction, the particle concentration may be 0.2% by weight or greater, or further 0.7% by weight or greater. When converted into the volume, the particle concentration of the first light-transmissive member may be 0.047% by volume or greater, or further 0.164% by volume or greater.

Figure 65:
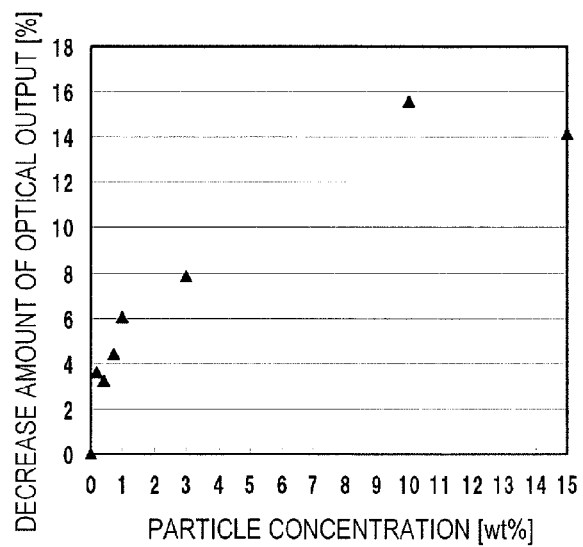
FIG. 65 shows the relationship between the particle concentration and the decrease amount of the optical output of the semiconductor light-emitting devices in Example 11.

FIG. 65 shows the relationship between the particle concentration and the decrease amount of the optical output. The vertical axis represents the decrease amount of the optical output with the optical output when the particle concentration is 0.0% by weight being 100%. Light going out of the second light extraction plane 122 is scattered and further absorbed by the particles 125b. Therefore, as the particle concentration is increased, the optical output is decreased. In order to make the decrease in the optical output less than 10%, the particle concentration may be 3% by weight or less. When converted into the volume, the particle concentration may be 0.704% by volume or less.

Considering together the effect of improving the anisotropy of the light emitting intensity found from the results shown in FIG. 63 and the effect of improving the anisotropy of the light emitting wavelength found from the results shown in FIG. 64, the particle concentration may be not less than 0.2% by weight and not more than 3.0% by weight, or not less than 0.7% by weight and not more than 3.0%. When converted into the volume, the particle concentration may be not less than 0.047% by volume and not more than 0.704% by volume, or not less than 0.164% by volume and not more than 0.704%.

Comparative Example 2

In order to confirm the effect of improving the light emitting characteristic in this example, the light emitting characteristic of a conventional semiconductor light-emitting device was measured. First, the relationship between the crystalline axis and the measuring direction at the time of measuring the anisotropy of the light emitting intensity and the anisotropy of the light emitting wavelength will be described with reference to FIG. 66.

Figure 66A:
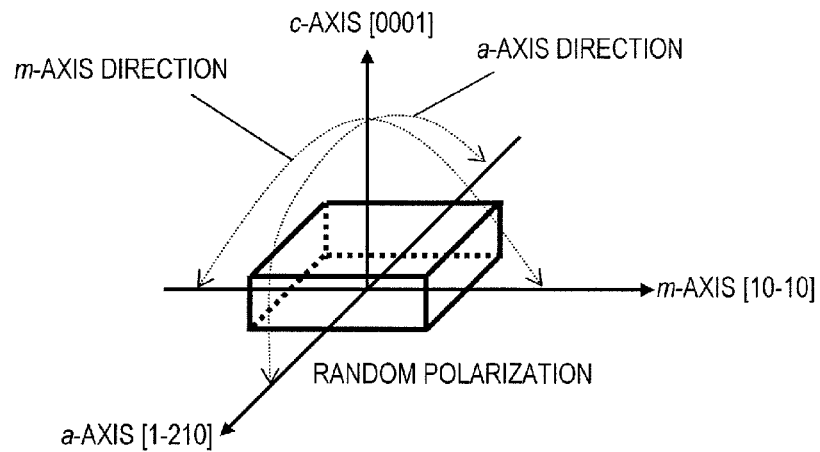
FIGS. 66A through 66C each show the relationship between the crystalline axis and the measuring direction at the time of measuring the characteristics (light distribution characteristic, wavelength characteristic, ΔCRI) of nitride semiconductor light-emitting devices in a comparative example.
Figure 66B:
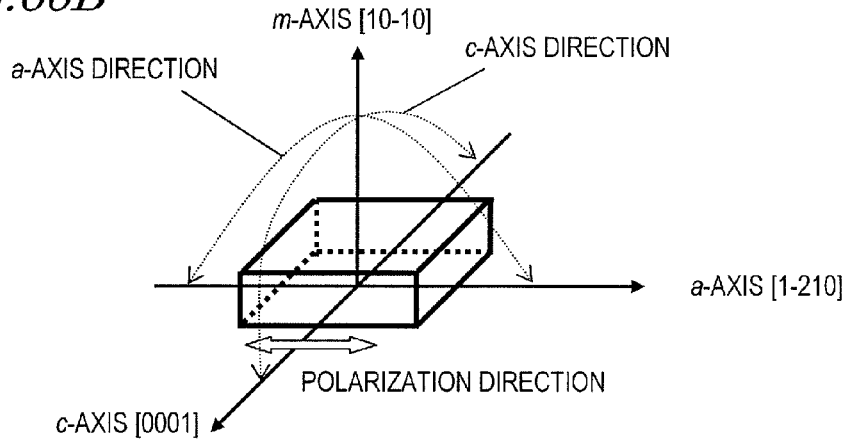
Figure 66C:
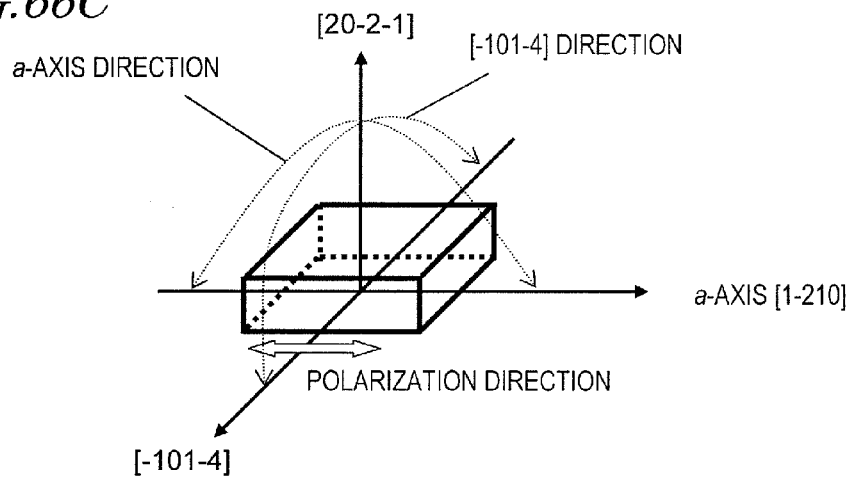

FIGS. 66A through 66C each show the relationship between the crystalline axis and the measuring direction at the time of measuring the characteristics (light distribution characteristic, wavelength characteristic, ΔCRI).

FIG. 66A shows the relationship between the crystalline axis and the measuring direction in a semiconductor light-emitting device provided as a first comparative example which includes an active layer having the m-plane as a main plane. In this case, the characteristic in the m-axis direction is a result of measurement performed with the a-axis being the center axis. The characteristic in the a-axis direction is a result of measurement performed with the m-axis being the center axis. In this case, the angle is the angle from the c-axis.

FIG. 66B shows the relationship between the crystalline axis and the measuring direction in a semiconductor light-emitting device provided as a second comparative example which includes an active layer having the m-plane as a main plane. In this case, the characteristic in the a-axis direction is a result of measurement performed with the c-axis being the center axis. The characteristic in the c-axis direction is a result of measurement performed with the a-axis being the center axis. In this case, the angle is the angle from the m-axis.

FIG. 66C shows the relationship between the crystalline axis and the measuring direction in a semiconductor light-emitting device provided as a third comparative example which includes an active layer having the [20-2-1] plane as a main plane. In this case, the characteristic in the a-axis direction is a result of measurement performed with the [−101-4] axis being the center axis. The characteristic in the [−101-4] direction is a result of measurement performed with the a-axis being the center axis. In this case, the angle is the angle from the [20-2-1] axis.

(Nitride Semiconductor Light-Emitting Device Having the c-Plane as a Main Plane)

A nitride semiconductor light-emitting device including an active layer having the c-plane as a main plane was produced in substantially the same manner as in Example 1. The nitride semiconductor light-emitting device was cut along the m-axis direction and the a-axis direction.

Figure 67A:
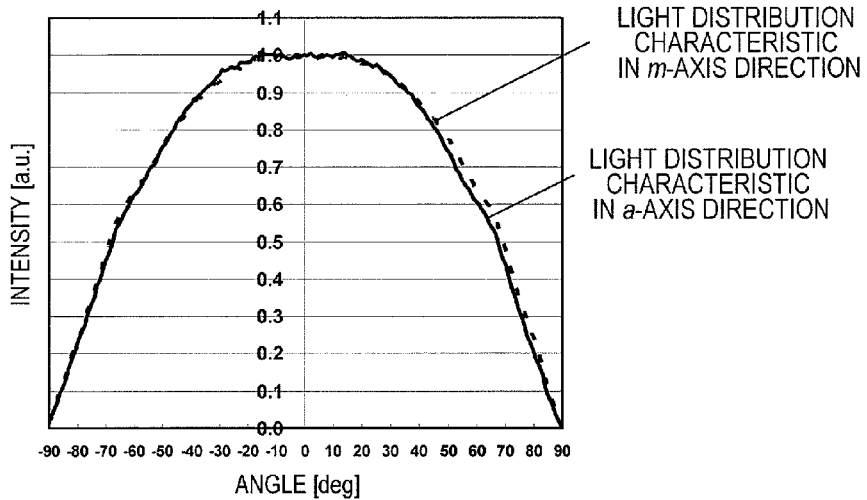
FIGS. 67A through 67C respectively show the light distribution characteristic, the wavelength characteristic, and the Δλ characteristic of a conventional nitride semiconductor light-emitting device having the c-plane as a main plane.

FIG. 67A shows results of measurement of the light distribution characteristic of the nitride semiconductor light-emitting device including an active layer having the c-plane as a main plane. The vertical axis represents a value normalized by the luminous intensity at an angle of 0°. The horizontal axis represents the angle from the c-axis direction. The profile of the light distribution characteristic in the m-axis direction and the profile of the light distribution characteristic in the a-axis direction are almost the same as each other. As can be seen, the conventional nitride semiconductor light-emitting device having the c-plane as a main plane does not have the problem of the anisotropy of the light emitting intensity in accordance with the outgoing direction.

Figure 67B:
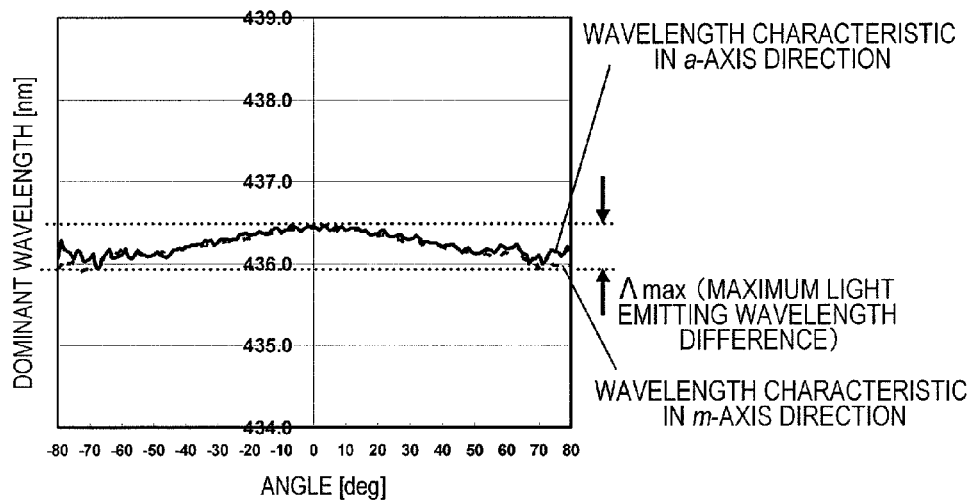

FIG. 67B shows the wavelength characteristics in the m-axis direction and the a-axis direction of the nitride semiconductor light-emitting device including an active layer having the c-plane as a main plane. The vertical axis represents the dominant wavelength. The horizontal axis represents the angle from the c-axis direction. The profile of the wavelength characteristic in the m-axis direction and the profile of the wavelength characteristic in the a-axis direction are almost the same as each other. As can be seen, the conventional nitride semiconductor light-emitting device having the c-plane as a main plane does not have the problem of the anisotropy of the light emitting wavelength in accordance with the outgoing direction. The maximum light emitting wavelength difference Δmax is as small as 0.5 nm. The maximum light emitting wavelength difference represents the color non-uniformity of a single nitride semiconductor light-emitting device, and is considered as not being caused by the anisotropy of the light emitting wavelength.

Figure 67C:
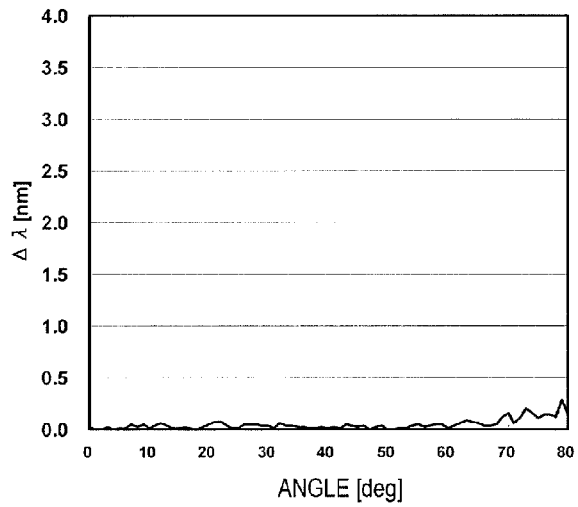

FIG. 67C shows the difference in the dominant wavelength at various angles from the c-axis direction. In other words, FIG. 67C shows the wavelength difference Δλ at each of the angles in FIG. 67B. As the angle from the c-axis direction is increased, Δλ tends to be increased. However, the wavelength difference is 0.25 nm, which is sufficiently small.

(Nitride Semiconductor Light-Emitting Device Having the m-Plane as a Main Plane)

A nitride semiconductor light-emitting device having the m-plane as a main plane was produced in substantially the same manner as in Example 1. The m-plane is a non-polar plane. The nitride semiconductor light-emitting device was cut along the c-axis direction and the a-axis direction.

Figure 68A:
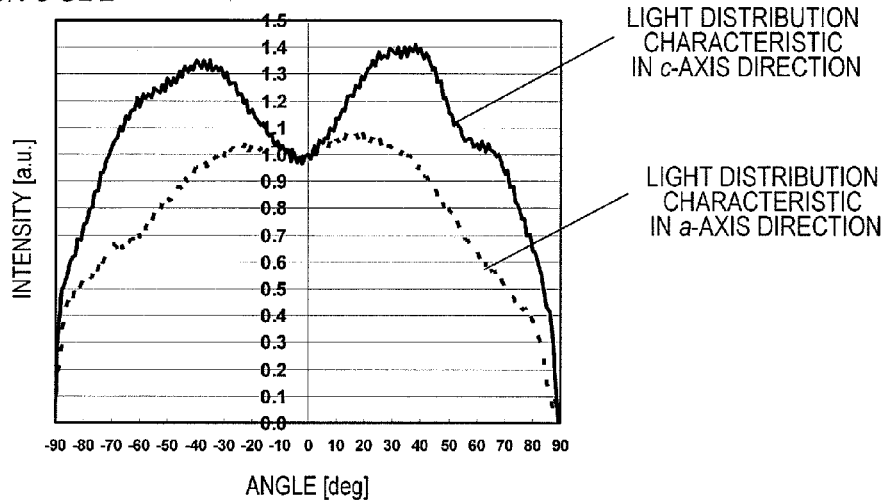
FIGS. 68A through 68C respectively show the light distribution characteristic, the wavelength characteristic, and the Δλ characteristic of a conventional nitride semiconductor light-emitting device having the m-plane as a main plane.

FIG. 68A shows results of measurement of the light distribution characteristic of the nitride semiconductor light-emitting device including an active layer having the m-plane as a main plane. The vertical axis represents a value normalized by the luminous intensity at an angle of 0°. The horizontal axis represents the angle from the a-axis direction. The light distribution characteristic in the c-axis direction and the light distribution characteristic in the a-axis direction are completely different from each other. As can be seen, the nitride semiconductor light-emitting device including the active layer having the m-plane as a main plane has the problem of the anisotropy of the light emitting intensity in accordance with the outgoing direction.

Figure 68B:
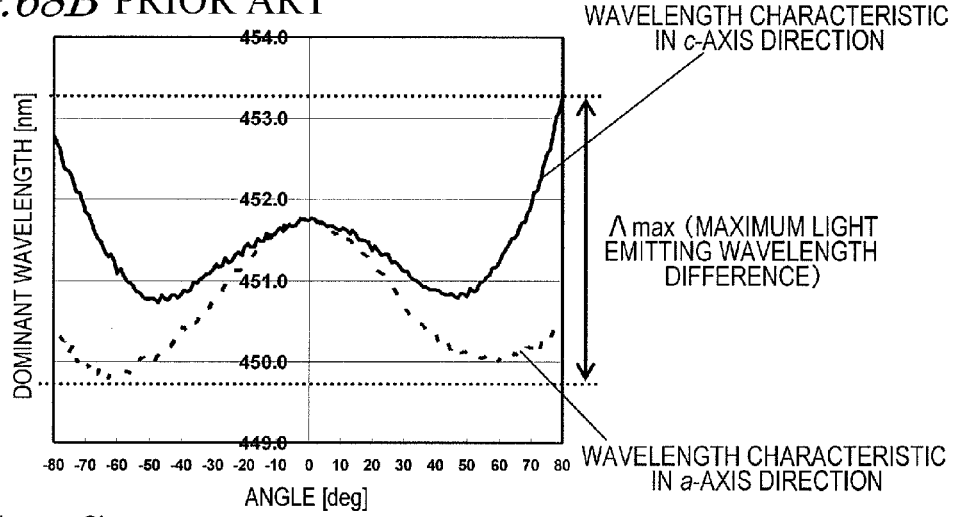

FIG. 68B shows the wavelength characteristics in the c-axis direction and the a-axis direction of the nitride semiconductor light-emitting device including an active layer having the m-plane as a main plane. The vertical axis represents the dominant wavelength. The horizontal axis represents the angle from the m-axis direction. The wavelength characteristic in the c-axis direction and the wavelength characteristic in the a-axis direction are totally different from each other. As can be seen, the nitride semiconductor light-emitting device including the active layer having the m-plane as a main plane has the anisotropy of the light emitting wavelength in accordance with the outgoing direction. The maximum light emitting wavelength difference Δmax reaches 3.2 nm. This value is at least six times the value of a conventional semiconductor light-emitting device including an active layer having the m-plane as a main plane. It is seen that that the semiconductor light-emitting device, although being a single device, has a large color non-uniformly.

Figure 68C:
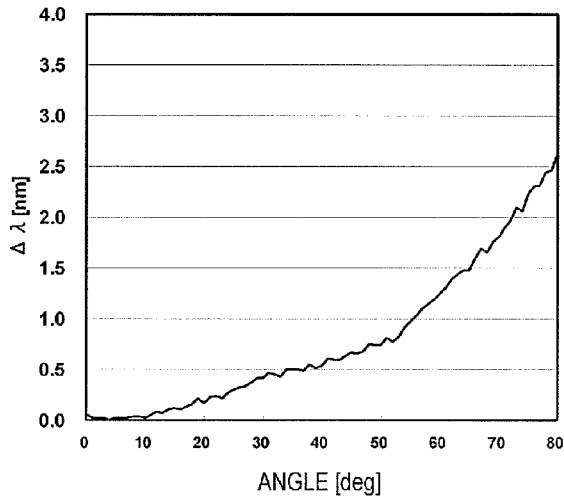

FIG. 68C shows the difference in the dominant wavelength at various angles from the m-axis direction. In other words, FIG. 68C shows the wavelength difference Δλ at each of the angles in FIG. 68B. As the angle from the m-axis direction is increased, Δλ tends to be increased. The wavelength difference reaches 2.6 nm. This value is at least ten times the value of a conventional semiconductor light-emitting device including an active layer having the m-plane as a main plane.

(Nitride Semiconductor Light-Emitting Device Having the (20-2-1) Plane as a Main Plane)

A nitride semiconductor light-emitting device having the (20-2-1) plane as a main plane was produced in substantially the same manner as in Example 3. The (20-2-1) plane is a semi-polar plane. The nitride semiconductor light-emitting device was cut along the [−101-4] direction and the a-axis direction.

Figure 69A:
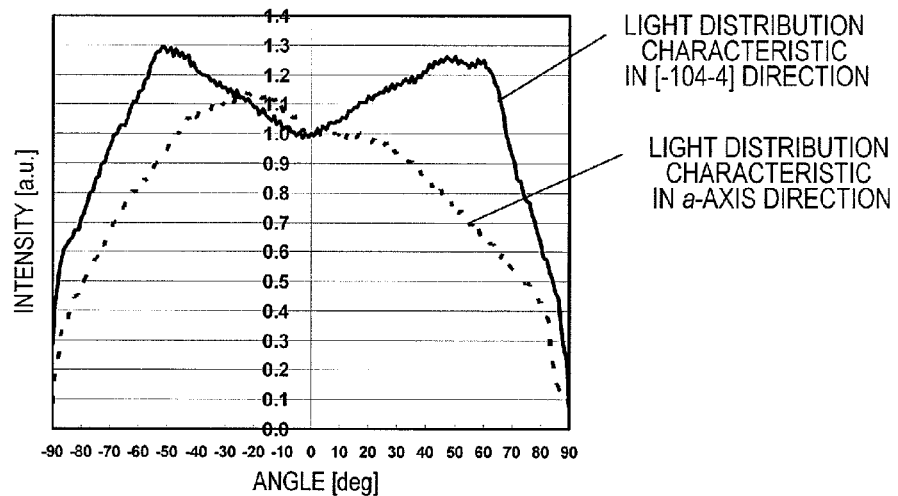
FIGS. 69A through 69C respectively show the light distribution characteristic, the wavelength characteristic, and the Δλ characteristic of a conventional nitride semiconductor light-emitting device having the (20-2-1) plane as a main plane.

FIG. 69A shows results of measurement of the light distribution characteristic of the nitride semiconductor light-emitting device including an active layer having the (20-2-1) plane as a main plane. The vertical axis represents a value normalized by the luminous intensity at an angle of 0°. The horizontal axis represents the angle from the [20-2-1] direction. The light distribution characteristic in the [−1-104] direction and the light distribution characteristic in the a-axis direction are completely different from each other. As can be seen, the nitride semiconductor light-emitting device including the active layer having the (20-2-1) plane as a main plane has the anisotropy of the light emitting intensity in accordance with the outgoing direction.

Figure 69B:
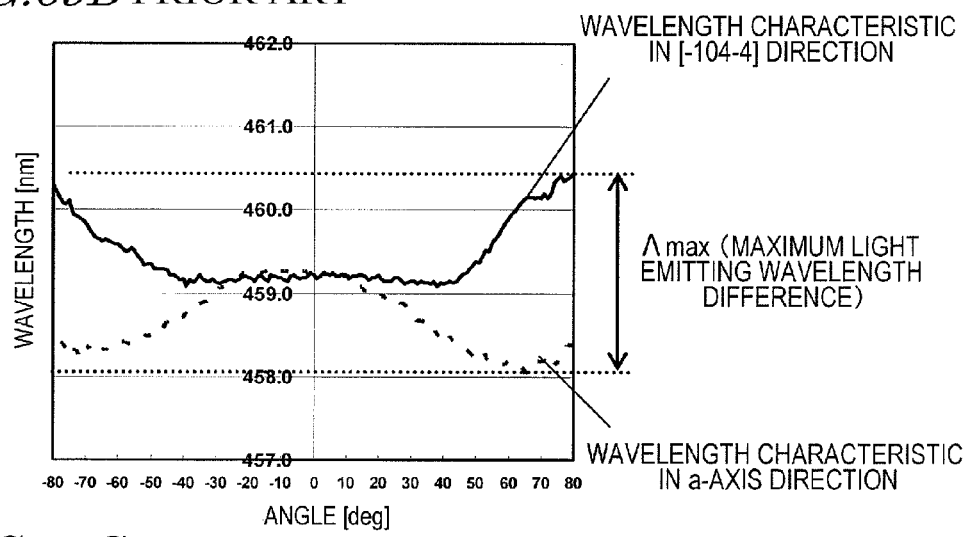

FIG. 69B shows the wavelength characteristics in the [−101-4] direction and the a-axis direction of the nitride semiconductor light-emitting device including an active layer having the m-plane as a main plane. The vertical axis represents the dominant wavelength. The horizontal axis represents the angle from the m-axis direction. The wavelength characteristic in the [−101-4] direction and the wavelength characteristic in the a-axis direction are totally different from each other. As can be seen, the nitride semiconductor light-emitting device including the active layer having the (20-2-1) plane as a main plane has the anisotropy of the light emitting wavelength in accordance with the outgoing direction. The maximum light emitting wavelength difference Δmax reaches 2.4 nm. This value is about five times the value of a conventional semiconductor light-emitting device including an active layer having the m-plane as a main plane. It is seen that that the semiconductor light-emitting device, although being a single device, has a large color non-uniformly.

Figure 69C:
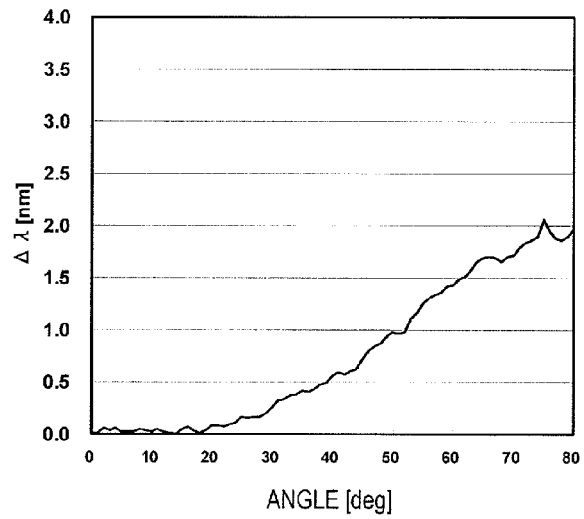

FIG. 69C shows the difference in the dominant wavelength at various angles from the m-axis direction. In other words, FIG. 69C shows the wavelength difference Δλ at each of the angles in FIG. 69B. As the angle from the m-axis direction is increased, Δλ tends to be increased. The wavelength difference reaches 2.0 nm. This value is about eight times the value of a conventional semiconductor light-emitting device including an active layer having the m-plane as a main plane.

As described above, in the embodiments according to the present disclosure, the first light-transmissive member covers at least a part of the second light extraction planes of the semiconductor light-emitting chip. Therefore, light is scattered by the first light-transmissive member, and thus the dependence of the light emitting wavelength on an outgoing direction which is parallel to the crystal growth direction of the active layer is decreased. Thus, the color non-uniformity of the light going out of the semiconductor light-emitting device can be suppressed.

Another Embodiment

According to a first aspect of the another embodiment, a nitride semiconductor light-emitting device includes a nitride semiconductor light-emitting chip including an active layer for outputting polarized light, the active layer having a non-polar plane or a semi-polar plane as a growth plane. The nitride semiconductor light-emitting device includes a first light-transmissive member located in an area, among areas to the side of the nitride semiconductor light-emitting chip, and in a direction perpendicular to a polarization direction of the polarized light, the first light-transmissive member transmitting light from the active layer; a wavelength converting member for converting a wavelength of the polarized light from the active layer. The first light-transmissive member includes a substrate and particles having a refractive index different from that of the substrate, and transmits the polarized from the active layer.

According to a second aspect of the another embodiment, in the first aspect, the first light-transmissive member includes the plurality of particles at not less than 0.2% by weight and not more than 15% by weight.

According to a third aspect of the another embodiment, in the first or second aspect, in the case where an elliptical shape which has a shorter axis in the polarization direction and a longer axis in a direction perpendicular to the polarization direction and has a centroid of the nitride semiconductor light-emitting chip as the center is defined as seen in a plan view parallel to the growth plane; and a longer radius of the longer axis is α represented by the following expression 1, a shorter radius of the shorter axis is β represented by the following expression 2, the first light-transmissive member has an absorption coefficient A[cm$^{-1}$], and one side of the nitride semiconductor light-emitting chip has a length of L; the plurality of particles are present in at least a part of the first light-transmissive member that is located in the elliptical shape:

$$\alpha=2.3/A+L/2 \qquad \text{expression 1}$$

$$\beta=\alpha/2=(2.3/A+L/2)/2 \qquad \text{expression 2}$$

According to a fourth aspect of the another embodiment, in any one of the first through third aspects, the plurality of particles have a concentration by weight that is in the range of not less than 0.2% by weight and not more than 3.0% by weight.

According to a fifth aspect of the another embodiment, in any one of the first through fourth aspects, the plurality of particles have a concentration by weight that is in the range of not less than 0.7% by weight and not more than 3.0% by weight.

According to a sixth aspect of the another embodiment, in any one of the first through fifth aspects, the plurality of particles have an average particle diameter of not less than 10 nm and not more than 3000 nm.

According to a seventh aspect of the another embodiment, in any one of the first through sixth aspects, the plurality of particles are formed of at least one material selected from the group including $TiO_2$, $SiO_2$, $ZrO_2$, $Nb_2O_5$, $ZnO$, $Al_2O_3$ and AlN.

According to an eighth aspect of the another embodiment, in any one of the first through seventh aspects, the nitride semiconductor light-emitting chip includes a first light extraction plane, which is a top surface thereof, and a second light extraction plane, which is a side surface and is parallel to the polarization direction of the polarized light. The second light extraction plane is in contact with the first light extraction plane or faces the first light extraction plane while another member or a space is had therebetween.

According to a ninth aspect of the another embodiment, in the eighth aspect, a ratio of an area size of the second light extraction plane to an area size of the first light extraction plane is 40% or greater.

According to a tenth aspect of the another embodiment, in the eighth or ninth aspect, a plurality of projection and recess portions are formed on the first light extraction plane.

According to an eleventh aspect of the another embodiment, in the tenth aspect, the plurality of projection and recess portions include semi-spherical recess or projection portions.

According to a twelfth aspect of the another embodiment, in the eleventh aspect, the plurality of projection and recess portions include striped recess or projection portions as seen in a plan view parallel to the growth plane.

According to a thirteen aspect of the another embodiment, in the twelfth aspect, a direction in which the striped projection and recess portions extend makes an angle of 0 degrees or greater and less than 5 degrees with respect to the polarization direction of the active layer.

According to a fourteenth aspect of the another embodiment, in the twelfth aspect, a direction in which the striped projection and recess portions extend makes an angle of 5 degrees or greater and 90 degrees or less with respect to the polarization direction of the active layer.

According to a fifteenth aspect of the another embodiment, in any one of the eighth through fourteenth aspects, at least 50% of light going out of the second light extraction plane is incident on the first light-transmissive member.

According to a sixteenth aspect of the another embodiment, in any one of the eighth through fourteenth aspects, the first light-transmissive member does not cover the first light extraction plane.

According to a seventeenth aspect of the another embodiment, in any one of the eighth through sixteenth aspects, the nitride semiconductor light-emitting device of further includes a second light-transmissive member for covering the entirety of a surface of the wavelength converting member that is faced to a surface facing the semiconductor light-emitting chip.

According to an eighteenth aspect of the another embodiment, in the seventeenth aspect, the second light-transmissive member has a diffuse-transmittance smaller than that of the first light-transmissive member.

A semiconductor light emitting according to the present disclosure is usable for, for example, a liquid crystal projector light source device, a backlight device of a light emitting diode (LED).

While the present disclosure has been described with respect to exemplary embodiments thereof, it will be apparent to those skilled in the art that the disclosed disclosure may be modified in numerous ways and may assume many embodiments other than those specifically described above. Accordingly, it is intended by the appended claims to cover all variations of the disclosure that fall within the true spirit and scope of the disclosure.

What is claimed is:

1. A nitride semiconductor light-emitting diode, comprising:
   a nitride semiconductor light-emitting chip including an active layer for outputting polarized light, the active layer having a non-polar plane or a semi-polar plane as a growth plane;
   a first light-transmissive member for transmitting light from the active layer, the first light-transmissive member being arranged at a side surface of the nitride semiconductor light-emitting chip, the side surface being located in a direction perpendicular to a polarization direction of the polarized light; and
   a wavelength converting member for converting a wavelength of the polarized light which has emitted from the active layer; and
   wherein:
   the first light-transmissive member includes a light-transmissive substrate and a plurality of particles,
   the plurality of particles have a refractive index different from that of the light-transmissive substrate,
   the first light-transmissive member includes the plurality of particles at not less than 0.4% by weight and not more than 15% by weight,
   the plurality of particles are formed of at least one material selected from the group consisting of $TiO_2$, $SiO_2$, $ZrO_2$, $Nb_2O_5$, ZnO, $Al_2O_3$ and AlN,
   the first light-transmissive member does not include a fluorescent material,
   the wavelength converting member contains a fluorescent material,
   the wavelength converting layer is plate-like,
   the plate-like wavelength converting layer covers the nitride semiconductor light-emitting chip,
   the first-transmissive member is not interposed between the nitride semiconductor light-emitting chip and the plate-like wavelength converting layer, when viewed in a cross-sectional view of the nitride semiconductor light-emitting diode, and
   the plate-like wavelength converting layer is parallel to the active layer, when viewed in a cross-sectional view of the nitride semiconductor light-emitting diode.

2. The nitride semiconductor light-emitting diode of claim 1, wherein:
   in the case where an elliptical shape which has a shorter axis in the polarization direction and a longer axis in a direction perpendicular to the polarization direction and has a centroid of the nitride semiconductor light-emitting chip as the center is defined as seen in a plan view parallel to the growth plane; and a longer radius of the longer axis is α represented by the following expression 1, a shorter radius of the shorter axis is β represented by the following expression 2, the first light-transmissive member has an absorption coefficient A[cm$^{-1}$], and one side of the nitride semiconductor light-emitting chip has a length of L;
   the plurality of particles are present in at least a part of the first light-transmissive member that is located in the elliptical shape:

$\alpha = 2.3/A + L/2$  expression 1

$\beta = \alpha/2 = (2.3/A + L/2)/2$  expression 2.

3. The nitride semiconductor light-emitting diode of claim 1, wherein the plurality of particles have an average particle diameter of not less than 10 nm and not more than 3000 nm.

4. The nitride semiconductor light-emitting diode of claim 1, wherein:
   the nitride semiconductor light-emitting chip includes a first light extraction plane which is a top surface thereof and a second light extraction plane which is parallel to the polarization direction of the polarized light, the second light extraction plane being a side surface; and
   the second light extraction plane is in contact with the first light extraction plane or faces the first light extraction plane while another member or a space is interposed therebetween.

5. The nitride semiconductor light-emitting diode of claim 4, wherein a ratio of an area size of the second light extraction plane to an area size of the first light extraction plane is not less than 40%.

6. The nitride semiconductor light-emitting diode of claim 4, wherein at least 50% of light going out of the second light extraction plane is incident on the first light-transmissive member.

7. The nitride semiconductor light-emitting diode of claim 4, wherein a plurality of projection and recess portions are formed on the first light extraction plane.

8. The nitride semiconductor light-emitting diode of claim 7, wherein the plurality of projection and recess portions are each formed of a semi-spherical recess or projection portion.

9. The nitride semiconductor light-emitting diode of claim 7, wherein the plurality of projection and recess portions are each formed of a striped recess or projection portion as seen in a plan view parallel to the growth plane.

10. The nitride semiconductor light-emitting diode of claim 9, wherein an angle formed between a extending direction of the striped projection and recess portions and the polarization direction of the active layer is not less than 0 degrees and less than 5 degrees.

11. The nitride semiconductor light-emitting diode of claim 9, wherein an angle formed between a extending direction of the striped projection and recess portions and the polarization direction of the active layer is not less than 5 degrees and not more than 90 degrees.

* * * * *